(12) United States Patent
Naito et al.

(10) Patent No.: US 8,283,577 B2
(45) Date of Patent: Oct. 9, 2012

(54) PRINTED MATTER AND ITS MANUFACTURING METHOD, AND ELECTROMAGNETIC SHIELDING MATERIAL AND ITS MANUFACTURING METHOD

(75) Inventors: Nobuo Naito, Tokyo (JP); Hironori Kamiyama, Tokyo (JP); Nozomi Kaga, Tokyo (JP); Yuichi Miyazaki, Tokyo (JP); Takeshi Nishizono, Tokyo (JP); Hidetsugu Tazawa, Tokyo (JP); Shinya Kiura, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 497 days.

(21) Appl. No.: 12/663,076

(22) PCT Filed: Jun. 6, 2008

(86) PCT No.: PCT/JP2008/060427
§ 371 (c)(1),
(2), (4) Date: Dec. 4, 2009

(87) PCT Pub. No.: WO2008/149969
PCT Pub. Date: Dec. 11, 2008

(65) Prior Publication Data
US 2010/0230154 A1    Sep. 16, 2010

(30) Foreign Application Priority Data

Jun. 8, 2007 (JP) .................................. 2007-153113
Nov. 19, 2007 (JP) .................................. 2007-299468

(51) Int. Cl.
*H05K 9/00* (2006.01)

(52) U.S. Cl. .......................... 174/389; 156/245; 174/392
(58) Field of Classification Search .................. 174/389, 174/392; 156/245, 150; 283/94
See application file for complete search history.

(56) References Cited

U.S. PATENT DOCUMENTS 3,811,983 A    5/1974 Rowland
3,935,359 A    1/1976 Rowland
(Continued)

FOREIGN PATENT DOCUMENTS
JP    B-37-283    1/1962
(Continued)

OTHER PUBLICATIONS

International Search Report mailed on Sep. 2, 2008 for the corresponding International patent application No. PCT/JP2008/060427 (English translation enclosed).

*Primary Examiner* — Hung Ngo
(74) *Attorney, Agent, or Firm* — Posz Law Group, PLC

(57) ABSTRACT

Intended is to provide an electromagnetic shielding material having a conductive layer pattern by transferring a conductive composite to a transparent base material, and an electromagnetic shielding material having a metal layer formed on the transferred conductive layer. The electromagnetic shielding material is free from the troubles such as the breaking of wire, the non-conforming shape or the low contact, which is based on the non-conforming transfer of the conductive composite. The electromagnetic shielding material comprises a transparent base material, a primer layer formed over the transparent base material, and a conductive layer formed in a predetermined pattern on the primer layer. In the primer layer, a portion having the conductive layer formed therein has a thickness larger than the thickness of a portion without the conductive layer.

35 Claims, 16 Drawing Sheets

U.S. PATENT DOCUMENTS

| | | | |
|---|---|---|---|
| 4,906,070 A | 3/1990 | Cobb, Jr. | |
| 5,707,472 A * | 1/1998 | Smith | 156/240 |
| 6,399,879 B1 * | 6/2002 | Ueda et al. | 174/389 |
| 6,448,492 B1 * | 9/2002 | Okada et al. | 174/389 |
| 6,717,048 B2 * | 4/2004 | Ueda et al. | 174/389 |
| 6,911,573 B2 * | 6/2005 | Chen et al. | 604/378 |
| 2002/0108704 A1 * | 8/2002 | Umezawa et al. | 156/245 |
| 2003/0013048 A1 * | 1/2003 | Gilson | 430/321 |
| 2007/0102192 A1 * | 5/2007 | Naito et al. | 174/389 |
| 2007/0272439 A1 * | 11/2007 | Kim et al. | 174/389 |
| 2009/0133923 A1 * | 5/2009 | Kotsubo et al. | 174/389 |
| 2010/0018765 A1 * | 1/2010 | Suenaga et al. | 174/389 |

FOREIGN PATENT DOCUMENTS

| | | |
|---|---|---|
| JP | A-06-018707 | 1/1994 |
| JP | A-11-170420 | 6/1999 |
| JP | A-11-174174 | 7/1999 |
| JP | A-2001-102792 | 4/2001 |
| JP | A-2004-063943 | 2/2004 |
| JP | A-2006-319167 | 11/2006 |
| JP | A-2007-272161 | 10/2007 |

* cited by examiner (A)

(B)

PRINTED MATTER AND ITS MANUFACTURING METHOD, AND ELECTROMAGNETIC SHIELDING MATERIAL AND ITS MANUFACTURING METHOD

TECHNICAL FIELD

This invention relates to a printed matter having a functional ink layer formed in a predetermined pattern, and a method for manufacturing the printed matter. This invention also relates to an electromagnetic shield material with the functional ink layer as a conductive layer, and a method for manufacturing the electromagnetic shield material.

BACKGROUND

As a display device (image display device) for televisions or personal computer monitors, a cathode-ray tube (CRT) display device, a liquid crystal display device (LCD), a plasma display device (PDP), an electro-luminescent (EL) display device and the like are known. Of these display devices, the plasma display device, which has received attentions in the field of large display devices, uses plasma discharge in luminescence. Therefore, unnecessary electromagnetic waves in bandwidths of 30 MHz to 1 GHz may leak outside and affect other devices (e.g., a remote controller and an information processing device). As a result, normally a film shaped electromagnetic shield material is provided on a front side (on the side of the viewer) of a plasma display panel used in the plasma display device, in order to shield the leaked electromagnetic waves.

Various electromagnetic shield materials have been studied. For example, Patent Document 1 recites an electromagnetic shield material formed by silkscreen-printing a electroless plating catalyst past on a transparent base material in a mesh pattern and electroless plating a metallic layer thereon. Patent Document 2 recites an electromagnetic shield material formed by printing a conductive ink composition on a transfer printing transfer body with a mesh pattern by intaglio offset printing, transferring the mesh pattern on the transfer printing transfer body onto a transparent base material, and electroplating a metallic layer on the transparent base material in a mesh pattern. Patent Document 3 recites an electromagnetic shield material formed by directly printing the conductive ink composition onto a transparent material with a mesh pattern by intaglio printing, and electroplating a metallic pattern on the transparent base material with a mesh pattern.

Moreover, although formation is different from the above-discussed electromagnetic shield materials having conductive mesh patterns, FIGS. 1 and 2 of Patent Documents 4 and 5 recite a retroreflective sheet produced by hardening a composition 64 that is filled into an intaglio plate 16, supplying an adhesive 68 onto the hardened composition 64 thereafter, sandwiching the adhesive 68 by a sheet 46 provided thereon and the composition 64, hardening the adhesive 68 thereafter, and demolding the composition 64 and adhesive 68, which hardened in the intaglio part of the plate 16, from the intaglio part of the plate 16. As shown in FIG. 5D of Patent Documents 4 and 5, such retroreflective sheet has a structure in which the adhesive 68 is provided between the base sheet 46 and a convex object.

[Patent Document 1] Japanese Laid-Open Patent Application No. H11-170420
[Patent Document 2] Japanese Laid-Open Patent Application No. 2001-102792
[Patent Document 3] Japanese Laid-Open Patent Application No. H11-174174
[Patent Document 4] U.S. Pat. No. 3,811,983
[Patent Document 5] U.S. Pat. No. 3,935,359

DESCRIPTION OF THE INVENTION

Problem to be Solved by the Invention

However, for the electromagnetic wave shield material recited in Patent Document 1, a mesh pattern is formed by silkscreen printing, which is difficult to form fine patterns, and forming the metal layer by electroless plating, which has slow film formation speed. Therefore, it is disadvantageous in productivity, and there is a problem that cost reduction is difficult to achieve. In addition, for the electromagnetic wave shield recited in Patent Document 2, formation of fine patterns is possible as the mesh pattern is formed by intaglio printing. However, because the offset method is used when forming the mesh pattern, the mesh pattern is first transferred on the transfer printing transfer body from the intaglio plate, and then the second transfer printing is achieved from the transfer printing transfer body to the transparent base material. Therefore, the mesh pattern of the intaglio plate, which is the original plate, may not be accurately transferred on the transparent base material.

Furthermore, for the electromagnetic shield material of Patent Documents 2 and 3, when transferring (also called transfer printing) the mesh pattern from the intaglio plate to the transfer body or to the transparent base material, the transfer body or the transparent base material may have a part of the mesh pattern that is not transferred, or a transfer failure part that the mesh pattern is not adhered sufficiently. More specifically, when scraping conductive ink composition 103 with a doctor blade 102 after coating the intaglio plate 101 with the conductive ink composition 103 on as shown in FIG. 12(A), to fill the intaglio part 104 with the conductive ink composition 103, an upper part of the conductive ink composition 103 in the intaglio part 104 after being scraped by the doctor blade 102 has a concave 105, as shown in FIG. 12(B). This concave 105 prevents adhesiveness of the transparent base material 106 and the conductive ink composition 103 as shown in FIG. 12(C), when the conductive ink composition 103 in the intaglio part 104 is transferred on to the transparent base material 106 by pressure-bonding the transparent base material 106 on to the intaglio plate 101. As a result, a part of the conductive ink composition 103 is not transferred on the transparent base material 106, or the transfer failure part is formed because the mesh pattern is not adhered sufficiently, which causes a decrease in electromagnetic shielding characteristics.

This invention solves the above-discussed problems and has an object to provide an electromagnetic shield material, in which a conductive pattern is formed by transferring a conductive composition onto a transparent base material by intaglio printing, without problems, such as breaking of a pattern, shape problems, low adhesiveness, or the like based on transfer failure of the conductive composition. In addition, another object of this invention is to provide a method of manufacturing the electromagnetic shield material without problems, such as breaking of a pattern, shape problems, low adhesiveness, or the like based on transfer failure of the conductive composition.

Moreover, another object of this invention is to provide a printed matter with a formation that is similar to the excellent transferred pattern formed by the above-discussed electromagnetic shield material, and a method of producing the printed matter that can form the transferred pattern stably without the failure in transfer.

Means for Solving the Problem

In the process of committed studying of an electromagnetic shield material on which a conductive pattern with excellent shapes is transferred without insufficient transfer and a manufacturing method thereof, the inventors discovered a revolutionary method to transfer a conductive composition extremely excellent by pressure-bonding a plate surface having intaglio parts in a predetermined pattern into which unhardened conductive composition is filled, and one surface of a base material that is subject to the transfer of the conductive composition, via an unhardened primer layer, and by peeling off the base material from the plate surface after at least the primer layer hardens while maintaining the pressure-bonding, and completed the method of manufacturing the electromagnetic shield material of this invention. In addition, the inventors discovered that a structural formation of the obtained electromagnetic shield material was different. Further, the inventors discovered that the features of the electromagnetic shield material and the manufacturing method thereof can be used for a printed matter on which other functional ink layer is transferred and completed the printed matter of this invention and the manufacturing method thereof.

That is, the printed matter of this invention for solving the above-described problems has a base material, a primer layer formed on the base material, a functional ink layer formed on the primer layer in a predetermined pattern, and a thickness of the primer layer at a pattern formation part at which the functional ink layer is formed in the predetermined pattern is larger than a thickness of the primer layer at a pattern non-formation part at which the functional ink layer is not formed in the predetermined pattern.

According to this invention, in the primer layer formed on the base material, the thickness of the primer layer at the pattern formation part at which the functional ink layer is formed in the predetermined pattern is larger than a thickness of the primer layer at a pattern non-formation part at which the functional ink layer is not formed in the predetermined pattern. Therefore, when manufacturing the printed matter of this invention with the intaglio plate, for example, the primer layer is provided to fill in the indentation discussed in the above problems. The primer layer with such formation is formed by filling in the indentation on the upper part of the functional ink composition in the intaglio parts after scraping using a doctor blade or a wiping roll during the manufacturing the printed matter. As a result, a printed matter is formed in which the primer layer adheres to the functional ink composition without cavities therebetween, without problems, such as wire breakage, improper shape, and low adhesiveness based on insufficient transfer of the functional ink composition.

In addition, according to this invention, because transfer printing ability (also called as transferability) of the functional ink composition can be improved, the thickness of the post-transfer functional ink composition can be increased compared to the conventional method that uses an intaglio plate, such as gravure printing. Therefore, by thickening the functional ink layer pattern, the desired functions can be secured in the obtained printed matter.

In the printed matter of this invention, a boundary of the primer layer and the functional ink layer at the pattern formation part has one or more cross-sectional formations of (a) a cross-sectional formation in which a component structuring the primer layer and a component structuring the functional ink layer are mixed, (b) a cross-sectional formation in which the boundary of the primer layer and the functional ink layer is uneven and has a complicated interface shape, and (c) a cross-sectional formation in which a component included in the primer layer exists in a functional ink composition structuring the functional ink layer.

According to the invention of (a)-(c), because the boundary of the primer layer and the functional ink layer does not have a simple boundary structure, adhesiveness of both layers improves, and the transfer (transfer printing) of the functional ink composition filled into the plate surface to the base material can be accurately performed at a high transfer printing rate during the manufacturing of the printed matter.

In the printed matter of this invention, the pattern formation part has a protruding cross-sectional formation structured by a first hill formed by the primer layer and a second hill formed by the functional ink layer formed above a hillside of the first hill.

According to this invention, because the pattern formation part has a protrusion cross-sectional formation structured by the first hill and the second hill formed above the hillside of the first hill, the functional ink composition structuring the second hill is difficult to fall off from the primer layer structuring the first hill, and the transfer (transfer printing) of the functional ink composition filled into the plate surface to the base material can be accurately performed at a high transfer printing rate.

In the printed matter of this invention, the primer layer is preferably an ionizing radiation hardening resin, a thermoplastic resin or a heat hardening resin that change from a fluid state to a solid state.

In the printed matter of this invention, the functional ink layer preferably has one or more functions selected from conductor characteristics, magnetism characteristics, dielectric characteristics, catalyst characteristics, light refractivity characteristics, optical characteristics, coloring characteristics, design characteristics, and elastic characteristics.

In the printed matter of this invention, a functional layer that has the same as or different from the functional ink layer may be further formed on a surface of the functional ink layer.

A method of manufacturing a printed matter of this invention for solving the above-described problems includes pressure-bonding a plate surface having intaglio parts in a predetermined pattern into which an unhardened functional ink composition is filled, and one surface of a base material subject to transfer of the functional ink composition, via a primer layer that maintains fluidity until hardening, hardening at least the primer layer while the pressure-bonding is maintained, and then peeling off the base material and the primer layer from the plate surface to transfer the functional ink composition on the one surface of the base material via the primer layer in the predetermined pattern.

According to this invention, because a plate surface that has intaglio parts in a predetermined pattern into which unhardened functional ink composition is filled, and one surface of a base material that is the subject to the transfer of the functional ink composition, are pressure-bonded via a primer layer that can maintain fluidity until hardening, the primer layer having fluidity is filled into indentations that is easily formed by the functional ink composition in the intaglio parts. As a result, because the primer layer adheres to the functional ink composition without cavities therebetween, the functional ink composition in the intaglio parts can be transferred accurately to the base material side without untransferred parts, thereby allowing the manufacturing of printed matter without problems, such as wire breakage improper shape, and low adhesiveness based on insufficient transfer of the functional ink composition.

In the method of manufacturing the printed matter of this invention, the process of hardening while maintaining the pressure-bonding is a process in which only the primer layer is hardened and not the functional ink composition or a process in which the primer layer and the functional ink composition are hardened at the same time.

In the method of manufacturing the printed matter of this invention, the process of hardening while maintaining the pressure-bonding is performed by ionizing radiation or cooling.

An electromagnetic shield material of this invention for solving the above-described problems has An electromagnetic shield material having a transparent base material, a primer layer formed on the transparent base material, a conductive layer formed by conductive composition on the primer layer in a predetermined pattern, wherein a thickness of the primer layer at a pattern formation part at which the conductive layer is formed in the predetermined pattern is larger than a thickness of the primer layer at a pattern non-formation part at which the conductive layer is not formed in the predetermined pattern, and at the pattern non-formation part, the primer layer exists, and the conductive composition does not exist substantially.

According to this invention, because, on the primer layer provided on the transparent base material, the thickness of the primer layer at the pattern formation part at which the conductive layer is formed is larger than the thickness of the primer layer at the pattern non-formation part at which the conductive layer is not formed, the primer layer is provided so as to fill in the indentations as discussed in the above problems. The so-formed primer layer is formed by filling in the indentation on the upper part of the conductive composition in the intaglio part on the plate after scraping by the doctor blade or the wiping roll during the manufacturing of the electromagnetic shield material. As a result, the primer layer adheres to the conductive composition without cavities therebetween and forms an electromagnetic shield material without problems, such as wire breakage, improper shape, and low adhesiveness based on insufficient transfer of the conductive composition.

In addition, according to this invention, because the transfer printing ability of the conductive composition improves, the thickness of the conductive composition after the transfer can be increased compared to the conventional method that uses an intaglio plate, such as gravure printing. Therefore, by thickening the conductive layer pattern, the conductivity required for the electromagnetic shield can be secured.

The electromagnetic shield material of this invention can be categorized into the following first to forth formations.

An electromagnetic shield material of the first formation of this invention has a transparent base material, a primer layer formed on the transparent base material, a conductive layer formed by conductive composition on the primer layer in a predetermined pattern. A thickness of the primer layer at a pattern formation part at which the conductive layer is formed is larger than a thickness of the primer layer at a pattern non-formation part at which the conductive layer is not formed, and a boundary face of the primer layer and the conductive layer is uneven and has a complicated interface shape.

In the electromagnetic shield material of the first formation, a boundary face between the primer layer and the conductive layer may be structured as a boundary face between a resin structuring the primer layer and a resin structuring the conductive layer or a filler.

An electromagnetic shield material of the second formation of this invention has a transparent base material, a primer layer formed on the transparent base material, a conductive layer formed by conductive composition on the primer layer in a predetermined pattern. A thickness of the primer layer at a pattern formation part at which the conductive layer is formed is larger than a thickness of the primer layer at a pattern non-formation part at which the conductive layer is not formed, and near a boundary face of the primer layer and the conductive layer, there is a region in which a primer component included in the primer layer and the conductive composition are mixed.

An electromagnetic shield material of the third formation of this invention has a transparent base material, a primer layer formed on the transparent base material, a conductive layer formed by conductive composition on the primer layer in a predetermined pattern. A thickness of the primer layer at a pattern formation part at which the conductive layer is formed is larger than a thickness of the primer layer at a pattern non-formation part at which the conductive layer is not formed, and a primer component included in the primer layer exists in the conductive composition structuring the conductive layer.

An electromagnetic shield material of the forth formation of this invention has a transparent base material, a primer layer formed on the transparent base material, a conductive layer formed by conductive composition on the primer layer in a predetermined pattern. The pattern on the conductive layer has a protruding pattern structured by a first hill formed by the primer layer and a second hill formed by the conductive composition formed above a hillside of the first hill.

In the electromagnetic shield material of the forth formation, the first hill may be formed to have a non-continuous part of an inclination of a hill-shaped contour surface in the hillside thereof.

According to the invention of the above-described first to third formations, because the boundary face of the primer layer on the transparent base material and the conductive layer formed in a pattern has a simple boundary face structure, the adhesiveness of both layers improves, and the transfer printing (transfer) of the conductive composition filled into the plate surface onto the transparent base material can be performed accurately with a high transfer printing rate during the manufacture of the electromagnetic shield material.

In addition, according to the invention of the forth formation, because the conductive layer is formed by a protrusion pattern structured by the first hill and the second hill formed above the hillside of the first hill, the conductive composition structuring the second hill is difficult to fall from the primer layer structuring the first hill, and the transfer printing (transfer) of the conductive composition filled into the plate surface onto the transparent base material can be performed accurately with a high transfer printing rate during the manufacture of the electromagnetic shield material.

In the electromagnetic shield material of the first to forth formations of this invention, a metal layer may be further formed on a surface of the conductive layer.

In the electromagnetic shield material of the first to forth formations of this invention, the primer layer is preferably a layer formed by ionizing radiation hardening resin or thermoplastic resin. Here, the ionizing radiation hardening resin may be a resin having characteristics to harden by ionizing radiation, such as ultraviolet or electron rays.

In the electromagnetic shield material according the first to forth aspects of this invention, a resin included in the conductive layer is a thermoplastic resin, an ionizing radiation hardening resin, or a heat hardening resin.

A method of manufacturing the electromagnetic shield material according to the first aspect of the invention to solve the above-described problems is a method of manufacturing an electromagnetic shield material in which a conductive layer is formed on one surface of a transparent base material in a predetermined pattern. The method includes a transparent base material preparing process of preparing a transparent base material on which a primer layer that maintains fluidity until hardened is formed on one surface, a conductive composition filling process of, after coating with a conductive composition, which forms the conductive layer after hardened, a plate-shaped or disc-shaped plate surface on which intaglio parts are formed in a predetermined pattern, filling the conductive composition into the intaglio parts by scrapping the conductive composition adhered in an area other than the inside of the intaglio parts, a pressure-bonding process of pressure-bonding a primer layer side of the transparent base material after the transparent base material preparing process and an intaglio part side of the plate surface after the conductive composition filling process, and adhering the primer layer and the conductive composition in the intaglio parts without cavities therebetween, a primer layer hardening process of hardening the primer layer after the pressure-bonding process but not completely hardening the conductive composition a transfer process of transferring the conductive composition in the intaglio parts on the primer layer by peeling off the transparent base material and the primer layer from the plate surface after the primer layer hardening process, and a conducting composition hardening process of forming the conductive layer by hardening the conductive composition formed on the primer layer in the predetermined pattern after the transfer process.

In the method of manufacturing the electromagnetic shield material according to the first aspect, the conductive composition may be a composition that forms a conductive layer formed by electroplating after hardening, and the method may further includes a plating process of, after the conductive composition hardening process, electroplating a metal layer on the conductive layer formed on the primer layer in the predetermined pattern.

Moreover, a method of manufacturing the electromagnetic shield material according to the second aspect of this invention is a method of manufacturing an electromagnetic shield material in which a conductive layer is formed on one surface of a transparent base material in a predetermined pattern. The method includes a transparent base material preparing process of preparing a transparent base material on which a primer layer that maintains fluidity until hardened is formed on one surface, a conductive composition filling process of, after coating with a conductive composition, which forms the conductive layer after hardened, a plate-shaped or disc-shaped plate surface on which intaglio parts are formed in a predetermined pattern, filling the conductive composition into the intaglio parts by scrapping the conductive composition adhered in an area other than the inside of the intaglio parts, a pressure-bonding process of pressure-bonding a primer layer side of the transparent base material after the transparent base material preparing process and an intaglio part side of the plate surface after the conductive composition filling process, and adhering the primer layer and the conductive composition in the intaglio parts without cavities therebetween, a simultaneous hardening process of hardening the primer layer and the conductive composition at the same time after the pressure-bonding process, and a transfer process of transferring the conductive composition in the intaglio parts on the primer layer by peeling off the transparent base material and the primer layer from the plate surface after the simultaneous hardening process.

In the method of manufacturing the electromagnetic shield material according to the second aspect, the conductive composition may be a composition that forms a conductive layer formed by electroplating after hardening, and the method may further include a plating process of, after the transfer process, electroplating a metal layer on the conductive layer formed on the primer layer in the predetermined pattern.

According to the invention of the first and second aspects, because the primer layer side of the transparent base material on which the primer layer maintaining fluidity is formed, and the intaglio part side of the plate surface after the conductive composition filling process are pressure-bonded, the primer layer having fluidity is filled into the indentation that is easily formed by the upper part of the conductive composition in the intaglio part. As a result, because the primer layer and the conductive composition are adhered with each other without any cavities therebetween, the conductive composition in the intaglio part can be accurately transferred to the transparent base material side without miss transfer. Thus, an electromagnetic shield material can be manufactured without problems, such as wire breakage, improper shape and low adhesiveness based on insufficient transfer of the conductive composition.

In the method of manufacturing the electromagnetic shield material according to the first and second aspects of the invention, the primer layer may be a layer formed by an ionizing radiation hardening resin or a thermoplastic resin, and the maintaining of fluidity of the primer layer is preferably achieved by non-radiation of ionizing radiation or heating.

In the method of manufacturing the electromagnetic shield material according to the first and second aspects of the invention, the conductive composition preferably includes a filler and a resin, and the resin is preferably a thermoplastic resin, an ionizing radiation hardening resin or a heat hardening resin. The conductive composition preferably includes a solvent that solves the resin as needed is a composition that can form the conductive layer by the hardening means, such as drying, ionizing radiation, and heating or chemical treatment, and has a fluidity to fill in the intaglio part on the plate surface at the conductive composition filling process.

In the method of manufacturing the electromagnetic shield material according to the first and second aspects of this invention, in the pressure-bonding process, a primer component included in the primer layer preferably is mixed into the conductive composition structuring the conductive layer.

According to this invention, the primer component included in the primer layer is mixed into the conductive composition structuring the conductive layer, the boundary face between the primer layer on the transparent base material and the conductive layer formed in a pattern does not have a simple boundary structure, thereby improving the adhesiveness between both layers. Under such method of manufacturing the electromagnetic shield material, the transfer printing (transfer) of the conductive composition filled into the plate surface to the transparent base material is performed accurately with a high transfer printing rate.

In the method of manufacturing the electromagnetic shield material according to the first and second aspects of this invention, in the transfer process, a thickness of a part of the primer layer at which the conductive composition has transferred is preferably larger than a thickness of a part at which the conductive composition has not transferred, and a boundary face of the primer layer and the conductive layer is preferably uneven and has a complicated interface shape.

According to this invention, by pressure-bonding the primer layer side of the transparent base material on which the primer layer maintaining the fluidity is formed and the intaglio part side of the plate surface after the conductive composition filling process, the primer layer having fluidity is filled in the indentation that is easily formed on the upper part of the conductive composition in the intaglio part and is subsequently hardened. Therefore, in the eventual formation, the thickness of the part of the primer layer provided on the transparent base material at which the conductive layer is formed is larger than the thickness at which the conductive layer is not formed (i.e., mixing the primer layer into the conductive layer), and the boundary face between the primer layer and the conductive layer is uneven and has a complicated interface shape. Therefore, the obtained electromagnetic shield material has such formations without problems, such as wire breakage, improper shape and the low adhesiveness based on insufficient transfer of the conductive composition.

In the method of manufacturing the electromagnetic shield according to the first and second aspects of this invention, the pattern of the conductive layer is preferably a protruding pattern structured by a first hill formed by the primer layer and a second hill formed by the conductive composition formed above a hillside of the first hill.

According to this invention, because the pattern of the conductive layer is formed by a protruding pattern structured by the first hill and the second hill formed above a hillside of the first hill, the conductive composition structuring the second hill is hard to fall off from the primer layer structuring the first hill, and therefore, the transfer of the conductive composition filled into the plate surface to the transparent base material is achieved accurately at a high transfer printing rate.

Effect of the Invention

According to the printed matter of this invention, because the primer layer is provided so as to fill in the indentation pointed out in the above-described problems when manufacturing using the intaglio plate, the primer layer adheres to the functional ink composition without cavities therebetween, thereby forming a printed matter without problems, such as wire breakage, improper shape and low adhesiveness based on insufficient transfer of the conductive composition. Moreover, according to this invention because transfer printing ability (also called as transferability of the functional ink composition can be improved, the thickness of the functional ink composition after transfer can be increased compared to the conventional method that uses an intaglio plate, such as gravure printing. Therefore, t Therefore, by thickening the functional ink layer pattern, the desired functions can be secured in the obtained printed matter.

According to the method of manifesting the printed matter of this invention, because the primer layer having fluidity is filled into the indentation that is easily formed on the upper part of the functional ink composition in the intaglio part, the primer layer adheres to the functional ink composition without cavities therebetween. As a result, the functional ink composition in the intaglio part can be transferred accurately to the base material side without non-transferred part. Therefore, a printed matter can be manufactured without the problems, such as wire breakage, improper shape, and low adhesiveness based on insufficient transfer of the conductive composition.

According to the electromagnetic shield material of this invention, the primer layer is provided so as to fill in the indentation as pointed out in the above-described problems. Therefore, an electromagnetic shield material can be manufactured without problems, such as wire breakage, improper shape and low adhesiveness based on insufficient transfer of the conductive composition. Moreover, the adhesiveness between the primer layer and the conductive layer improves, and in the manufacturing of the electromagnetic shield material, the transfer (transfer printing) of the conductive composition filled into the intaglio plate to the transparent base material can be performed accurately at a high transfer printing rate.

BRIEF DESCRIPTION OF THE DRAWINGS

FIG. 8A is a first resin filling process of the method of manufacturing the electromagnetic shield material. FIG. 8B is a second resin filling process of the method of manufacturing the electromagnetic shield material. FIG. 8C is a pressure-bonding process of the method of manufacturing the electromagnetic shield material. FIG. 8D is a transfer process of the method of manufacturing the electromagnetic shield material. FIG. 8E is a plating process of the method of manufacturing the electromagnetic shield material.

FIG. 11A is schematic cross-sectional view showing an embodiment before filling the primer layer into the indented portions. FIG. 11B is schematic cross-sectional view showing an embodiment after filling the primer layer into the indented portions. FIG. 11C is a schematic cross-sectional view showing an embodiment after transferring the conductive composition.

FIG. 12A is a schematic cross-sectional view showing an embodiment before scraping the conductive ink composition with a doctor blade. FIG. 12B is a schematic cross-sectional view showing an embodiment after scraping the conductive ink composition with the doctor blade. FIG. 12C is a schematic cross-sectional view showing an embodiment when a transparent base material adheres to an intaglio plate.

FIG. 13A shows a process to pressure-bond a base material having a primer layer to an intaglio part that is filled with an un-hardened functional ink composition. FIG. 13B shows a process to pressure-bond the base material to the primer layer with which an entire plate surface including the intaglio part is covered. FIG. 13C shows a process to pressure-bond the base material and the plate surface via the primer layer. FIG. 13D shows a process to peel off the base material and the primer layer from the plate surface.

According to the method of manufacturing the electromagnetic shield material of this invention, because the primer layer having fluidity is filled into the indentation that is easily formed on the upper part of the conductive composition in the intaglio part, the primer layer adheres to the conductive composition without cavities therebetween. As a result, the conductive composition in the intaglio part can be accurately transferred to the transparent base material part without non-transferred parts. Accordingly, an electromagnetic shield material can be manufactured without problems, such as, improper shape and low adhesiveness based on insufficient transfer of the conductive composition. Moreover, to improve the transfer printing rate of the conductive composition in the intaglio part, a thicker conductive layer pattern can be formed compared to the case without the primer. Therefore, the pattern conductivity, which is needed for the electromagnetic shield, can be increased. Further, according to this invention, the adhesiveness of the primer layer and the conductive layer can be increased, and the transfer (transfer printing) of the conductive composition filled into the plate surface to the transparent base material can be preformed accurately at a high transfer printing rate.

BEST MODE TO PRACTICE THE INVENTION

Next, embodiments of this invention are explained in detail. However, this invention is not limited to the below embodiments. This invention may be practiced in various formations within the scope of its subject matter.

First, an electromagnetic shield material and a method of manufacturing the electromagnetic shield material are explained. Then, a printed matter that includes the electromagnetic shield material and the method of manufacturing the printed matter are explained.

[Electromagnetic Shield Material]

Figure 1:
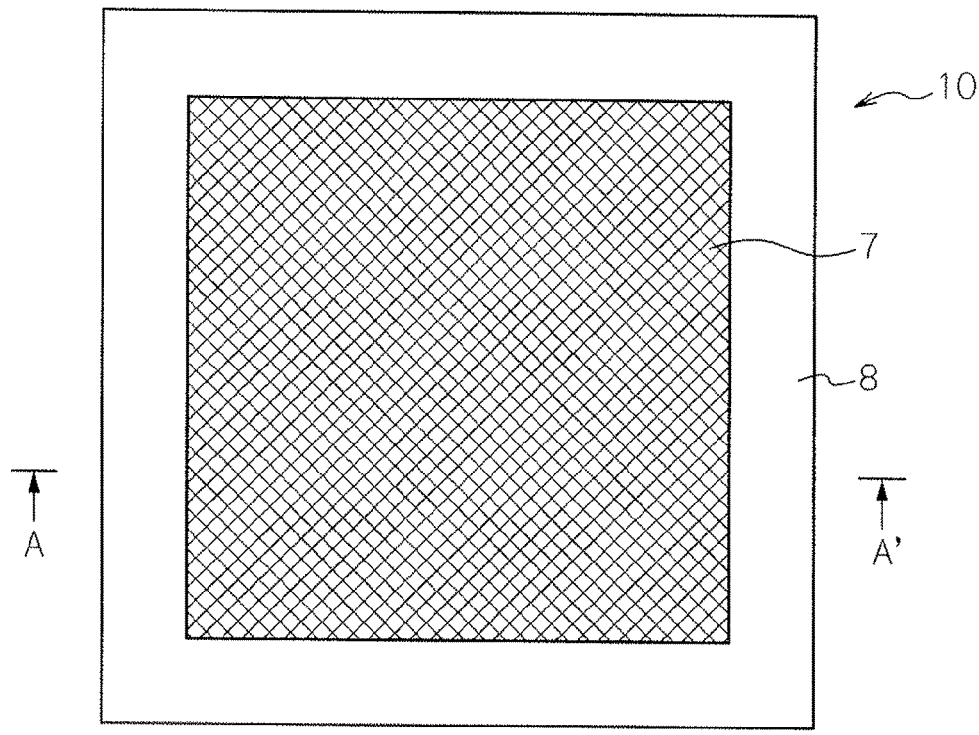
FIG. 1 is a schematic plan view showing an example of an electromagnetic shield material according to this invention.
Figure 2:
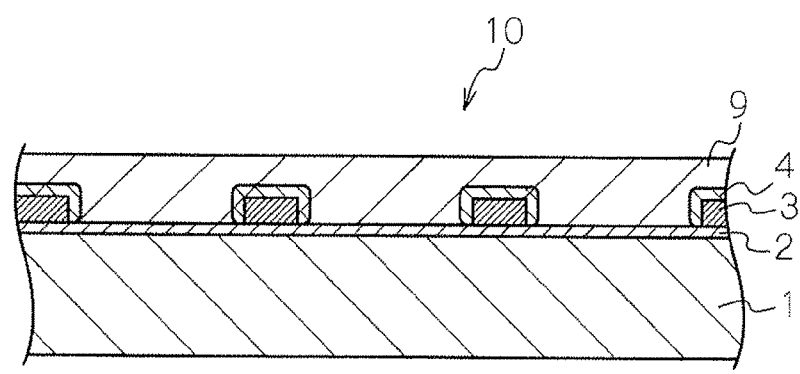
FIG. 2 is an enlarged view of an A-A' cross section in FIG. 1.
Figure 3:
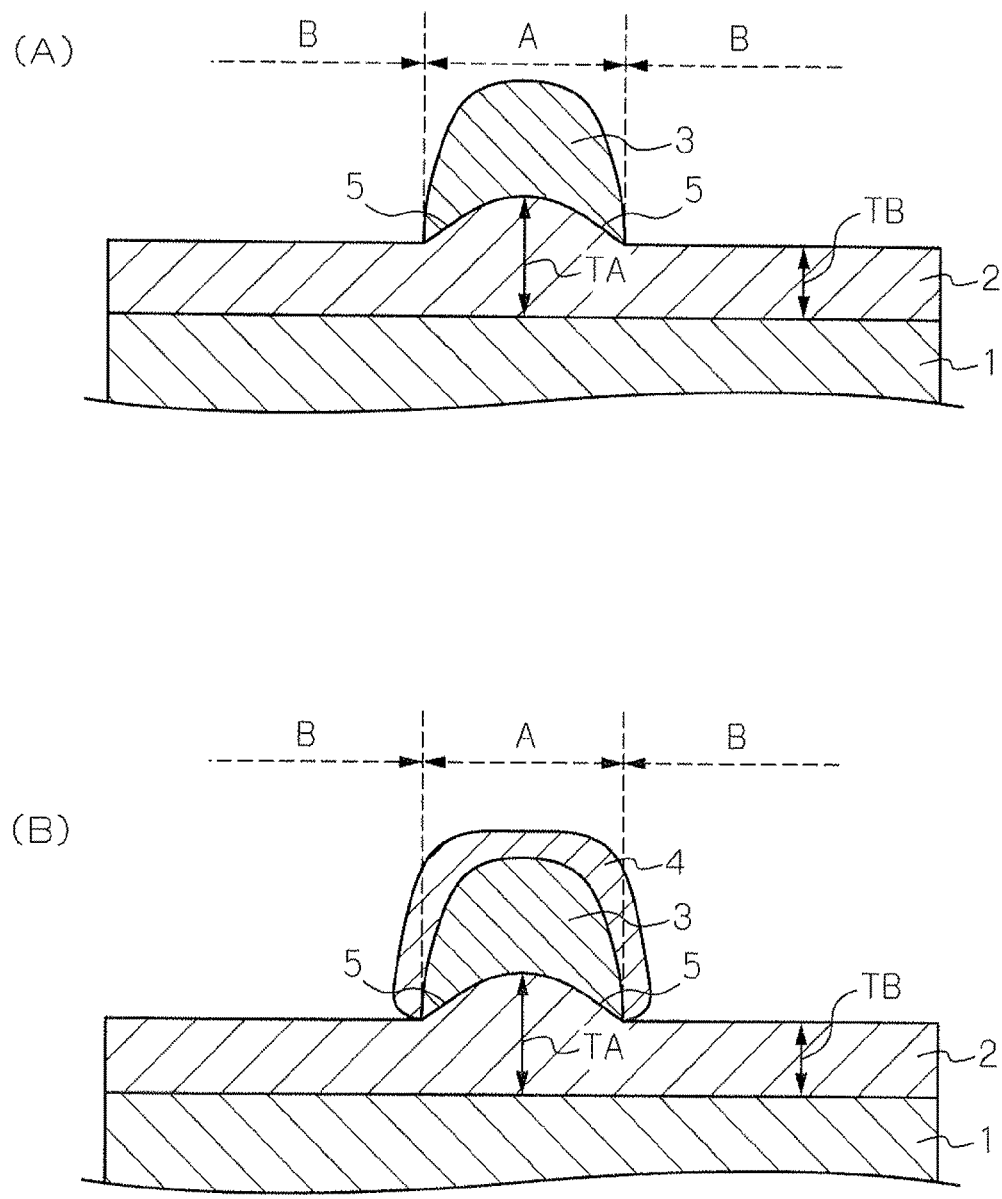
FIG. 3A is a first schematic cross-sectional view showing a further enlargement of a part of FIG. 2.
FIG. 3B is a second schematic cross-sectional view showing a further enlargement of a part of FIG. 2.

FIG. 1 is a schematic plan view showing an example of the electromagnetic shield material according to this invention. FIG. 2 is an enlarged view of an A-A' cross section shown in FIG. 1. In addition, FIG. 3 is a schematic cross-sectional view showing an enlargement of a part of FIG. 2. FIG. 3(A) shows an example in which a metal layer is not provided on a conductive layer, and FIG. 3(B) shows an example in which the metal layer is provided on the conductive layer. The electromagnetic shield material 10 of this invention has a transparent base material 1, a primer layer 2 formed on the transparent base material 1, and a conductive layer 3 formed of a conductive composition formed with a predetermined pattern on the primer layer 2. If necessary, the electromagnetic shield layer 10 has a metal layer 4 formed on the conductive layer 3 and further has a protective layer 9 as shown in FIG. 2.

The "predetermined pattern" refers to patterns in mesh (net or lattice) shape, stripe (group of parallel lines or striped patterns) shape, helical (or spiral) shape, polyline, or the like, which are generic as electromagnetic shield patterns for the electromagnetic shield material 10. Moreover, in FIG. 1, number 7 refers to an electromagnetic shield pattern part that is located in the center and faces an image display region of a display device. Number 8 refers to a ground part that exists at least a part of a peripheral part of the electromagnetic shield pattern part 7. It is preferable to surround the entire periphery of the peripheral part of the electromagnetic shield pattern part 7, as shown in FIG. 1. Moreover, the ground part 8 may be formed in a pattern shape having openings, such as a mesh. The ground part 8 is more preferably formed by a conductive layer (or a conductive layer and a metal layer) without openings (plain shape), as shown in FIG. 1. Moreover, in this invention, the ground part 8 shown in FIG. 1 may not exist in the peripheral part, and the entire electromagnetic shield material 10 may be in a seamless mesh shape. In this case, the electromagnetic shield material 10 may be continuously formed regardless of a size of the display. Furthermore, the helical (or spiral) shape pattern may be used when a spiral coil used for a signal transmission/reception antenna for an IC tag or a non-contact IC card covers the entire surface of electromagnetic shield material 10.

The structure of this invention is explained in detail below.

(Transparent Base Material)

The transparent base material 1 is a base material for the electromagnetic shield material 10. Material and thickness of the transparent base material 1 may be selected based on required characteristics, such as desired transparency, mechanical strength, and adhesiveness with the primer layer 2. The material of the transparent base material 1 may be a resin, or an inorganic base material such as a glass base material. A transparent film made of resin is preferably used. As such transparent film, it is preferable that the film is based on acrylic resin (here, it is used as a concept that also includes so-called methacrylic resin), polyester resin, and the like, but it is not limited to these. As the resin material, in particular, cellulose-series resin such as triacetylcellulose, diacetylcellulose and cellulose acetate butyrate, polyester resin such as polyethylene terephthalate (PET), polyethylene naphthalate (PEN), ethylene glycol-terephthalic acid-isophthalic acid copolymer, terephthalic acid-ethylene glycol-1,4 cyclohexane dimethanol copolymer and polyester-series thermoplastic elastomer, polyolefin resin such as polyethylene, polypropylene, polymethylpentene and cyclic polyolefin, halogen containing resin such as polyvinyl chloride and polyvinylidene chloride, styrene-series resin such as polyethersulphone resin, polyaclic-series resin, polyurethane-series resin, polycarbonate resin and polystyrene, polyamide resin, polyimide resin, polysulphone resin, polyether resin, polyetherketone, (meta)acrylonitril and the like may be used. In particular, a bi-axis oriented PET film is preferable for transparency and durability, and because it has heat-resistance characteristics, by which the film is not deformed after the ultraviolet radiation treatment or heat treatment in the subsequent processes.

On the other hand, as the inorganic material structuring the inorganic base material, glass, such as soda glass, potash glass, lead glass, borosilicate glass, quartz glass and phosphoric acid glass, transparent inorganic crystal, such as crystalline quartz (crystal), calcite (calcium carbonate) and diamond (garnet), transparent ceramics, such as PLZT, may be used.

The transparent base material 1 may be a continuous and long band film that may be processed roll-to-roll basis, or a sheet film of a predetermined size. The "roll-to-roll" means a way of using a film in which a long band base material is supplied in a roll, performed with a predetermined process as it is wound off from the roll, and stored and transported after rewound on the roll. The thickness of the transparent base material 1 is preferably approximately 8 μm-5000 μm. However, this invention is not limited to this range. Light transmissivity of the transparent base material 1 is ideally 100% for placing on the front surface of the display device. However, it is preferable to select 80% or greater in the transmissivity. On the surface of the transparent base material 1, an adhesive-promoting layer may be provided for improving adhesiveness of later-discussed primer layer 2 and the transparent base material 1, or a surface process such as corona discharge process, plasma process, and frame process may be performed on the surface of the transparent base material 1. The adhesive-promoting layer may be made of a resin having an adhesive characteristic to adhere to the transparent base material 1 and the primer layer 2, respectively. The resin for the adhesive-promoting layer may be appropriately selected from urethane resin, epoxy resin, polyester resin, acrylic resin, chlorinated polypropylene and the like.

(Primer Layer)

The primer layer 2 strongly adheres to the transparent base material 1. The conductive layer 3 strongly adheres to the primary layer 2. Therefore, the primer layer 2 is preferably made of a material having an adhesive characteristic to strongly adhere to the transparent base material 1 and the conductively layer 3, respectively. As a matter of course, the primer layer 2 preferably has a transparent characteristic. For example, the primer layer 2 is preferable to be a layer formed by coating the transparent base material 1 with an ionizing radiation hardening resin or a thermoplastic resin. In addition, various additives or degenerative resins may be used for adhesiveness, improvement on durability, and various physicalities.

As the thermoplastic resin, acrylic resin such as polymethyl methacrylate (PMMA), vinyl chloride-vinyl acetate copolymer, polyester resin, polyolefin resin or the like may be used.

As the ionizing radiation hardening resin, monomer (monomeric substance) that is polymerized and hardened by a reaction such as cross-linking, by the ionizing radiation, prepolymer, or oligomer may be used. As the monomer, for example, radical-polymerizable monomer, particularly, various (meta)acrylates, such as 2-ethylhexyl(meta)acrylate, diethylene glycol di-(meta)acrylate, 1,6-hexandediol di-(meta)acrylate, trimethylolpropane tri-(meta)acrylate, pentaerythritol tetra-(meta)acrylate, dipentaerythritol penta-(meta)acrylate and dipentaerythritol hexa-(meta)acrylate may be used. In addition as, the prepolymer (or oligomer), for example, radical-polymerizable prepolymer, in particular, various (meta)acrylate prepolymers such as urethane(meta)acrylate, epoxy(meta)acrylate, polyester(meta)acrylate and triazine(meta)acrylate, polythiol-series prepopolymer such as trimethylolpropane trithioglycolate, pentaerythritol tetrathioglycolate, unsaturated polyester prepolymer, and the like may be used. Moreover, cationic polymerizable prepolymer, such as novolac-series epoxy resin prepolymer and aromatic vinyl ether-series resin prepolymer may be used. Here, the expression "(meta)acrylate" means acrylate or methacrylate.

The primer layer 2 may be made of a single type of monomer or prepolymer based on the required characteristics, coating applicability and the like. Alternatively, two or more types of monomers or prepolymers are mixed, and the primer layer 2 may be made of the mixture. or one or more types of monomers and one or more types of prepolymers are mixed, and the primer layer 2 may be made of the mixture.

As a photo polymerization initiator, in a case where radical-polymerizable monomer or prepolymer is used, a compound of benzophenone series, acetophenone series, thioxanthone series, benzoin system and the like may be used, and in a case where cationic polymerization series monomer or prepolymer is used, a compound of metallocene series, aromatic sulfonium series, aromatic iodonium series or the like, may be used. The photo polymerization initiator is added to the material used for the primer layer 2 by 0.1-5 weight parts in 100 weight parts of the composition formed by the above monomers and/or prepolymers.

As the ionizing radiation, ultraviolet rays and electron rays are representatives. Alternatively, electromagnetic rays such as visible rays, x rays and γ rays, or charged particle rays such as α rays, may be used.

If necessary, an additive is appropriately added. As the additive, for example heat stabilizer, radical capture agent, plasticizer, surface-active agent, antistatic agent, antioxidant, ultraviolet absorber, infrared absorber, coloring agent (color dye or color pigment), body pigment, light diffusing agent and the like may be used.

Especially, in this invention, the primer layer 2 has a characteristic to be able to maintain the fluid state and the hardened state while being pressure-bonded against the plate. Specifically, the primer layer 2 needs to maintain the fluidity after coating the transparent base material 1 with the primer layer and to change from the fluid state to the hardened state in a short period of time when the conductive composition layer 3' (see FIG. 8) is transferred and formed on the primer layer 2. By forming such primer layer 2 on the transparent base material 1, the conductive composition layer 3' can be transferred without cavities between the conductive composition layer 3' and the primer layer 2. Therefore, generation of cavities between the conductive composition layer 3' and the primer layer 2, which have been a problem conventionally, can be prevented, thereby preventing the problem of transfer printing failure or insufficient adhesiveness based on the cavities.

In this application, the terms such as "fluidity" and "fluid state" refer to characteristics or states in which the primer layer 2 flows (transforms) due to the pressure when pressure-bonding the primer layer 2 against the plating surface into which the conductive composition is filled. The primer layer 2 need not have a low degree of viscosity like water. In addition, the primer layer need not have Newtonian viscosity but may have non-Newtonian viscosity, such as thixotropic nature or dilatant nature. After coating transparent base material 1 with the primer layer, which viscosity has been adjusted for the coating, the primer layer 2 may flow (transform) at the time of pressure-bonding against the plating surface when the primer layer 2 is a thermoplastic resin. Therefore, the primer layer 2 may be at a temperature for flowing (transforming) at the time of pressure-bonding. Such state of the primer layer 2 may be referred to be in a softened state.

The viscosity of the primer layer 2 in the fluid state is normally within a range of 1 mPa·s-100000 mPa·s, and preferably 50 mPa·s-2000 mPa·s.

When using ionizing radiation hardening resin as the resin for the primer layer 2, the fluid state of the primer layer 2 can be obtained simply by coating ink with ionizing radiation hardening characteristics on the transparent base material 1. The ionizing radiation hardening ink is generally structured from a monomer or oligomer having ionizing radiation hardening characteristics as discussed above, and if necessary, may include photopolymerization initiator (in case of ultraviolet hardening or light hardening) and various additives. The ionizing radiation hardening ink has fluidity until hardened by the ionizing radiation. This ink may include solvent. However, it is preferable that the ink is a type that does not include the solvent (i.e., non-solvent type) because a drying process is required after the coating.

Moreover, when using a thermoplastic resin composition as the resin for primer layer, The fluid state of the primer layer 2 can be generated by coating the transparent base material 1 with the thermoplastic resin composition and heating the thermoplastic resin composition to a level at which the thermoplastic resin composition becomes in the fluid state (e.g., approximately 500° C.-200° C.). The primer layer 2 in this fluid state is hardened by cooling and transferred after pressure-bonding against the plate surface into which the later-discussed conductive composition is filled, to transfer the conductive composition layer 3' can be transferred without cavities between the conductive composition layer 3' and the primer layer 2. Here, a method for coating the transparent base material 1 with a solution of the thermoplastic resin composition and drying the solution, or coating the transparent base material 1 with a resin in a hot melt state may be used as a method for coating the transparent base material 1 with the thermoplastic resin composition. Further, the heating of the thermoplastic resin composition applied on the transparent base material 1 may be performed prior to contacting the plate surface into which the conductive composition is filled. Alternatively, the heating and pressure-bonding may be performed at the same time when pressure-bonding the primer layer 2 against the plate surface, using a heat roll or the like. In either way, when transfer printing the conductive composition layer 3' onto the primer layer 2, it is necessary to cool down the primer layer 2 until the primer layer looses fluidity.

The thickness of the primer layer 2 is not particularly limited. Normally, the primary layer 2 is formed such that its thickness after hardening is approximately 1 μm-100 μm (values evaluated by later-discussed thickness $T_B$). In addition, the thickness ($T_B$) of the primer layer is generally approximately 1-50% of the total value of the conductive layer 3 and the primer layer 2 (total thickness; in FIG. 3, difference in height between the top part of the conductive layer and the surface of the transparent base material 1). As discussed in the section below for explaining the manufacturing method, on the primer layer 2 to which the conductive composition layer 3' is transferred and subsequently hardened to manufacture a electromagnetic shield material, a thickness $T_A$ of a part A at which the conductive layer 3 is formed is larger than a thickness $T_B$ of a part B at which the conductive layer 3 is not formed. For such primer layer 2, the conductive layer 3 surrounds over side edges 5, 5 of the larger part A towards the thinner part B.

Figure 11:
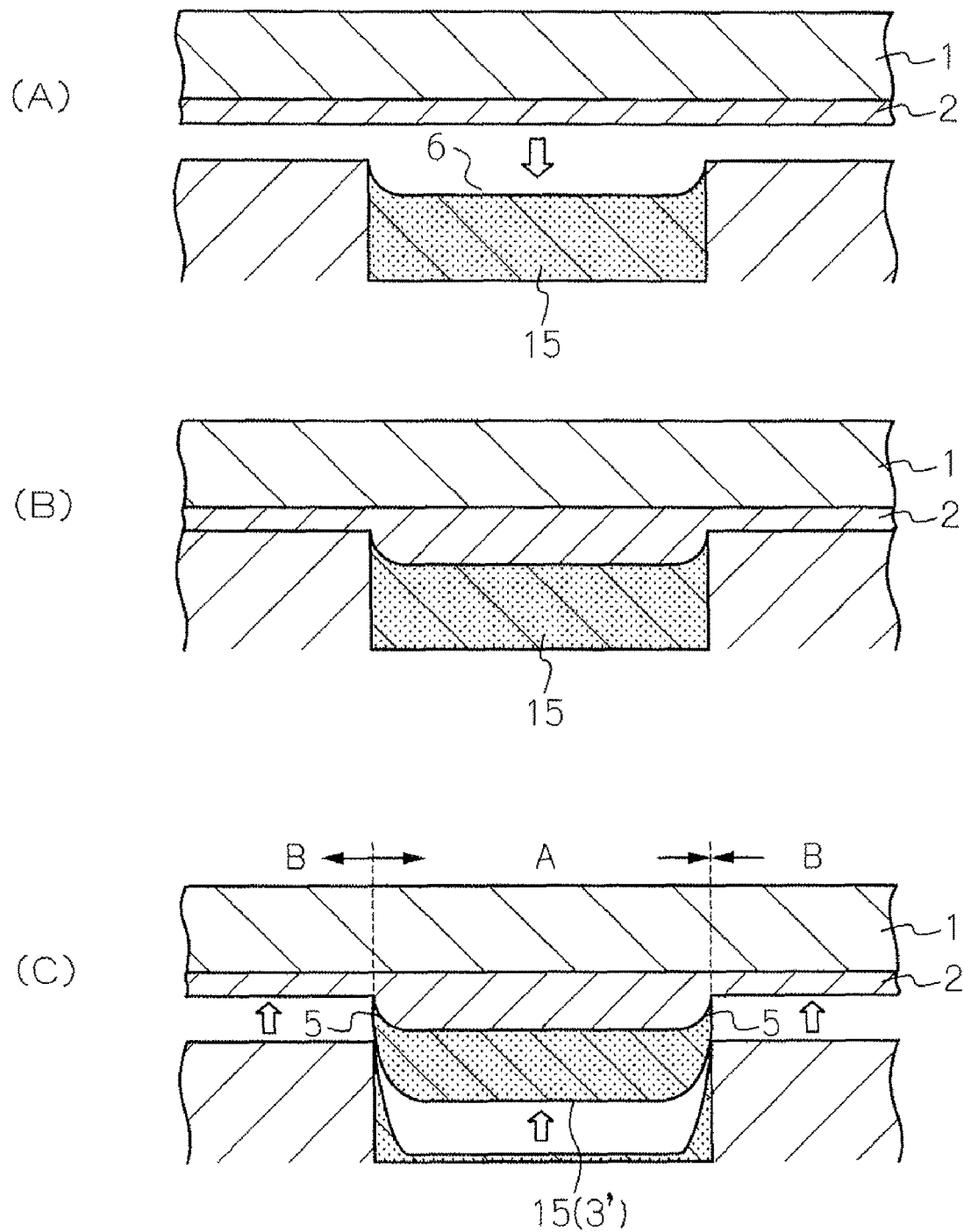
FIG. 11 is a schematic diagram showing an embodiment for filling the primer layer into the indented portions of the conductive position in the intaglio part and transferring the conductive composition.
Figure 12:
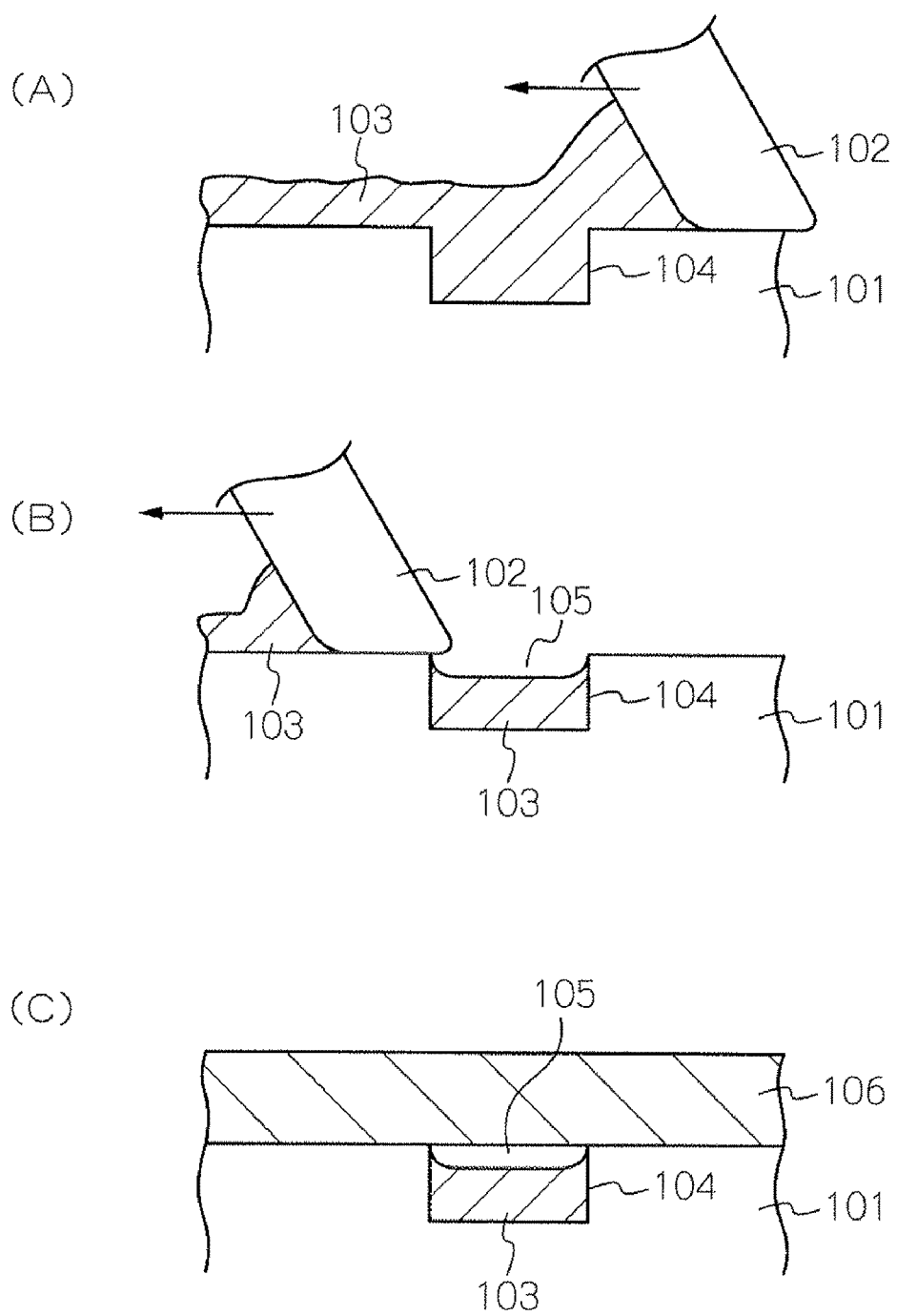
FIG. 12 is a diagram explaining a conventional phenomena in which non-transferred portions of the conductive ink composition is generated on the transparent base material.

The formation shown in FIG. 3 is formed by hardening the primer layer 2 after pressure-bonding the primer layer 2 in the fluid state against the conductive composition provided in the intaglio plate. The formation is formed by pressure-bonding the primer layer 2 and the plate surface providing a shape of a predetermined pattern into which the conductive composition has been filled to adhere the primer layer 2 and the conductive composition without cavities therebetween (when there is an indentation shown in FIG. 11 or the indentation shown in FIG. 12, the indentation is filled in), hardening the primer layer 2 or simultaneously hardening the primer layer 2 and the conductive composition after the pressure-bonding, and transferring the hardened primer layer 2. Specifically, as shown in the later-discussed manufacturing process diagram shown in FIG. 8, the transfer is performed after hardening the primer layer 2 formed on the transparent base material 1 in the fluid state and pressure-bonding against the plate surface in which the conductive composition 15 in the intaglio part. Excessive conductive composition outside of the intaglio part on the plate surface is scraped off by a doctor blade, a wiping roll or the like. After the scraping, indentation 6 easily occurs on the top part of the conductive composition in the intaglio part as shown in FIG. 11. By pressure-bonding the primer layer 2 against the plate surface with the indentation 6, the primer layer 2 with fluidity flows into and filled into the indentation 6 as shown in FIGS. 11(A) and 11(B) to form the shape as shown in FIG. 3.

(Conductive Layer)

The conductive layer 3 is provided on the primer layer 2 in a predetermined electromagnetic shield pattern, such as a mesh shape or a stripe shape. A type of the conductive composition forming the conductive layer 3 is not particularly limited, as long as the conductive layer can be eventually formed based on the used conductive composition after various processes. The electromagnetic shield pattern may be in a mesh shape or a stripe shape, which are normally adapted in electromagnetic shield material. Line width and line pitch may be a size that is generally adapted. For example, the line width may be 5-50 μm, and the line pitch may be 100-500 μm. An opening ratio (ratio of the total area of openings in the entire area of the electromagnetic shield pattern) may be generally approximately 50-95%. Further, separate from the mesh or stripe shaped electromagnetic shield pattern, there is a case in which a ground pattern, such as a entirely plain layer (without formation of openings) in a frame shape that grounds while conducting electricity, may be provided as shown in FIG. 1.

Thickness of the conductive layer 3 may be different depending on resistance value of the conductive layer 3. However, in view of the electromagnetic shield capability and adhesiveness with other members on the conductive layer, the thickness is normally equal to or greater than 2 μm and equal to or less than 50 μm, and preferably equal to or greater than 5 μm and equal to or less than 20 μm, measured at the center part (top of the protrusion pattern).

A type of the material and form of conductive composition is not particularly limited as long as it has a fluid characteristic until filled in the intaglio part of the plate to form in a desired pattern and achieve desired conductivity after hardening. As a representative, an ink or paste material with fluidity that include conductive powder and a resin, and if necessary, the ink or paste material may include a solvent that solves the resin or a disperser that disperses the resin. The conductive layer 3 structured from such conductive composition is a coated film made of a solid material obtained after drying and hardening the conductive composition 3'. The reason to solve or disperses the conductive layer is because the conductive compound may include a solution state and a colloidal state.

The usable range of viscosity of the conductive composition may generally be 100 mPa·s-1000000 mPa·s, and preferably, several thousands mPa·s-several tens of thousands mPa·s, although as discussed below, for example, the degree of preferable viscosity may not be simply identified due to the relationships with the its manufacturing method when the primer component of the primer layer 2 is mixed into the conductive composition or if the primer layer 2 and the conductive composition are hardened at the same time.

As the binder resin structuring the conductive composition, any one of heat hardening resin, ionizing radiation hardening resin and thermoplastic resin may be used. As the heat hardening resin, resins, such as melamine resin, polyester-melamine resin, epoxy-melamine resin, polyimide resin, heat hardening-type acrylic resin, heat hardening-type polyurethane resin, phenol resin, heat hardening polyester resin and the like may be used. As the ionizing radiation hardening resin, the above-described materials as the material for the primer layer may be used. As the thermoplastic resin, resins, such as polyester resin, polyvinyl butyral resin, acrylic resin, thermoplastic polyurethane resin and the like may be used. These resins may be used alone or in combination with a plurality of resins. When using the heat hardening resin, hardening catalyst may be added as needed. When using the ionizing radiation hardening resin, such as the light hardening resin, polymerization initiator may be added as needed.

Moreover, to obtain the fluidity that is appropriate for filling in the intaglio part of the plate, these resins is normally used as varnish that is solved in a solution. Types of the solutions are not particularly limited, and the solution used generally in print inks may be used. For example, one or two types appropriately selected from a ketone type such as acetone, methyl ethyl ketone, methyl isobutyl ketone, cyclohexanone and cyclopentanone, and an ether type such as methyl ether and ethyl ether, an ester type, such as ethyl acetate butyl acetate methylbutyrate, diethylene glycol-n-butyl ether and ethylene glycol monobutyl ether acetate and an aliphatic carbon hydride type, such as pentane hexane and octane and an aromatic carbon hydride type, such as benzene toluene and xylene, an alcohol type such as methyl alcohol, ethyl alcohol, propyl alcohol, isopropyl alcohol, butyl alcohol, terpineol, water, and the like may be used. The contained amount of the solution is normally approximately 10 weight %-70 weight %, but it is preferable that the about is small in a range that required fluidity can be obtained. In addition, when using the ionizing radiation hardening resin, such as a light hardening resin, because it has originally fluidity, the solution may not be needed.

Further, as the conductive powder structuring the conductive composition, low resistivity metal powder such as gold, silver, platinum, copper, tin, palladium, nickel and aluminum, powder formed by plating a low resistivity metal such as gold and silver, on a surface of powder made of a material other than the low resistivity metal (resin powder such as acrylic resin and melamine resin, and inorganic powder such as silica, alumina, barium sulfate, zeolite), or conductive carbon powder such as graphite and carbon black, may be preferably used. In addition, conductive ceramics or conductive organic polymer powder may also be used. Its shape may be selected from spherical, rotating oval shape, polygonal shape, scale shape, disc shape, fibriform (acerous) and the like. These materials and shapes may be appropriately combined. Although the size and type of the conductive powder are arbitrarily selected and thus cannot be specifically identified, in case of scale shape silver powder, powder having an average particle diameter of about 0.1-10 μm may be used, and in case of carbon black powder, powder having an average particle diameter of about 0.01-1 μm may be used.

The amount of conductive powder included in the conductive composition may be arbitrarily selected depending on the conductivity or form of the conductive powder. For example, in the solid part of the conductive composition having 100 weight parts, the conductive powder may be included in a range of 40-99 weight parts. In this application, an average particle diameter refers to a value measured by a particle size distribution meter or TEM observation. In addition, the particle is in a non-spherical shape, such as polygonal or fiber shape, the particle diameter is generally defined by the diameter of a circumscribed sphere, a length of diagonal line, or a length of the longest side.

Further, an additive may be added in the conductive composition for the purpose of improving the quality. For example, by adding a predetermined amount of black pigment or black dye as needed, contrast can be increased, and visibility may be improved when structuring the electromagnetic shield panel. In addition, for preventing reflection and suppressing irregular color and metallic color on the backside of the transparent base material due to the metallically glazed finish of the later-discussed metal plated layer, it is desirable to include such black pigment or black dye. However, the carbon black is by itself black and thus may not be necessary to add the black pigment or the black dye. As the black pigment, carbon black, which also function as conductive powder, $Fe_3O_4$, $CuO-Cr_2O_3$, $CuO-Fe_3O_4-Mn_2O_3$, $CoO-Fe_2O_3-Cr_2O_3$ and the like may be used. The type and shape are not limited particularly, and black pigment or black dye that has a greater coloring performance and has an average particle diameter of 0.1 μm or less, which can be easily dispersed in the binder resin, is preferable. When using the carbon black, color material carbon black such as channel black, furnace black and lamp black, conductive carbon black, acethylene black, and the like may be used. In particular, the type of the carbon black that has an average particle diameter of 20 nm or less is preferably used. Further, black dye such as aniline black may be used. Moreover, to improve the fluidity and stability of the conductive composition, filler, thickening agent, surface-activating agent, antioxidant or the like may be added as long as the conductivity and adhesive with the primer layer are not negatively affected.

As shown in the later-discussed manufacturing process diagram in FIG. 8, the conductive layer 3 is formed by first coating with a conductive composition a plate-shaped or cylindrical plate surface on which intaglio parts are formed in a predetermined mesh or stripe pattern, and subsequently by filling the conductive composition into the intaglio parts after scraping the conductive composition adhered outside of the intaglio parts. Then, the transparent base material 1, on which the primer layer 2 having fluidity on one side of the transparent base material 1, is prepared, and the primer layer 2 side of the transparent base material 1 and the plate surface on which the conductive composition is filled into intaglio parts are pressure-bonded against each other, to adhere the conductive composition and the primer layer 2 without cavities therebetween. After losing the fluidity of (hardening) the primer layer 2 on the transparent base material 1, the conductive composition is transferred on the primer layer 2 to form the conductive composition layer 3' having a predetermined mesh or stripe patterns. After transferring the conductive composition 3' on to the primer layer 2, the conductive layer 3 is formed by hardening process (e.g., drying process, ultraviolet/electron ray irradiation process, heating process, or cooling process).

In this invention, as discussed above, the primer layer 2 having fluidity is filled into the indentation 6 generated on the top part of the conductive composition in the intaglio parts after scraping excess conductive composition outside the intaglio parts by a doctor blade piping roll or the like, and the primer layer 2 is hardened while the conductive composition and the primer layer 2 adhere without cavities therebetween. Therefore, the conductive composition is transferred on the primer layer 2 without transfer failure.

In the above description, the conductive composition structured mainly by conductive powder and resin is explained. Such conductive composition may be the conductive layer 3 by itself. However, other conductive composition may be used in this invention. For example, a conductive metal or a metallic compound, which may be formed by using an organic metallic compound sol (dispersion liquid), heating and hardening before or after the transfer process, and calcining the compound, if necessary, may be used as the conductive layer 3. In addition, a known conductive resin, such as polythiophene, may be used as the conductive composition to form the conductive layer 3.

(Formation of Conductive Layer Pattern)

Next, formations of the conductive layer 3 formed in a predetermined pattern on the primer layer 2 are described. Below, these formations may be referred as "conductive layer pattern 19." FIGS. 4-7 are schematic cross-sectional view showing the first formation to the forth formation of the conductive layer pattern 19 (19A-19D).

In this invention, the conductive layer pattern 19 is structured by the primer layer 2 and the conductive layer 3 formed by the conductive composition 3' formed in a predetermined pattern on the primer layer 2. In all of the conductive patterns 19A-19D, the thickness $T_A$ of the primer layer 2 at part A at which the conductive layer 3 is formed (referred to as "pattern formation part") is larger than the thickens $T_B$ of the primer layer 2 at part B at which the conductive layer 3 is not formed (referred to as "pattern non-formation part").

Such formations have effects of good adhesion between the primer layer 2 and the conductive layer 3, compared to the case that the conductive layer 3 is formed on a flat primer layer 2. In addition, such formations are formed in their manufacturing method as discussed above. The indentation 6 is easily formed on the top part of the conductive composition in the intaglio parts after scraping the excess conductive composition outside of the intaglio parts on the plate surface using a doctor blade, a wiping roll or the like. By pressure-bonding the primer layer 2 against the plate surface with such indentation 6, the indentation 6 is filled with the fluid primer layer 2, and the primer layer 2 is peeled after it is hardened, thereby forming the formation. In the conductive layer pattern 19A of the first formation shown in FIG. 4, the primer layer 2 adheres to the conductive layer 3 (conductive composition 15) without cavities therebetween. Therefore, an electromagnetic shield material can be provided without failures, such as wire breakage, improper shape and low adhesion based on insufficient transfer of the conductive layer 3 (conductive composition 15).

The additional feature structure of this invention having the above-discussed structural feature ($T_A$>$T_B$) may be that the primer layer 2 exists at the pattern non-formation part B and/or that the conductive composition 3' that structures the conductive layer 3 does not exist substantially at the pattern no-formation part B. Because of the former "the primer layer 2 exists at the pattern non-formation part B," the conductive composition 3' is accurately transferred on the transparent base material 1 with the primer layer 2 at the time of the later-discussed transfer process. That is, when peeling off the transparent base material 1 and the primer layer 2 from the plate surface during the transfer process, the conductive composition 3' filled into the intaglio parts of the plate surface functions as "peeling resistance," and the conductive composition 3' tends to be peeled from the transparent base material 1 with the primer layer 2 and to remain in the inside of the intaglio parts. However, in this invention, although the thickness of the primer layer 2 at the pattern formation part A and the thickness of the primer layer 2 at the pattern non-formation part B are different, because the primer layer 2 is continuously provided on the transparent base material 1, the conductive pattern 19 structured form the conductive composition 3' and the primer layer 2 can be peeled from the intaglio parts and transferred well based on "peeling resistance."

During the above-discussed transfer process, a preferred conduction to improve the transferability is that an adhesive force F1 is the smallest among adhesive forces F1-F3, where (1) F1 is the adhesive force between the intaglio parts of the plate surface and the conductive composition 3', (2) F2 is the adhesive force between the conductive composition 3' and the primer layer 2, and (3) F3 is the adhesive force between the primer layer 2 and the transparent base material 1. In the electromagnetic shield material and a structure material for the later-discussed printed matter according to this invention are generally to satisfy this condition unless the inside of the intaglio parts are performed with an anchor process (e.g., process to form minute bumps). If, for example, a inorganic base material, such as a glass base material, which is used as the transparent base material 1, or a ceramic base material, which is used as the structured base material for the later-discussed printed matter, is used, among the adhesive forces F1-F3, a problem is caused by the relationship between the adhesive forces F1 and F3. However, even in this case, among the adhesive forces F1-F3, the adhesive force F1 usually becomes smallest. To meet such a preferable condition, the surface of the transparent base material 1 (including the base material 71 structuring the printed matter 70) may be processed, if necessary, to improve the adhesive force with the primer layer 2. The adhesive force as discussed here can be applied not only to the electromagnetic shield material according to this invention but also to the later-discussed printed matter according to this invention. The above-discussed degrees of adhesive forces F1-F3 are examples for one of preferred conditions to improve the transferability. However, such condition is not a required condition.

Moreover, by the latter phrase "the conductive composition 3' that structures the conductive layer 3 does not exist substantially at the pattern non-formation part B," when the electromagnetic shield material is used as positioned on the front surface of the display device, transparency of the opening parts, which is the pattern non-formation part B, can be secured, which allows brightness, contrast and the like of the displayed image. Here, the phrase "the conductive composition 3' does not exist substantially" includes a case that the conductive composition 3' does not exist at all, and further includes that existence of the conductive composition 3' is allowed at a level at which the above-described brightness, contrast and the like of the displayed image can be secured even if a certain level of the conductive composition 3' exists. The condition in which the conductive composition 3' exists at an allowable level includes a condition in which the conductive composition 3' exists slightly at a wide coverage or in a sparse level. The allowable level may be the thickness of the conductive layer 3 formed by the conductive composition 3', the coverage of the conductive composition 3' in the pattern non-formation part B, the transmissivity of the pattern non-formation part B, or the like. Of these, the thickness of the conductive layer 3 formed by the conductive composition 3' may depend on the types of the conductive composition 3', and thickness of the conductive layer 3 is preferably, for example, equal to or less than 0.3 μm or, if the conductive composition 3' includes opaque particles, equal to or less than an average particle diameter of the particles. When the thickness is below these numbers, it is difficult to consider that the light transmissivity of the pattern non-formation part B is reduced and that the brightness, contrast and the like of the displayed image are lowered. Moreover, the coverage of the conductive composition 3' in the pattern non-formation part B may also depend on the type of the conductive composition 3', and the coverage of the conductive composition 3' is preferably, for example, that the conductive composition 3' has an area of equal to or less than 10% of the area of the opening of the pattern non-formation part B when the conductive composition 3' is opaque. With the area equal to or below such a percentage, it is difficult to consider that the light transmissivity of the pattern non-formation part B is decreased and that the brightness, contrast and the like of the displayed image are lowered. Furthermore, representing by the transmissivity of the pattern non-formation part B, when the state in which the conductive composition 3' does not exist in the pattern non-formation part B is defined as 100%, the conductive composition 3' may exist in the pattern non-formation part B at equal to or more than 90%. It is difficult to consider that the brightness, contrast and the like of the displayed image are lowered. Moreover, these allowable ranges may differ depending on the design of the electromagnetic shield material (target specification or characteristics of other combined members), and thus may not be limited to the above-discussed values.

As discussed above, in the electromagnetic shield material of this invention, it is preferable that the primer layer 2 exists also at the pattern non-formation parts B and/or that the conductive composition 3' structuring the conductive layer 3 does not substantially exist at the pattern non-formation parts B. Especially, it is preferable that both points are met.

The four formations shown in FIGS. 4-7 have additional features of the conductive patterns equipped with the electromagnetic shield material according to this invention having the above-discussed features and are formations that show the conductive layer pattern shown in FIG. 3(A) in further details. For the conductive layer pattern 19 of the first-forth formations, all shapes in the conductive layer pattern 19 are bell shaped. This is because a mold for forming the conductive layer pattern is formed in the bell shape, and the conductive layer pattern 19 is not limited to such shape.

Figure 4:
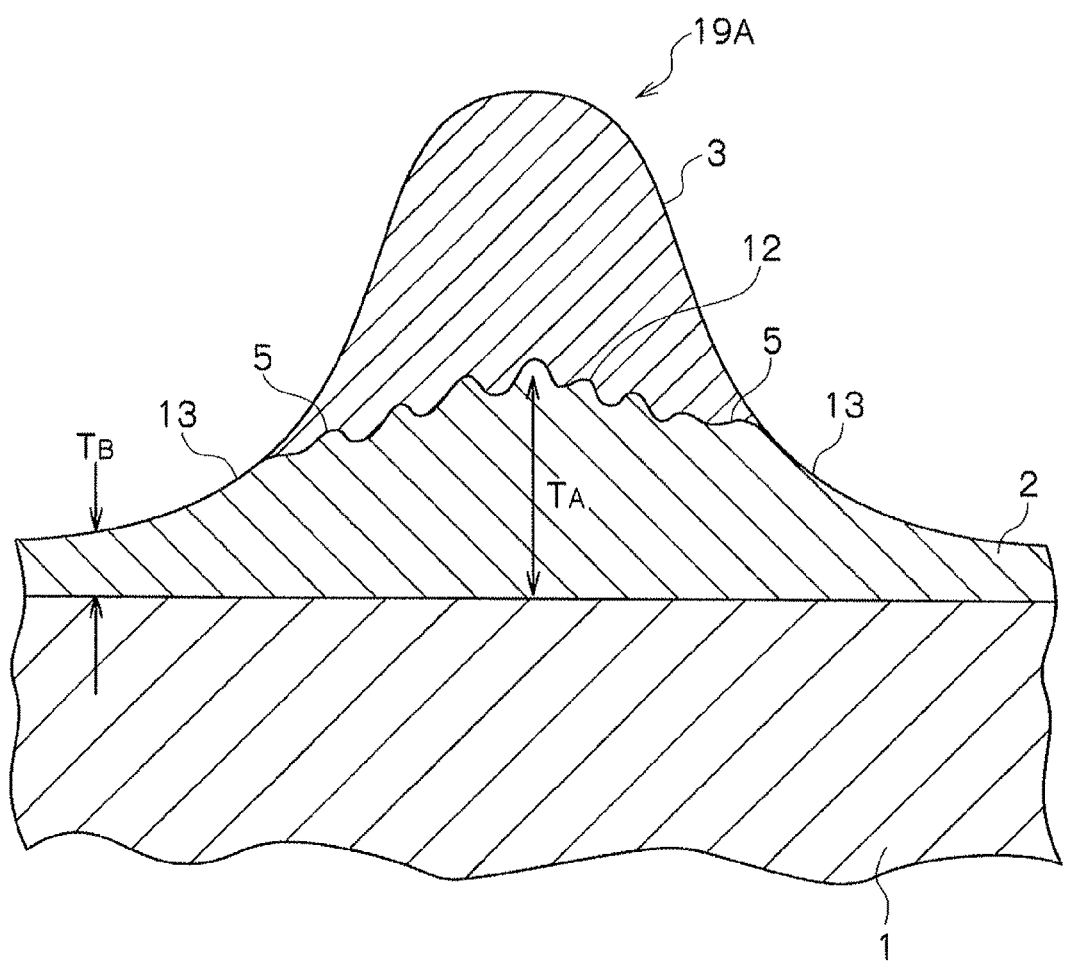
FIG. 4 is a schematic cross-sectional view showing a conductive layer relating to the first embodiment.

The conductive layer pattern 19A of the first formation is a formation in which a boundary face 12 between the primer layer 2 and the conductive layer 3 is uneven, and in which the boundary face 12 has a complicated interface shape as shown in FIG. 4, for example. In this formation, the boundary face 12 may be structured as a boundary face for the resin structuring the primer layer 2 and the resin or filler structuring the conductive layer 3. The "filler" in this case may be any powder, which may be conductive or non-conductive powder. For example, when the conductive composition includes the conductive powder and a binder resin, the boundary face may be a boundary surface between the conductive powder and the binder resin in the conductive layer 3 and the resin structuring the primer layer 2. that is uneven and has the complicated interface shape Degree of complexity of the boundary surface shape is defined based on formation and a size of the conductive powder of the conductive layer 3. In addition, when the conductive composition does not include the filler but includes the conductive resin or conductive compound, the boundary face between the primer layer 2 and the conductive layer 3 are uneven and has the complicated interface shape based on the pressure applied when pressure-bonding the primer layer 2 into the intaglio parts. Moreover, in the conductive layer pattern 19A of the first formation, the uneven boundary face 12 has a hill cross-sectional shape in which the center part is higher among the entire parts (as the enveloping surface shape).

In such conductive layer pattern 19A of the first formation, in addition to the good adhesiveness by the formation of the conductive layer 3 on the hill-shaped primer layer 2, which does not have a flat surface, the boundary face 12 is uneven and has the complicated interface shape as discussed above. Therefore, by the so-called anchor effect, the adhesiveness between the primer layer 2 and the conductive layer 3 significantly increases. Further, when forming such conductive layer pattern 19A, there is a remarkable effect that the conductive composition filled into the intaglio parts of the plate is transferred on the primer layer 2 at the extremely high transfer printing rate (substantially 100%).

Figure 5:
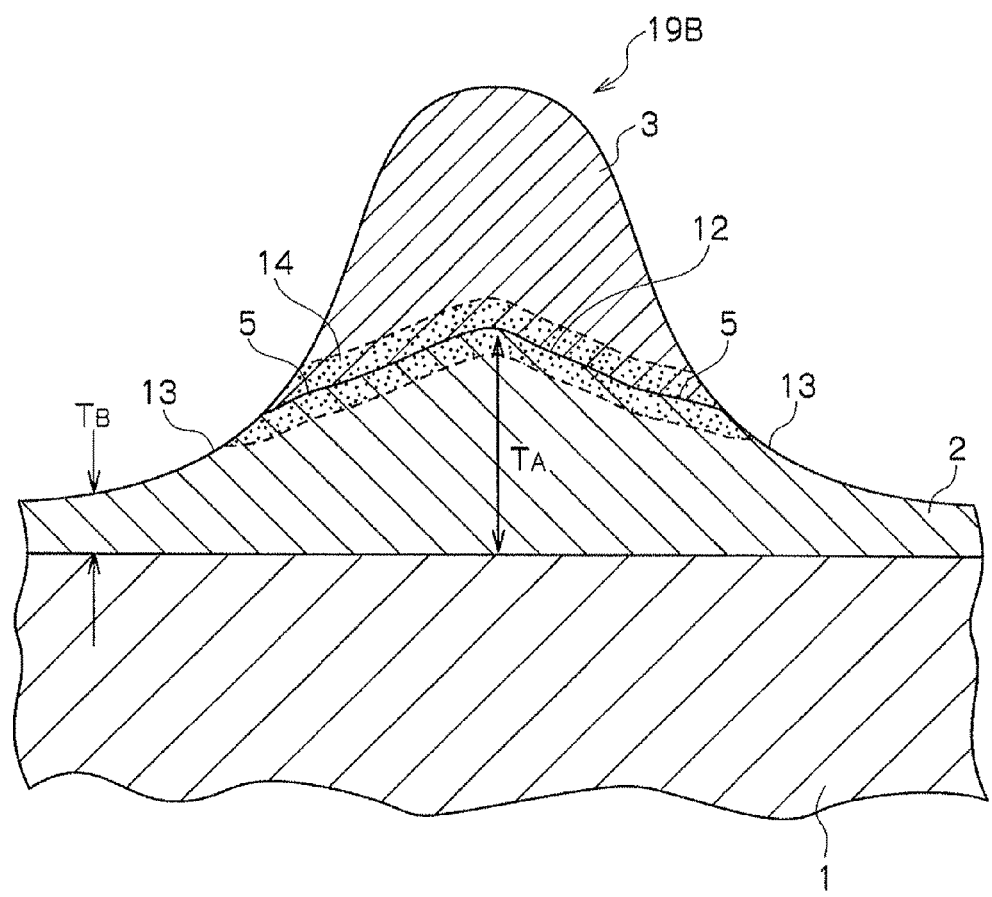
FIG. 5 is a schematic cross-sectional view showing a conductive layer relating to the second embodiment.

As shown in FIG. 5, the conductive layer pattern 19B of the second formation is a formation in which a region 14 in which a primer component included in the primer layer 2 and a composition structuring the conductive composition layer 3' are mixed, exists near the boundary face 12 between the primer layer 2 and the conductive layer 3. Although the boundary face 12 is clearly shown in FIG. 5, the boundary face 12 may not be clearly formed in actual mixture region 14, and an unclear and ambiguous boundary face may be formed (see FIG. 17). In addition, the mixture region 14 exists so as to sandwich the boundary face 12 from the upper side and lower side in FIG. 5. In this case, the primer component (e.g., solvent) in the primer layer 2 and an arbitrary component (e.g., monomer composition) in the conductive layer 3 are mixed into the respective layers. Moreover, the mixture region 14 may exist only above the boundary face 12, the primer component in the primer layer 2 breaks in the conductive layer 3, and the arbitrary component of the conductive layer 3 is not mixed into the primer layer 2. When the mixture region 14 exists only the lower side of the under boundary face 12, the arbitrary component of the conductive layer 3 is mixed into the primer layer 2, and the primer component of the primer layer 2 does not mixed into the conductive layer 3. The thickness of the mixture region (thickness in the top and bottom direction of FIG. 5) is not particularly limited.

Similar to the case of the first formation, in the conductive layer pattern 19B of the second formation, the adhesiveness is high because the conductive layer 3 is laminated on a hill formed in the primer layer 2, namely, on the even surface of the primer layer 2. In addition, because of the mixture region 14 near the boundary face 12 as discussed above, the adhesiveness between the primer layer 2 and the conductive layer 3 significantly improves. Further, there is a remarkable effect that, when forming such conductive layer pattern 19B, the conductive composition filled into the intaglio parts of the plate is transferred on the primer layer 2 at a high transfer printing rate (substantially 100%).

Figure 6:
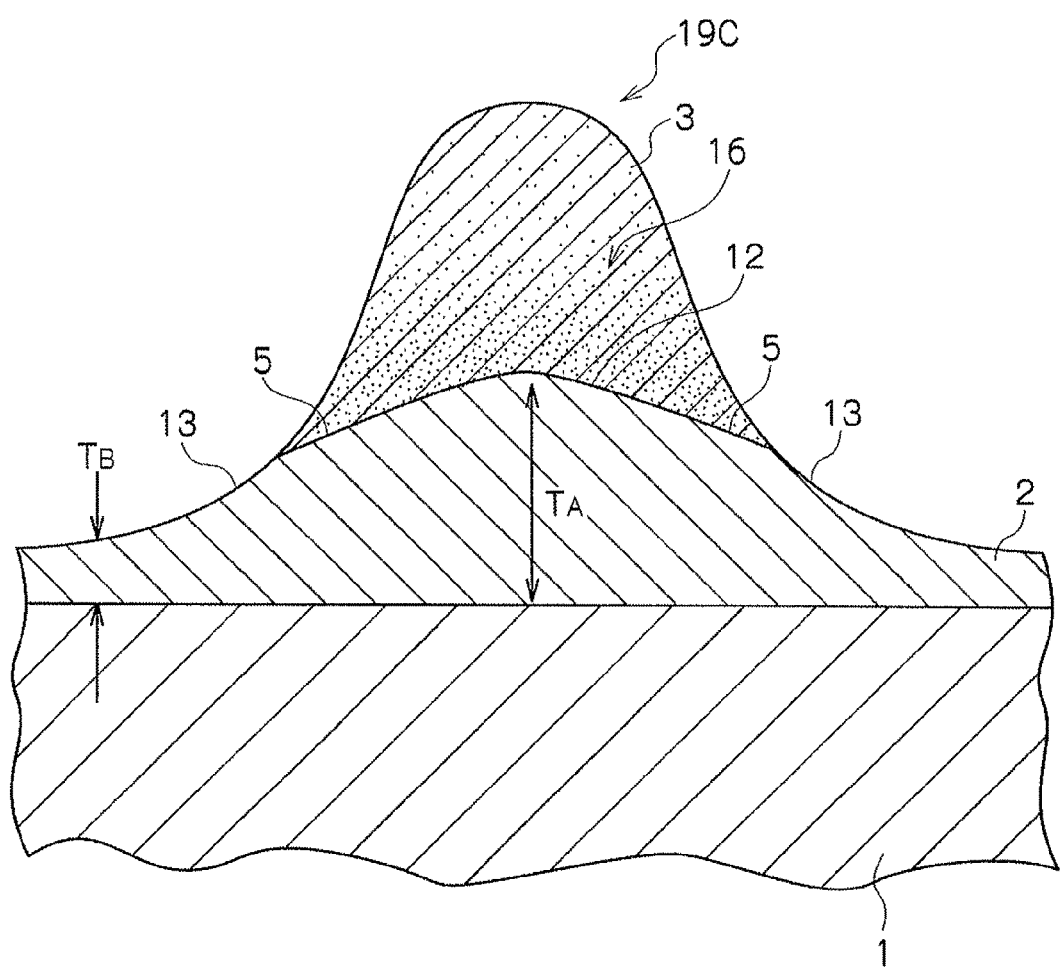
FIG. 6 is a schematic cross-sectional view showing a conductive layer relating to the third embodiment.

As shown in FIG. 6, the conductive layer pattern 19C of the third formation is a formation in which a primer component 16 included in the primer layer 2 exists in the conductive composition structuring the conductive layer 3. FIG. 6 schematically shows the formation of the primer component 16 in which a large amount of the primer component 16 exists neat the boundary face 12, and the amount of the primer component 16 decreases towards the top of the conductive layer 3. The conductive layer pattern 19C is not particularly limited to such formation. It is only necessary to provide the primer component 16 existing in the composition layer 3. The primer component 16 may be mixed into the conductive layer 3 at a level to be detected at the top of the conductive layer 3 or at a level to be detected near the boundary face 12. In addition, the third formation has the region, in which the primer component 16 exists in the conductive layer, is locally formed near the boundary face 12 may correspond to the second formation has the mixture region 14 that is only formed on the upper side of the boundary face 12.

Similar to the case of the first and second formations, in the conductive layer pattern 19C of the third formation, the adhesiveness is high because the conductive layer 3 is laminated on a hill formed in the primer layer 2, namely, on the even surface of the primer layer 2. In addition, because the primer component 16 is mixed into the conductive layer 3 so as to exist in the conductive layer 3, the adhesiveness between the primer layer 2 and the conductive layer 3 significantly improves. Further, there is a remarkable effect that, when forming such conductive layer pattern 19C, the conductive composition filled into the intaglio parts of the plate is transferred on the primer layer 2 at an extremely high transfer printing rate (substantially 100%).

In the conductive layer pattern 19 of the second and third formations, when the primer component 16 in the primer layer 2 breaks in the conductive layer 3, depending on the primer component 16, the primer component 16 causes the conductive composition to increase its viscosity or to forms in a gel or half-solidified state, or the hardening component in the primer breaks in the conductive composition layer 3'. Thereafter, in the transfer process after only the primer layer 2 is hardened, the conductive component with increased viscosity or half-hardened state can be transferred (transfer printing) at a transfer printing rate of substantially 100%. Further, in the transfer process after the primer layer 2 and the conductive composition harden at the same time, because the adhesiveness between these layers increases, the conductive composition can be transferred (transfer printing) to the primer layer 2 at a transfer printing rate of substantially 100%.

Figure 7:
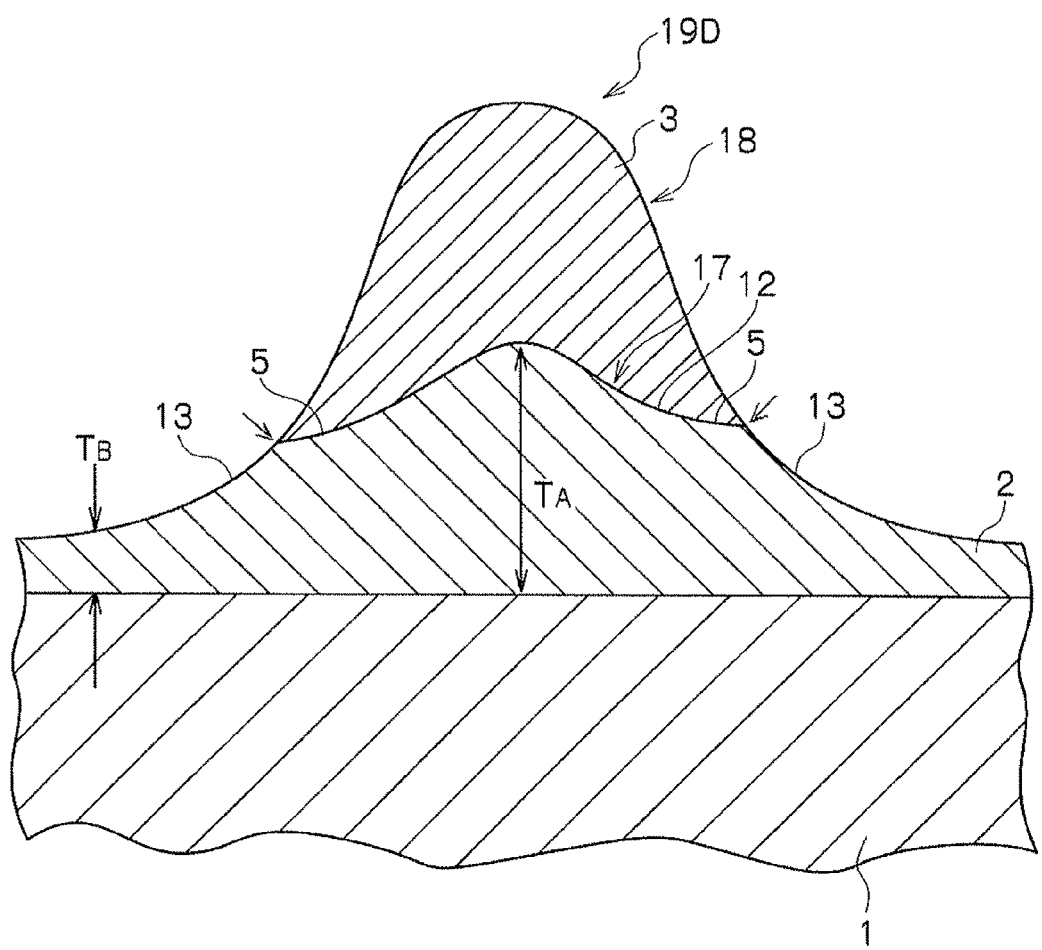
FIG. 7 is a schematic cross-sectional view showing a conductive layer relating to the forth embodiment.

As shown in FIG. 7, the conductive layer pattern 19D of the forth formation has a projection pattern structured by a first hill 17 formed by the primer layer 2 and a second hill 18 formed by the conductive composition (conductive layer 3) formed above an upper part or near a foot part 13 of the first hill 17 (hillside part of the first hill 17 as a whole). In other words, in the conductive layer pattern 19D, the base part (foot part 13) is structured by the projections of the primer layer 2, and the conductive layer 3 formed on the projections is structured so as to be formed above the upper end of the base part (hillside part of the first hill 17). Therefore, in the conductive layer pattern 19D, because the conductive layer 3 (conductive composition) is formed above the hillside part of the first hill 17, the conductive layer 3 is not formed in the foot part 13 below the hillside Part. Such a formation is a unique feature that has never been provided before.

Similar to the above-discussed first-third formations, in the conductive layer pattern 19D of the forth formation, the adhesiveness is high because the conductive layer 3 is laminated on a hill formed in the primer layer 2, namely, on the even surface of the primer layer 2. In addition, because the conductive layer pattern 19D is structured by the first hill 17 formed by the primer layer 2 and the second hill 18 formed by the conductive composition (conductive layer 3) formed above the hillside of the first hill 17, the adhesiveness between the primer layer 2 and the conductive layer 3 significantly improves. Further, there is a remarkable effect that, when forming such conductive layer pattern 19D, the conductive composition filled into the intaglio parts of the plate is transferred on the primer layer 2 at an extremely high transfer printing rate (substantially 100%).

Furthermore, in the forth formation, the first hill 17 may be structured so as to have a non-continuing parts (parts pointed by arrows in FIG. 7) at an inclined portions of the outer contour surface of the hillside part. By the effect of such non-continuing parts, the falling off of the conductive layer 3 may further be suppressed. The non-continuing parts of the inclined portions of the outer contour surface are generated when the primer layer 2 flows in the conductive composition 3' during the process of the manufacturing method of this invention (see FIG. 11). The non-continuing part is a parts at which the inclination of the outer contour surface (outer surface) of the first hill 17 of the primer layer 2 changes non-continuously.

Further more, in the forth formation (similarly in the first-third formations), because the side edges 5 of the conductive layer 3 is at an angle close to the inclination of the foot part 13 that raises in a slope, the tips of the side edges 3 of the conductive layer 3 are difficult to peel off from the primer layer 2. For instance, based on a peeling test using a typical adhesive tape, the strength against the peeling of the conductive layer pattern 19 formed of such formation was high.

In this invention, it is preferable that the conductive layer pattern 19 has at least one of the features of the conductive layer pattern 19 of the first to forth formations. The conductive layer pattern 19 may have two or more, or all four of such features.

Moreover, in the conductive layer pattern 19 of the above-discussed first to forth formations, in addition to the above effects, because the transferability of the conductive composition (conductive layer 3), the thickness of the conductive composition (conductive layer 3) after the transfer can be made larger compared to the method that uses a normal intaglio printing, such as gravure printing. Therefore, by making the conductive layer pattern 19 thick, there is an effect that conductivity required for the electromagnetic shield can be secured.

(Metal Layer)

A metal layer 4 may be formed, if needed, to further improve the conductivity when it is insufficient to obtain a desired conductivity only with the conductive layer 3. It is formed by being plated on the conductive layer 3. As a plating method, electroplating (electrolytic plating), electroless plating and the like may be used. The electroplating is preferred because it can increase the plating speed by multiple times by increasing the amount of conducted electricity compared to the electroless plating, thereby remarkably increasing the productivity.

In case of the electroplating, the electric supply to the conductive layer 3 is accomplished from an electrode, such as a conductive roll, that contacts a surface on which the conductive layer 3 is formed. Because the conductive layer 3 has conductivity at a level that enables the electroplating (e.g., 100 Ω/sq or less), the electroplating can be performed without problems. As a material to structure the metal layer 4, copper, silver, gold, chrome, nickel or tin, which has high conductivity for easy plating, may be used. Because such metal layer 4 generally has a single digit volume resistivity, which is small compared with the conductive layer 3, there is an advantage to reduce the required amount of conductive material compared to the case that the conductive layer is only used for shielding an electromagnetic wave.

In addition, if necessary, after forming the metal layer 4, the metal layer 4 may be performed with a blackened process, the surface thereof may be roughened, or a protective layer 9 as shown in FIG. 2 may be laminated on the primer layer 2 and the metal layer 4. For example, the blackened process may be performed by blackened nickel plating, copper-cobalt alloy plating or the like. The protective layer 9 may be laminated using an acrylic ionizing radiation hardening resin. Normally, the protective layer 9 is laminated so as to flatten the surface by covering the irregularity formed by the inductive layer 3 with the protective layer 9.

The structure of the electromagnetic shield material 10 according to this invention is described above. Because the electromagnetic shield material 10 of this invention has a formation in which, on the primer layer 2 provided on the transparent base material 1, the thickness $T_A$ of the part A at which the conductive layer 3 is formed is larger than the thickness $T_B$ at the part B at which the conductive layer 3 is not formed, the primer layer 2 is proved to fill in the indentation 6 that is pointed out in the problems to be solved (see also number 105 in FIG. 12). The primer layer 2 having such formation is formed by filling in the indentation 6 at the top part of the conductive composition in the intaglio parts after scraping the conductive composition on the plate by a doctor blade, a wiping roll or the like during the manufacturing of the electromagnetic shield material 10. As a result, there is an effect to provide the electromagnetic shield material 10, in which the primer layer 2 and the conductive composition are pressure-bonded with excellent adhesiveness, without problems caused by wire breakage3, improper shapes, and low adhesiveness based on insufficient transfer of the conductive composition layer 3'.

Moreover, in the electromagnetic shield material 10 of this invention, the primer layer 2 is provided at least below the conductive layer 3. However, it is preferable that the primer layer 2 is provided on the entire surface of the transparent base material 1, including so-called openings, which is regions other than the regions in which the conductive layer pattern 19 is formed, that is, the region in which the conductive layer 3 is not formed. By forming the primer layer 2 on the entire surface of the transparent base material 1, there is an effect that the conductive layer pattern 19 is hard to peel off from the transparent base material 1 compared to the case in which the primer layer 2 is only formed under the conductive layer 3 and is not formed in the openings.

[Method of Manufacturing Electromagnetic Shield Material]

Figure 8:
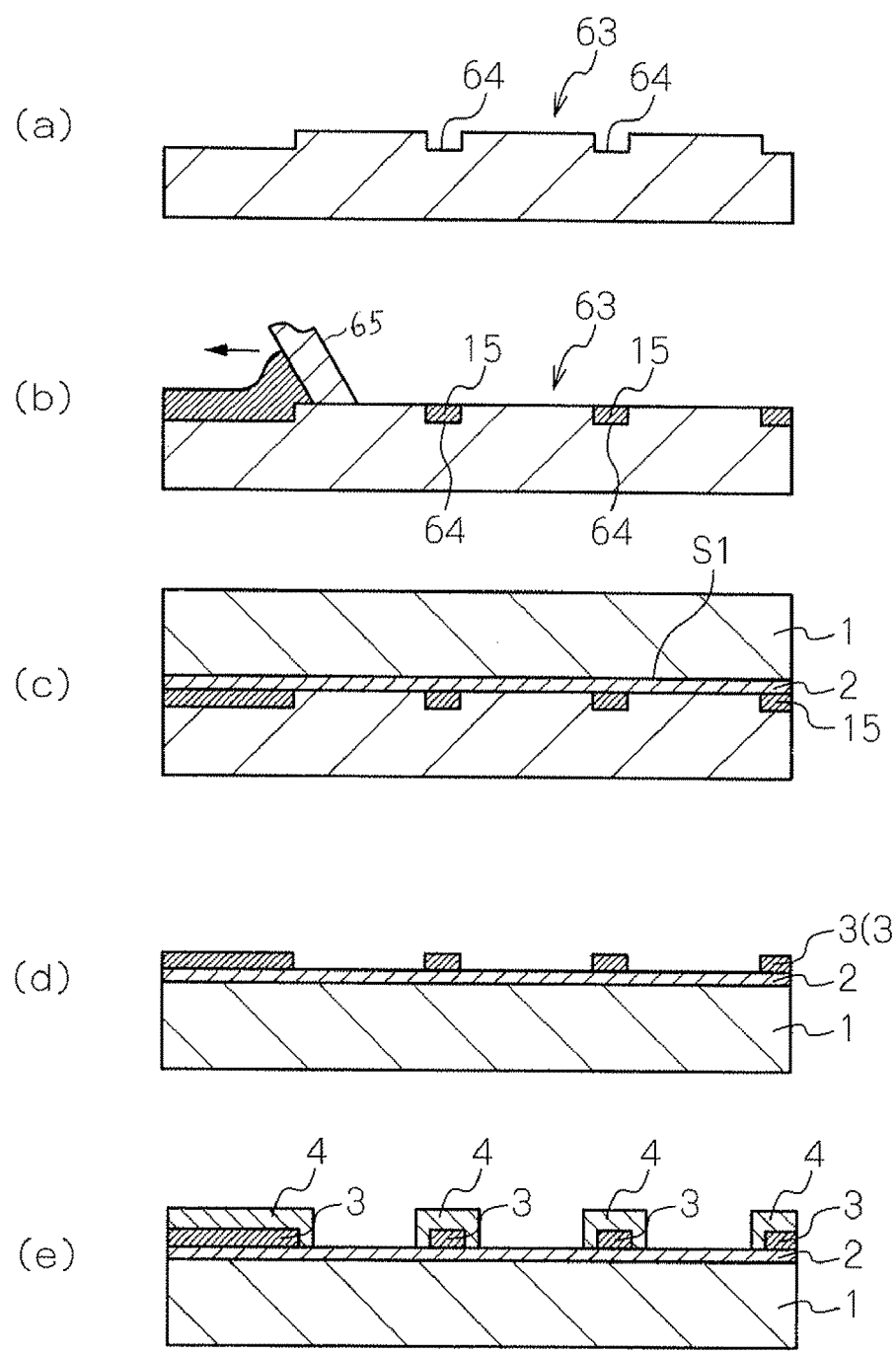
FIG. 8 is a process diagram showing an example of a method of manufacturing the electromagnetic shield material according to this invention.
Figure 9:
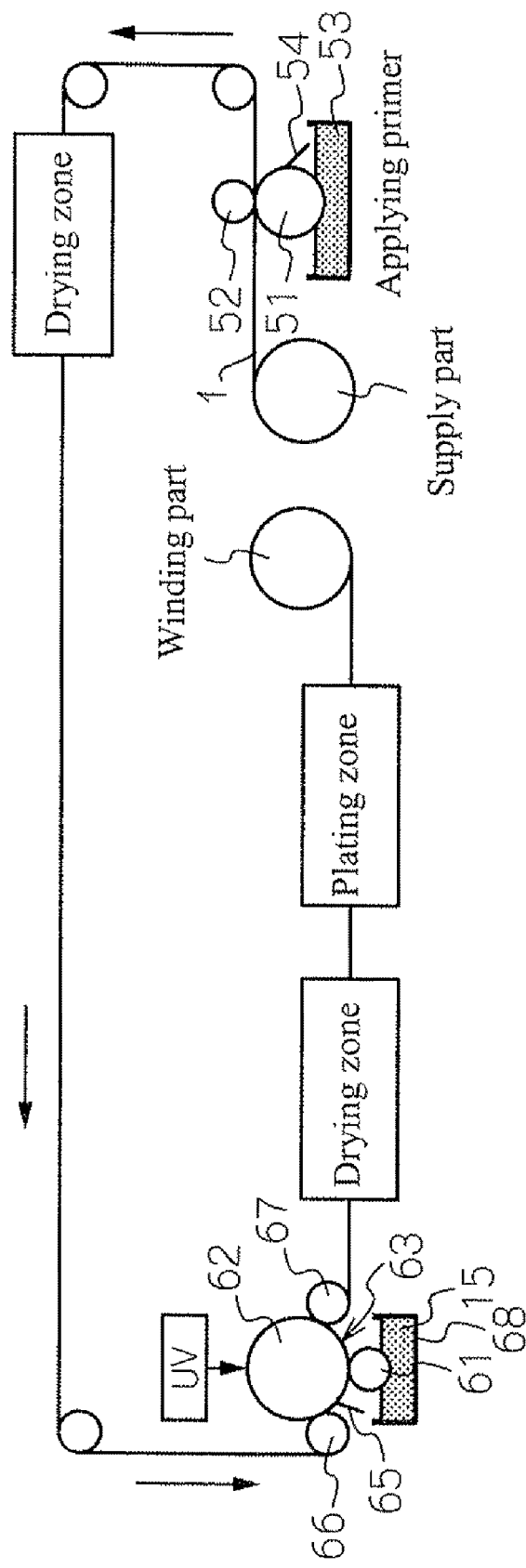
FIG. 9 is a schematic structural diagram of a device that performs the manufacturing method of this invention.
Figure 10:
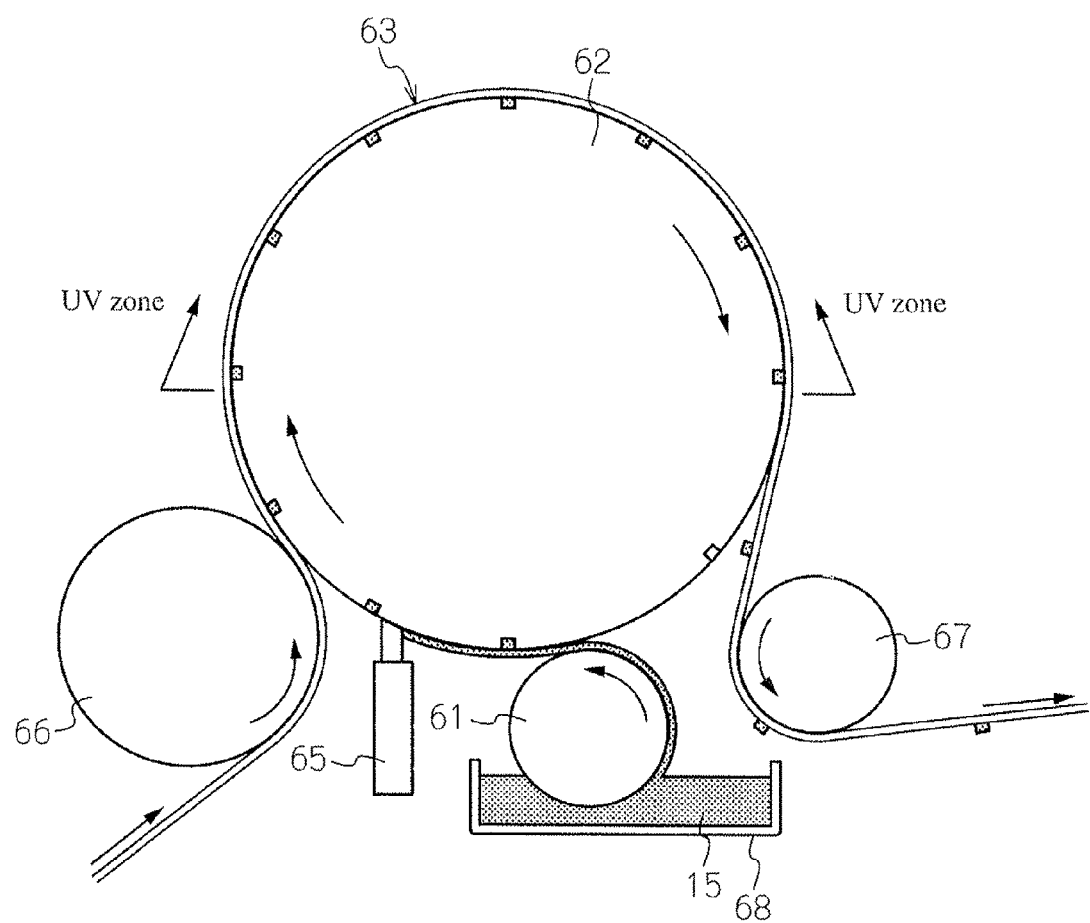
FIG. 10 is a schematic structural diagram of a device that performs a transfer process of transferring the conductive composition onto the primer layer.

FIG. 8 is a process diagram showing an example of the method of manufacturing the electromagnetic shield of this invention. In addition, FIG. 9 is a schematic structural diagram of the device for implementing the manufacturing method of this invention. FIG. 10 is a schematic structural diagram of a device for implementing the transfer process of transferring the conductive composition on to the primer layer. In this application, "transfer" and "transfer printing" are considered synonymous to each other. Therefore, "transfer" may be replaced with "transfer printing," and "transfer process" may be replaced with "transfer printing process."

As shown in FIGS. 8-10, the method of manufacturing the electromagnetic shield of this invention is a method of manufacturing the electromagnetic shield material 10 (see FIG. 2) in which the conductive layer 3 is formed in a predetermined pattern on one surface of the transparent base material 1.

The manufacturing method according to the first aspect at least has a transparent base material preparing process (not shown) for preparing the transparent base material 1 on which the primer layer 2 that can maintain fluidity until it hardens is formed on one surface S1, a conductive composition filling process (see FIG. 8(B)). In this process, the indentation 6 shown in FIG. 11 is generated on the upper part of the conductive composition filled into the intaglio part 64 of filling the conductive composition 15 into the intaglio part 64 after scraping the conductive composition adhered in the areas other than the inside of the intaglio part, after coating with the conductive composition 15 (having fluidity in a non-hardened state) that forms the conductive layer 3 after it hardens, a plate shaped or cylindrical plate surface 63 on which the intaglio part 64 is formed in a predetermined pattern, a pressure-bonding process (see FIG. 8(C)) for adhering the primer layer 2 and the conductive composition 15 in the intaglio part 64 without cavities therebetween by pressure-bonding the primer layer 2 on the transparent base material 1 after the transparent base material preparing process and the intaglio part 64 of the plate surface 63 after the conductive composition filling process, a primer layer hardening process (not shown) for hardening (non-fluid or solidifying) the primer layer 2 after the pressure-bonding process but not completely hardening the conductive composition 15, a transfer process (see FIG. 8(D)), of transferring the conductive composition 15 in the intaglio part on to the primer layer 2 by peeling off the transparent base material 1 and the primer layer 2 after the primer layer hardening process from the plate surface 63, and a conductive composition hardening process (not shown) for forming the conductive layer 3 by hardening the conductive composition layer 3' formed on the primer layer 2 in a predetermined pattern after transfer process.

Moreover, the manufacturing method according to the second aspect at least has a transparent base material preparing process (not shown) for preparing the transparent base material 1 on which the primer layer 2 that can maintain fluidity until it hardens is formed on one surface S1, a conductive composition filling process (see FIG. 8(B)). In this process, the indentation 6 shown in FIG. 11 is generated on the upper part of the conductive composition filled into the intaglio part 64 of filling the conductive composition 15 into the intaglio part 64 after scraping the conductive composition adhered in the areas other than the inside of the intaglio part, after coating with the conductive composition 15 (having fluidity in a non-hardened state) that forms the conductive layer 3 after it hardens, a plate shaped or cylindrical plate surface 63 on which the intaglio part 64 is formed in a predetermined pattern, a pressure-bonding process (see FIG. 8(C)) for adhering the primer layer 2 and the conductive composition 15 in the intaglio part 64 without cavities therebetween by pressure-bonding the primer layer 2 on the transparent base material 1 after the transparent base material preparing process and the intaglio part 64 of the plate surface 63 after the conductive composition filling process, a simultaneous hardening process (see FIG. 8(C)) for hardening (non-fluid or solidifying) the primer layer 2 and the conductive composition 15 simultaneously after the pressure-bonding process, and a transfer process (see FIG. 8(D)) of transferring the hardened conductive composition 15 in the intaglio part on to the hardened primer layer 2, by peeling off the transparent base material 1 and the primer layer 2 after the simultaneous hardening process from the plate surface 63, and a conductive composition hardening process (not shown) for forming the conductive layer 3.

In the method of manufacturing the electromagnetic shield material according to the first and second aspects, the conductive composition 15 may also be a conductive composition that can form a conductive layer formed by electroplating after hardening. In that case, in the above-described first aspect, a plating process (see FIG. 8(E)) for electroplating the metal layer 4 on the conductive layer 3 formed in a predetermined pattern on the primer layer 2 may be further included after the conductive composition hardening process. In addition, in the above-described second aspect, a plating process of electroplating the metal layer 4 on the hardened conductive layer 3 formed in a predetermined pattern on the primer layer may be included after the transfer process.

Each process is explained below with reference to the drawings.

(Transparent Base Material Preparing Process)

The transparent base material preparing process is a process of preparing the transparent base material 1, on which the primer layer 2 that can maintain fluidity until being hardened is to be formed on one surface S1. The primer layer 2 is formed by coating the transparent base material 1 with a primer layer resin composition. The explanation of the primer layer resin composition is omitted as discussed above. When the primer layer 2 can be obtained as a solid thermoplastic resin composition film under a room temperature, it may be laminated on the transparent base material 1 instead of the coating. In either case, it is necessary that the primer layer 2 maintains fluidity at the time of the later-discussed pressure-bonding process.

For example, when an ionizing radiation hardening resin composition is used as the primer layer resin composition, it is preferable that only a solvent in the ionizing radiation hardening resin composition is dried and removed under the non-radiation state in which the ionizing radiation is not performed, that the primer layer 2 in the fluid state is formed as a coated film on the transparent base material 1, and that the later-discussed pressure-bonding process is performed under such state. Of course, when the primer layer resin composition is of the so-called non-solvent type, in which the ionizing radiation hardening resin composition used in this process does not include solvent, the drying process during formation of the primer layer 2 is not necessary.

When the solid thermoplastic resin composition under room temperature is used as the primer layer resin composition, the primer layer resin composition may only be in a fluid state by heating during the later-discussed pressure-bonding process, and a heating process of the primer layer 2 may be performed immediately before the pressure-bonding process. The hearing of the primer layer 2 and the pressure-bonding of the primer layer 2 on to the plate surface 63 may be performed at the same time.

Further, for the method for coating the transparent base material 1 with the primer layer, various coating methods may be sued. For example, an appropriate method may be selected from various methods including gravure coating, comma coating, dye coating, roll coating and the like.

The coating method shown in FIG. 9 is an example of a gravure reverse coating, which is a method for coating a surface of a film-shaped transparent base material 1 with the ionizing radiation hardening resin composition for the primer layer by inserting the film-shaped transparent base material 1 that is wound in a roll shape between a gravure roll 51 and a backup roll 52 (also called as platen). In this case, the gravure roll 51 contacts the ionizing radiation hardening resin composition in the ionizing radiation hardening resin composition filling container 53 at a lower part thereof, lifts up the ionizing radiation hardening resin, and coats one surface of the transparent base material 1 with the ionizing radiation hardening resin composition. At this time, excess ionizing radiation hardening resin composition is scraped off by the doctor blade 54. After coating the transparent base material 1 with the ionizing radiation hardening resin composition, the transparent base material 1 is transported through a drying zone and performed with a process of drying the solvent included in the resin composition, if necessary. This drying process is, for example, a process of drying and removing only the solvent in the ionizing hardening resin composition that has been adjusted to viscosity suitable for the coating device and forming the primer layer 2 in fluid state for the subsequent pressure-bonding process. The drying device is not needed when using a non-solvent type ionizing radiation hardening resin composition having viscosity suitable for the coating device. The transparent base material 1 having the primer layer 2 having fluidity is subsequently supplied to the pressure-bonding process. When continuously performing a process of improving the adhesiveness between the transparent base material 1 and the primer layer 2, this process is performed on the transparent base material prior to the application of the primer layer 2.

(Resin Filling Process)

As shown in FIGS. 8(A) and (B), the resin filling process is a process in which, after coating with the conductive composition 15 in the fluid state that can form the conductive layer 3 after hardening, the plate-shape or cylindrical plate surface 63 on which the mesh or stripe-formed intaglio parts 64 in a predetermined pattern, the conductive composition is filled into the intaglio parts by scraping off the conductive composition that adhered in areas other than the inside of the intaglio parts by the doctor blade 65 (depicted on the left upper part of FIG. 8(B)), the wiping roll or the like. In this process, although it is not generally desired, an indentation (see number 105 in FIG. 12) is unavoidably generated on the upper part of the conductive composition 15 filled into the intaglio part 64. Although the detailed cause is unknown, it is presumed that it is because the indentation is generated on the surface of the conductive composition due to a rheological behavior of the conductive composition after scraping the conductive composition outside of the intaglio part using the doctor blade, wiping roll or the like, because the volume of the conductive composition is reduced by volatilization of the solvent when the conductive composition includes a diluent solvent, or because of the combined reaction of both effects. Explanation of the conductive composition 15 is omitted as discussed above.

The combination of the conductive composition with respect to the primer layer resin composition is not particularly limited. The timing of the hardening process for the primer layer resin composition and the timing of hardening process for the conductive composition may differ from each other. However, when the ionizing radiation hardening resin that includes the conductive powder as the conductive composition 15 is used, it is preferable that the primer layer resin composition is also an ionizing radiation hardening resin composition. By such combination, by the pressure-bonding process after the resin filling process and by the ionizing radiation process during the primer layer hardening process, the hardening of the primer layer 2 and the conductive composition 3' can be performed at the same time as in the above-discussed manufacturing method of the second aspect. At this time, because the conductive powder normally has color, when the ionizing radiation is of light or ultraviolet ray, the primer layer 2 and the conductive composition layer 3' can be hardened by using the ultraviolet ray having a proper wavelength for high transmissivity through the conductive powder, or by selecting a combination of a photopolymerization initiator and a light hardening resin to harden a deep parts to which the ionizing radiation is difficult to reach. When an electron ray is used for radiation, it is unnecessary to consider the color of the conductive powder.

Moreover, the coating method shown in FIGS. 9 and 10 are examples of the processes performed prior to pressure-bonding the transparent base material 1 having the primer layer 2 against the intaglio plating roll 62. In particular, a pickup roll 61 contacts the conductive composition 15 in the conductive composition filling container 68 at lower part thereof, lifts up the conductive composition 15 and coats the plate surface 63 of the intaglio plating roll 62 with the conductive composition 15. At this time, the conductive composition 15 is scraped by the doctor blade 65 such that the conductive composition 15 does not cover the areas of the plate surface 63 other than the intaglio parts 64.

(Pressure-Bonding Process)

As shown in FIGS. 8(C) and 10, the pressure-bonding process is a process in which the intaglio part 64 side of the plate surface 63 after the resin filling process and the primer layer 2 side of the transparent base material 1 after the transparent base material preparing process are pressure-bonded against each other to adhere the conductive composition 15 in the intaglio part 64 and the primer layer 2 without a gap therebetween. Because the primer layer 2 has fluidity at this time, the primer layer 2 flows also in the indentation 6 (number 105 in FIG. 12) at the upper part of the conductive composition 15 filled into the intaglio part 64 of the plate surface to fill in the indentation 6, and all of the spaces between the transparent base material 1 and the conductive composition 15 are filled with the primer layer without any cavities therebetween. The pressure-bonding is performed by the nip roll 66, which is forced against the intaglio plating roll 62 by a predetermined pressure. The nip roll 66 has a pressure force adjustment means to adjust the pressing force to any degree depending on the fluidity of the primer layer 2.

When the primer layer 2 is a thermoplastic resin, the nip roll 66 is preferably a heatable roll. In this case, the primer layer 2 becomes softened by the heat pressure-bonding and thus becomes flowable.

In this pressure bonding process, the primer layer 2 flows in the indentation 6 (number 105 in FIG. 12) at the upper part of the conductive composition 15 filled into the intaglio part 64 of the plate surface, and the indentation 6 is filled in. After the pressure-bonding process, the hardening process and the transfer process are performed and the electromagnetic shield material is produced. In the result, the conductive layer pattern 19 of the first-forth formations shown in the above-discussed FIGS. 4-7 is provided.

More specifically, in this pressure-bonding process, through the later-discussed hardening process and the transfer process after the primer component included in the primer layer 2 is mixed into the conductive composition structuring the conductive layer 3, the transfer (transfer printing) of the conductive composition 15 filled into the plate surface to the transparent base material 1 can be performed accurately at a high transfer printing rate. As shown in FIGS. 5 and 6, in the conductive layer pattern 19 that the obtained electromagnetic shield material has, the boundary face 12 between the primer layer 2 and the conductive layer 3 does not become a simple boundary face structure, thereby improving the adhesiveness between the both layers.

Moreover, when the conductive powder is included in the conductive composition, for example, because the boundary face between the primer layer 2 and the conductive composition that is uneven and has a complicated interface shape is pressure-bonded, through the later-discussed hardening process and the transfer process, the transfer (transfer printing) of the conductive composition 15 filled into the plate surface to the transparent base material 1 can be performed accurately at a high transfer printing rate. As shown in FIG. 4, in the conductive layer pattern 19 that the obtained electromagnetic shield material has, the boundary face 12 between the primer layer 2 and the conductive layer 3 that is uneven and has a complicated interface shape are formed, thereby improving the adhesiveness between the both layers.

Furthermore, because the primer layer 2 flows in the indentation 6 (number 105 in FIG. 12) at the upper part of the conductive composition 15 filled into the intaglio part 64 on the plate surface to fill in the indentation, and because the hardening process and the transfer process are performed after the filling in the indentation, the obtained conductive layer pattern 19D becomes a projection pattern structured by the first hill 17 formed of the primer layer 2 and the second hill 18 formed of the conductive composition (conductive layer 3) formed on the hillside of the first hill 17, as shown in FIG. 7.

(Hardening Process)

The hardening process is a process of hardening the primer layer 2 after the pressure-bonding process by the pressure force by the nip roll 66. By performing the hardening process after the pressure-bonding, the primer layer 2 is hardened in a state in which the primer layer 2 and the conductive composition 15 adhere to each other. In particular, when the primer layer resin composition is an ionizing radiation hardening type resin composition, the hardening process is performed by emitting the ionizing radiation in the emitted zone (described as a UV zone in the example shown in FIG. 10). In this case, because the primer layer 2 is sandwiched by the transparent base material 1 and the plate surface 63 and thus this formation do not hard block the hardening due to the oxygen in air, a nitrogen purge device or the like are not always necessary. In addition, similar to the above, the hardening process can be selected depending on the types of the primer layer resin composition and the conductive composition. For example, the hardening process, such as ionizing radiation process or cooling process, may be performed.

Moreover, as discussed above, when both the primer layer resin composition and the conductive composition are ionizing radiation hardening resin, the simultaneous hardening process that performs the ionizing radiation process during the hardening process subsequent to the pressure-bonding process may be performed.

(Transfer Process)

As shown in FIG. 10, the transfer process is a process of transferring the conductive composition 15 in the intaglio part 64 on to the primer layer 2, by peeling off the transparent base material 1 and the hardened the primer layer 2 after the hardening process from the plate surface 63 of the intaglio plating roll 62. Because the primer layer 2 has hardened in the primer layer hardening process prior to this process, by peeling off the primer layer 2 with the transparent base material 1 from the plate surface 63 of the intaglio plating roll 62, the conductive composition 15 that has adhered to the primer layer 2 is separated from the inside of the intaglio part and is almost completely transferred on to the primer layer 2, thereby forming the conductive composition layer 3'. The peeling off is performed by the nip roll 67 provided on the existing side as shown in FIGS. 9 and 10.

In the transfer process, it is not always necessary to harden the conductive composition 15. The conductive composition 15 may be transferred while a solvent is included. Reasons are currently unknown. However, because the primer layer 2 and the conductive composition 15 are closely adhered without cavities and because a part of the primer layer is mixed into the conductive composition layer, and a region in which both the primer layer 2 and the conductive composition 15 are mixed with each other is provided, parts of the primer layer 2 and the conductive composition 15, respectively are entangled in each other. Therefore, it is assume that the adhesive force between the primer layer 2 and the conductive composition 15 have become greater than the adhesive force between the inner wall of the intaglio part 64 of the roll-shaped intaglio plating and the conductive composition 15. In addition, when the conductive composition 15 has not hardened, it is assumed that a part of the primer layer is mixed into the conductive composition layer, which causes the fluidity of the primer layer 2 to change the fluidity of the conductive composition 15, thereby easy removal from the intaglio parts 64.

FIG. 11 is a schematic diagram showing a formation in which the primer layer 2 is filled into the indentation 6 of the conductive composition 15 in the intaglio part 64 and the conductive composition 15 is transferred. As shown in FIG. 11(C), observing the formation of the primer layer 2 and the confirmation of the conductive composition layer 3' after the transfer process, the thickness $T_A$ of the part A on the primer layer 2 in which the conductive composition 3' is transferred is larger than the thickness $T_B$ of the part B in which the conductive composition layer 3' is not transferred. In addition, on the side edges 5, 5' of the part A having a larger thickness, a part of the conductive composition layer 3' moves to the thinner part B side and is formed on the thinner part B near the side edges 5,5'. In this formation, the primer layer 2 having fluidity flows into and is filled into the indentation 6 that is easily formed on the upper part of the conductive composition in the intaglio part 64, by pressure-bonding the primer layer 2 side on the transparent base material 1 on which the primer layer 2 having fluidity has been formed and the intaglio part 64 side of the plate surface 63 after the resin filling process as shown in FIGS. 11(A) and (B). Therefore, as shown in FIG. 11(C), in the post-transfer printing formation, the thickness $T_A$ of the part A on the primer layer 2 in which the conductive composition layer 3' is formed becomes larger than the thickness $T_B$ of the part B in which the conductive composition layer 3' is not formed, and on the side edges 5, 5' of the part A having the larger thickness, the part of the conductive composition layer 3 move to the side of the thinner part B and is formed on the thinner part B near the side edges 5,5'.

In general, the thickness $T_A$ of the primer layer 2 at the part A in which the conductive composition layer 3' is formed thickens towards the center part of the part A. That is, in the horizontally cross-sectional view of the electromagnetic shield pattern part (e.g., see FIG. 3), the cross-sectional shape of the primer layer 2 became so-called a bell shape, such as semi-circular and semi-oval, or an angular shape, such as a triangular shape, trapezoid shape and a pentagonal shape, which has a protrusion shape towards the direction away from the transparent base material 1.

Moreover, the boundary face 12 between the primer layer 2 and the conductive composition layer 3' may be in a formation in which the primer layer 2 and the conductive composition layer 3' are simply physically or chemically adhered with each other as shown in FIGS. 4 and 7, or in a formation in which the material of the both layers are mutually diffused, infiltrated, and dispersed near the boundary face 12 as shown in FIGS. 5 and 6. Because such diffusion, infiltration and dispersion is performed prior to the hardening of the conductive composition and the primer layer 2, the boundary face has higher adhesiveness between the layers than when the conductive composition and the primer layer 2 hardens after they become in such state. Moreover, any of these formations may be achieved based on selection of the materials used for the both layers, selection of manufacturing conditions, and the like.

In the electromagnetic shield material manufactured by the manufacturing method of this invention, because the conductive layer pattern 19 is formed by the above-described boundary face formation, the inter-layer adhesive force is high between the primer layer 2 and the conductive composition layer 3' and the conductive layer 3, such that the conductive composition filled into the plating intaglio part can be transferred (transferred) at the high transfer printing rate of substantially 100%. Furthermore, when a large plating intaglio part having an aspect ratio (depth/opening width) being 2/10 or more is used, the conductive composition filled into the intaglio part can be transferred (transferred) at a transfer printing rate of substantially 100%. To note, in the normal intaglio printing that does not use the primer layer of this invention, the transfer printing of ink under a condition where the aspect ratio exceeds 2/10 is extremely difficult to achieve.

Because the electromagnetic shield material 10 obtained by the manufacturing method of this invention has such formations, there is an effect that problems, such as wire breakage, improper shape, and insufficient adhesiveness based on insufficient transfer of the conductive composition layer 3, do not occur.

After the transfer process, a drying process, a hardening process and the like may be performed if necessary. Moreover, when resistance needs to be further decreased, the electromagnetic shield material 10 is provided to the subsequent plating process. The electromagnetic shield material 10 may be provided to the plating process inline or to a separate plating line after being wound on a roll once.

(Plating Process)

As shown in FIGS. 8(E) and 9, the plating process is a process of electroplating the metal layer 4 on the conductive layer 3 formed on the primer layer 2 in a predetermined pattern (same as the formation pattern of the primer layer 2) after the transfer process. As the metal for plating, copper, silver, gold, nickel or the like may be used. In particular, inexpensive and highly conductive copper is preferable. For a copper plating liquid, a generally marketed plating liquid can be used. Especially, a copper plating liquid, in which uniform platability is improved, can be preferably used. The normal preproceding processes (e.g., degreasing process) are performed for the plating process. However, as discussed above, the electromagnetic shield material 10 may be provided inline as is from the transfer process or may be provided to a separate plating line. After the plating process, the electromagnetic shield material 10 may be wound on a roll after other processes (e.g., blackened processes or anti-rust process of the metal layer 4, or process of forming the protective film 9 as shown in FIG. 2) if needed, or may be cut in a predetermined scale to provide a sheet.

The roll-shaped or sheet-shaped electromagnetic shield material 10 is manufactured as discussed above. As explained above, according to the method of manufacturing the electromagnetic shield of this invention, because the conductive layer 3 can be transferred to the primer layer 2 without cavities between the primer layer 2 and the conductive layer 3, the electromagnetic shield material can be manufactured without problems, such as wire breakage, improper shape, and low adhesiveness based on insufficient transfer of the conductive composition layer 3. In addition, because the transfer can be performed at a high transfer printing rate, the conductive layer 3 can be made thick, thereby improved electromagnetic shield characteristics.

For example, by using a plate including intaglio parts having a depth of 20 µm, a conductive layer pattern having a thickness of approximately 20 µm, which is substantially the same as the shape of the plate, can be formed. Such an effect is out of consideration especially in the case of the intaglio (gravure) printing for the conductive composition that includes a large amount of the conductive powder. In addition, in the method of manufacturing the electromagnetic shield material of this invention, the conductive composition includes a solvent, and the transfer can be performed at a high transfer printing rate even when a separate drying is necessary, without using a binder agent that hardens in short time. Moreover, in the case where the conductive composition is of a UV hardening type, the transfer can be performed at a high transfer printing rate even when pigment is included in the conductive powder and is metallic conductive powder at a high concentration, and when the conductive powder blocks ultraviolet rays such that the ultraviolet rays do not reach the inside of the intaglio plating.

Moreover, such obtained electromagnetic shield material 10 may be used as an optical filter by providing an optical adjustment layer to the electromagnetic shield material 10. Although it is not discussed in detail here, as the optical adjustment layer, a well-known optical adjustment layer may be used. For example, a color adjustment layer, a near-infrared absorption layer a neon light absorption layer, a ultraviolet ray absorption layer, an anti-reflection layer, and an anti-glare layer may be used. Further, in the electromagnetic shield material 10, in addition to the optical adjustment layer, a functional layer having other various functions may be laminated. As such a functional layer, a hard-coat layer, an antifouling layer, an antistatic layer, an antibacterial, an antimold (mold-protecting layer), a shock absorption layer or the like may be used.

These the optical adjustment layer and/or functional layer may be formed based on an appropriately formation selected among from (1) a formation in which a layer independently formed in a sheet or plate shape in advance is adhered on the electromagnetic shield material of this invention via an adhesive layer (including a so-called tackiness agent layer), (2) a formation formed by a so-called transfer printing method in which the layer formed on a mold releasing base material sheet in advance is adhered on the electromagnetic shield material of this invention via an adhesive layer provided appropriately therebetween and in which only the mold releasing base material sheet is peeled off and removed thereafter, (3) a formation formed by coating the electromagnetic shield material of this invention with a composition in which a material to achieve the above-described various functions is added to the appropriate resin binder agent, (4) a formation, which is another formation of the above (3), and in which the adhesive layer and the above-described various layers are shared by adding the material for achieving the various functions in the adhesive layer at the time of coating the electromagnetic shield material with the adhesive layer for adhering to a desired adhered, and (5) a formation in which the two or more of the above-described formations (1)-(4) are combined. Here, the optical adjustment layer and/or the functional layer may exist on one or both of the sides or of the electromagnetic shield material. The electromagnetic shield material 10 or an optical filter having the electromagnetic shield material 10 may be installed on the front surface of various image display devices. For example, by installing to a plasma display panel, a plasma display device is provided.

[Printed Matter and Manufacturing Method Thereof]

Next, a printed matter and a method for manufacturing the printed matter according to this invention are explained. The background to accomplish the printed matter and a method for manufacturing the printed matter of this invention are as follows.

For the inks used to form a print pattern in which a certain degree of thickness or measurement accuracy is required, in particular, for the inks in which a material for achieving a specific function is added, an ink provided with thixotropy or high viscosity is often used in general. In addition, for many cases, by adding various functions achieving materials itself, the thixotropy or viscosity are often inevitably provided to the ink. Then, by printing using the ink with high viscosity or thixotropy by a method, such as screen printing, occurrence of problems of the improper pattern or thickness caused by the in flowing after being printed on the base material are prevented. However, in the screen printing, a print with good measurement accuracy using a roll-to-roll method is difficult, and there is a problem that the measurement accuracy worsens as a result of deformation of the peripheral portions of the plate due to enlargement of the plate by pulling the plate with a strong force. In addition, when printing an ink with high viscosity in a fine pattern using a plate having intaglio parts, such as gravure printing, although the printing is possible, there is a problem that a stable pattern is not formed because the transferability of the ink to the base material is poor due to the thixotropy or high viscosity, and due to frequent missing of ink. Further, when using a plate with deep intaglio parts, in particular, when using a plate having intaglio parts with depth with respect to the width of the intaglio parts (high aspect ratio), there is a problem that the ink in the intaglio parts cannot be transferred onto the base material at high transferability. In addition, the problems are similar to the problem that occurs at the time of manufacturing the above-described electromagnetic shield (see the above-described "Problem to be Solved by the Invention" section).

The above-described method of manufacturing the printed matter according to this invention solves such problems. It was discovered that, when printing the ink with high viscosity or thixotropy (hereinafter also referred to as paste) onto the transparent base material using an intaglio printing device, such as gravure printing, by coating in advance the base material with the primer layer composition that can be solidified in a short amount of time and has fluidity prior to solidifying, and by solidifying the primer layer while a surface of the applied primer layer is stack facing a surface of the intaglio plate into which the paste is filled, even the paste with high viscosity or thixoropy can be transferred on the base material substantially in its entirety, and further, the ink can be transferred at high transferability even with a plate with deep intaglio parts. This invention is completed based on such discovery. In the method of manufacturing the electromagnetic shield material, the transferred paste is the conductive composition. However, the method of manufacturing the printed matter of this invention as discussed in detail below has a feature to use various functional ink compositions as the transferred paste. As a result, the printed matter obtained by the manufacturing method according to this invention may be a printed matter that can be appropriately used for various purposes. In addition, the manufacturing method according to this invention may be appropriately used on one side or both sides of the base material to be printed. When using for both sides, each side may have different ink, primer, pattern, or function.

(Method of Manufacturing Printed Matter)

The printed matter and its manufacturing method of this invention is fundamentally the same as the electromagnetic shield material and its manufacturing method of this invention as discussed above. The "printed matter" and "functional ink layer" in the "printed matter and its manufacturing method" includes the "electromagnetic shield material" and "conductive layer" in the "electromagnetic shield material and its manufacturing method," respectively. Therefore, unless specifically stated, by replacing the "electromagnetic shield material" with the "printed matter," the "conductive layer" with the "functional ink layer," the "conductive composition" with the "functional ink composition," and the "transparent base material" with the "base material," the detailed explanation of the electromagnetic shield material and its manufacturing method of this invention can be used as the detailed explanation of the printed matter and its manufacturing method of this invention. Below, only the features associated with the printed matter and its manufacturing method of this invention are explained. The other explanations are similar to the explanations for the above-discussed electromagnetic shield material and its manufacturing method of this invention, and thus their explanations are omitted.

Figure 13:
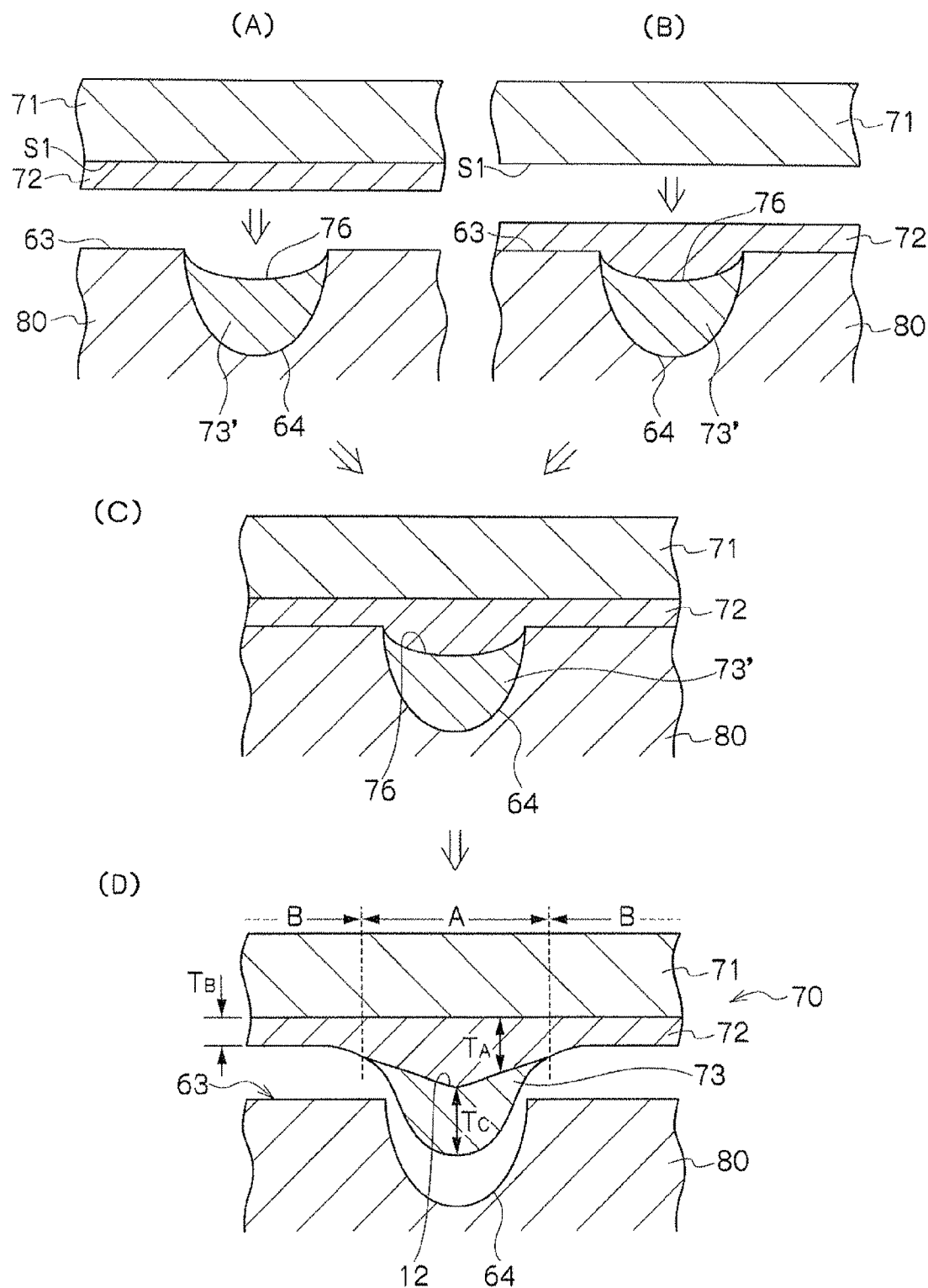
FIG. 13 is a schematic perspective view showing an embodiment of a printed matter according to this invention.

FIG. 13 is an explanatory diagram for the method of manufacturing the printed matter 70 of this invention. As shown in FIG. 13, the method of manufacturing the printed matter 70 of this invention has a feature to pressure-bond the plate surface 63 having a intaglio part 64 in a predetermined pattern filled with an un-hardened functional ink composition 73' and one surface S1 of a base material 71 subject to the transfer printing of the functional ink composition 73', via a primer layer 72 that can maintain fluidity state until it hardens, to harden at least the primer layer 72 while maintaining the pressure-bonding, and then to peel off the base material 71 and the primer layer 72 from the plate surface 63, to transfer the functional ink composition 73' to the surface S1 of the base material 71 in the predetermined pattern via the primer layer 72.

More specifically, FIG. 13(A) shows a process to pressure-bond the side of the base material 71, on which the primer layer 72 that can maintain fluidity until it hardens is provided, on the plate surface 63 in which the intaglio part 64 is filled with the un-hardened functional ink composition 73'. In addition, FIG. 13(B) is a process to fill the intaglio part 64 with the unhardened functional ink composition 73', to provide the primer layer 2 that can maintain fluidity until it hardens such that the entire plate surface 63 including the intaglio part 64 is covered, and to pressure-bond the base material 71 on the primer layer 2. That is, these two processes indicate a process to pressure-bond the plate surface 63 having the intaglio part 64 in a predetermined pattern in which the unhardened functional ink composition 73' is filed, and the surface S1 of the base material that is the subject for transfer printing of the functional ink composition 73', via the primer layer 72 that can maintain fluidity until it hardens. The method of manufacturing the printed matter of this invention may adapt either one of these two processes.

Moreover, in FIGS. 13(A) and (B), the functional ink composition 73' does not exist at all or substantially does not exist on the plate surface other than the intaglio part 64. The term "does not substantially exist" here means that, in case where the functional ink composition 73 exists on the plate surface 63 (i.e., top surface) in the area other than the intaglio part 64 when filling the functional ink composition 73' into the intaglio part 64 using a doctor blade, wiping roll or the like, existence of the functional ink composition 73' in the pattern non-formation part B (part in which the functional ink pattern is not formed) is allowed at a level with which the finally obtained printed matter 70 shown in FIG. 3(D) does not lose its original purpose. Such allowed level includes, for example, the thickness of the functional ink layer 73 structured from the functional ink composition 73', a coverage rate of the functional ink composition 73' in the pattern non-formation part B, and the features such as the transmissivity of the pattern non-formation part B. Such thickness, coverage rate and features may differ depending on the type of the printed matter forming the functional ink layer 73. In any case, the functional ink composition 73' on the plate surface 63 is scraped off such that the functional ink composition 73' does not exist at all or does not substantially exist in the pattern non-formation part B.

FIG. 13(C) is a process to pressure-bond the base material 71 and the plate surface 63 via the primer layer 72 that can maintain fluidity until it hardens. After the process route using the process shown in FIG. 13(A), an "indentation 76 of the functional ink composition 73'" occurs in the intaglio part 64 after scraping off the functional ink composition 73' from the plate surface 63 using the doctor blade, wiping roll or the like. The indentation 76 is filled with the primary layer 72 having the fluidity until it hardens, at the time of pressure-bonding. In the process route using the process shown in FIG. 13(B), the primary layer 72 is filled into the indentation 76 when providing the primer layer on the plate surface 63. Therefore, in the process shown in FIG. 13(C), the base material 71 and the plate surface 63 are pressure-bonded with the primer layer 72 therebetween, and as a result, the primer layer that has fluidity until it hardens is filled into the indentation 76 of the functional ink composition 73'. Therefore, in this invention, at least the primer layer 72 hardens while maintaining the pressure-bonding. The phrase "at least" includes a case in which only the primer layer 72 is hardened and the functional ink composition 73' is not hardened, and a case that the primer layer 72 and the functional ink composition 73' are hardened at the same time. It is preferable that the hardening process is performed by ionizing radiation or cooling (similar to the above-discussed "method of manufacturing electromagnetic shield material").

FIG. 13(D) is a formation in which the base material 71 and the primer layer 72 are subsequently peeled off from the plate surface 63. In the obtained printed matter 70, the functional ink composition 73' was transferred on the surface S1 of the base material 71 in a predetermined pattern via the primer layer. Here, FIGS. 13(C) and (D) show a shape close to the observation result of the actual cross section. The reason why the shape of the primer layer 72 and the functional ink layer 73 shown in FIG. 13(D) does not completely match the shape of the primer layer 72 and the functional ink composition 73' shown in FIG. 13(C) is because the structural material of both layers is the resin material having plastic property. In addition, the functional ink layer 73 may be performed with the hardening process in the process of FIG. 13(C) or after the peeling process of FIG. 13(D).

Figure 14:
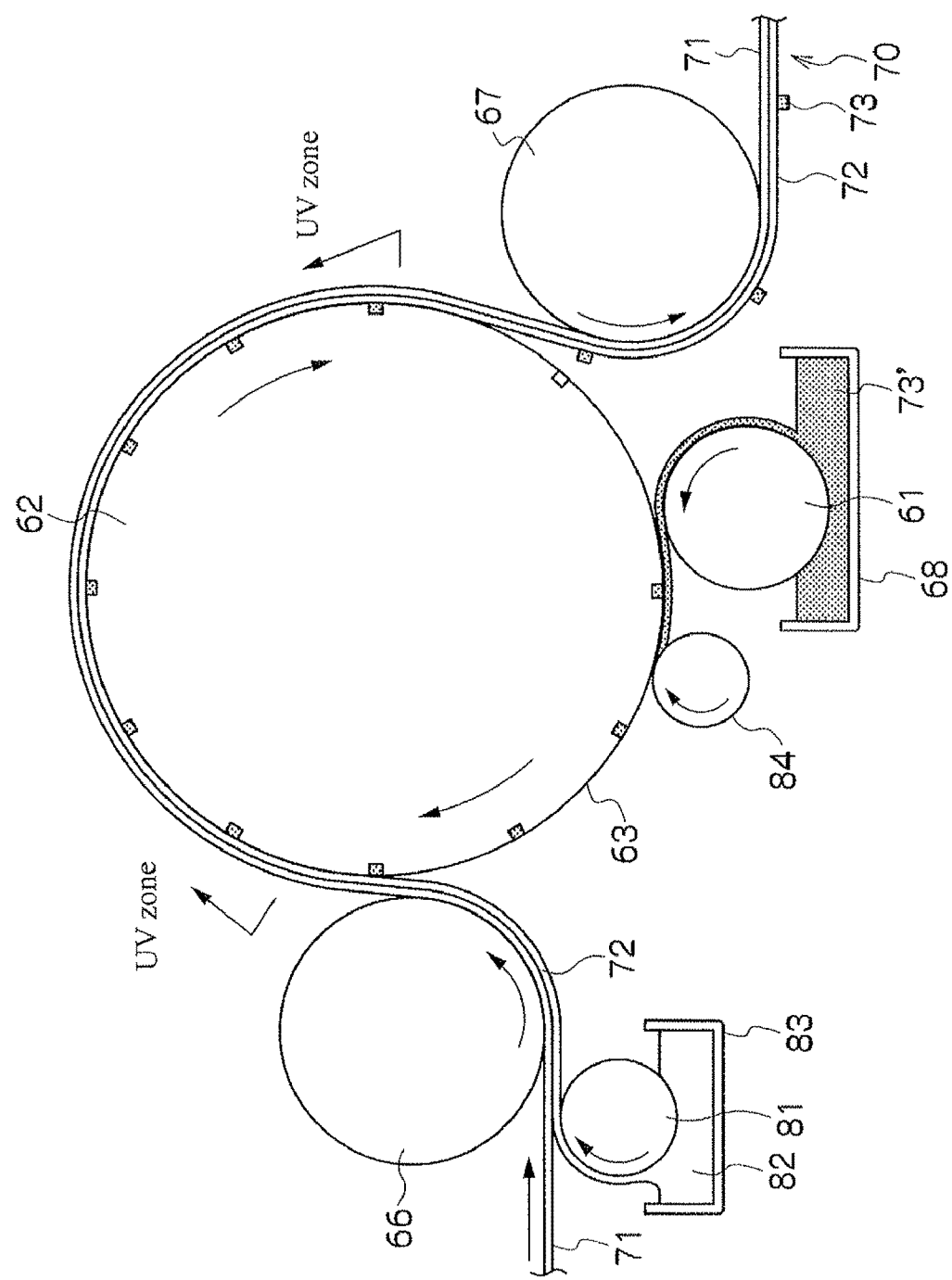
FIG. 14 is a schematic structural diagram showing an example of an aspect in which a plate surface having intaglio parts in a predetermined pattern filled with non-hardening function ink composition is pressure-bonded against a surface of the base material that is the subject for transfer of the functional ink composition, via a resin composition for the primer layer that can maintain fluidity until being hardened.

FIG. 14 is a schematic structural diagram showing an example of the method of manufacturing the printed matter and the manufacturing device according to this invention.

Figure 15:
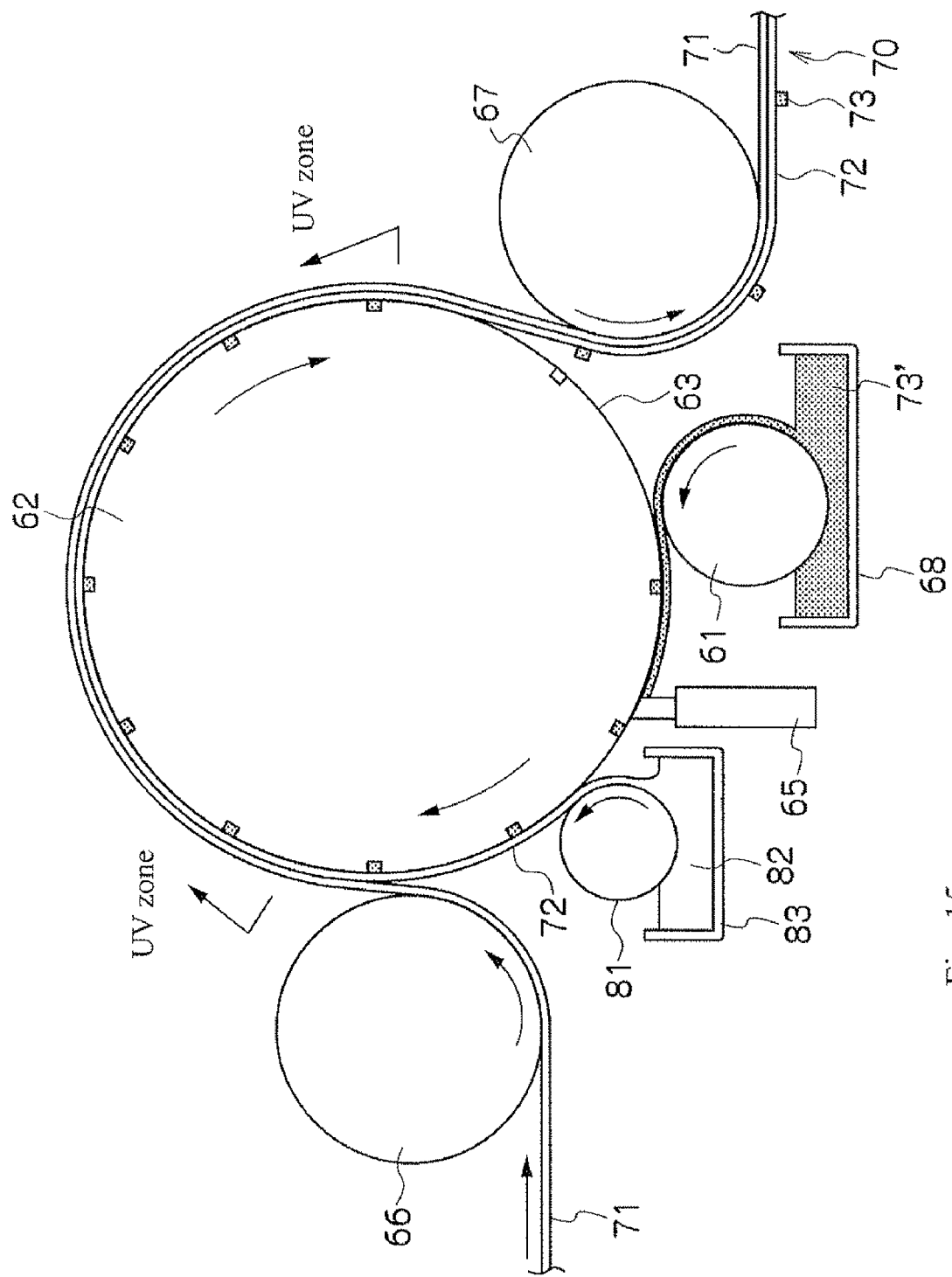
FIG. 15 is a schematic structural diagram showing another example of an aspect similar to that shown in FIG. 14.

FIG. 15 is a schematic structural diagram showing another example of the method of manufacturing the printed matter and the manufacturing device according to this invention. These are schematic structural diagrams similar to the method and device shown in FIG. 10, which shows an example of the method of manufacturing the electromagnetic shield material and the manufacturing device. In the below explanation, the manufacturing method and the manufacturing device shown in FIGS. 14 and 15 may be referred to a "manufacturing method." In addition, in FIGS. 14 and 15, a drum type plate is used. However, it is not necessary to use the dram type plate, and it may be a flat plate.

Moreover, with the flat plate, although a continuous manufacturing, such as the roll-to-roll, shown in FIGS. 14 and 15, can be performed, it is possible to coat a fixed flat plate with the functional ink composition 73', to scrape off by the doctor blade or the like, and to pressure-bond the sheet base material 71, for example, after coating the sheet base material 71 with the primer layer resin composition 82. Alternatively, it is possible to pressure-bond thereon a sheet base material 71 provided with the primer layer 72, and to transfer the functional ink layer 73 on the base material side by peeling off the base material 71 and the primer layer 72. By repeating these processes, it is possible to continuously manufacture the sheet printed matter having at least the primer layer 72 and the functional ink layer 73 on the base material 71.

In the manufacturing method shown in FIG. 14, a surface of the supplied base material 71 is first coated with the primer layer 72. This coating process is performed by making pickup roll 81 contact the primer layer resin composition 82 in the container 83 at low part thereof, lifting up the primer layer resin composition 82 by t pickup roll 81 and coating the base material 71 with the primer layer composition 82. For the base material 71 on which the primer layer 72 is applied is pressure-bonded, the base material surface on the primer layer 72 side is pressure-bonded to the plate surface 63 using the nip roll 66. On the other hand, the plate surface 63 subject to the pressure-bonding is coated with the functional ink composition 73' The coating process at this time is performed by making the pickup roll 61 contact the functional ink composition 73' in the container 68 at lower part thereof, lifting up the functional ink composition 73' and coating the plate surface 63. In FIG. 14, the functional ink composition 73' is scraped off by a wiping roll 84 to prevent the functional ink composition 73' from remaining on the part of the plate surface 63 other than the intaglio part 64.

The pressure-bonding is performed by pressing and bonding the base material surface on the primer layer side 72 against the plate surface 63 at a predetermined pressure by the nip roll 66. By this pressure-bonding, the functional ink composition 73' in the intaglio part 64 and the primer layer 72 can be adhered without cavities therebetween. Because the primer layer 72 has not been hardened at this time and has fluidity, the primer layer resin composition is filled into the indentation 76 shown in FIG. 13(A), and the space between the base material 71 and the functional ink composition 73' is entirely filled with the primer layer 72. The nip roll 66 is the same as that discussed in the above method of manufacturing the electromagnetic shield material of this invention and its explanations.

After the pressure-bonding process by the nip roll 66 shown in FIG. 14, similar to the case of the method of manufacturing the electromagnetic shield material, by adhering the primer layer 2 and the functional ink composition 73' without cavities therebetween, and by going through the subsequent hardening process and the transfer process, the transfer (transfer printing) of the functional ink composition 73' filled into the plate surface onto the base material 71 can be performed accurately at a high transfer printing rate. In the functional ink pattern on the obtained printed matter 70, the boundary face between the primer layer 72 and the functional ink layer 73 does not form a simple boundary structure as shown in FIGS. 4-7 for the electromagnetic shield material and in the printed matter 70 shown in FIG. 13(D), thereby increasing the adhesiveness of the both layers.

The hardening process and the transfer process, as well as the drying process, hardening process, plating process and the like performed subsequently as needed are similar to the case of the method of manufacturing the electromagnetic shield material. In addition, the thickness of the primer layer 72, the cross-sectional shape of the functional ink layer 73 obtained in a predetermined pattern, the transfer printing rate, the aspect ratio, and the like are similar to the cases shown in FIGS. 4-7 for the above-discussed electromagnetic shield material according to this invention. Therefore, their explanations are omitted.

On the other hand, the processes up to the pressure-bonding process in the manufacturing method shown in FIG. 15 are different from those in the manufacturing method shown in FIG. 14. That is, first the base material 71 is supplied so as to be pressure-bonded onto the plate surface 63 by the nip roll 66. On the plate surface 63 onto which the base material 71 is pressure-bonded, first the functional ink composition 73' is coated, and then the primer layer 72 is coated and formed. The coating process of the functional ink composition 73' is performed by making the pickup roll 61 contact the functional ink composition 73' in the container 68 at lower part thereof, lifting up the functional ink composition 73', and coating the plate surface 63 with the functional ink composition 73'. Next, the functional ink composition 73' is scraped off by the doctor blade 65 so that the functional ink composition 73' does not remain on the plate surface 63 other than the intaglio part 64. Moreover, similar to the coating process of the primer layer 72, the coating process is performed by making the pickup roll 81 contact the primer layer resin composition 82 in the container 83 at lower part thereof, lifting up the primer layer resin composition 82 by the pickup roll 81, and coating at a predetermined thickness with the primer layer resin composition 82, the plate surface 63 on which the functional ink composition 73' is filled into the intaglio part 64. Because the primer layer resin composition has not hardened and has fluidity, the primer layer resin composition is filled into the indentation 76 without cavities as shown in FIG. 13(B).

The pressure-bonding is performed by making the base material 71 adhere to the plate surface 63 at a predetermined force. By this pressure-bonding, the base material 71 adheres onto the primer layer 72. Steps after the pressure-bonding process, and the other structures, such as the nip roll 66, are the same as those explained in FIG. 14. Therefore, their detailed explanations are omitted. After the pressure-bonding process using the nip roll 66 shown in FIG. 15, by adhering the primer layer 72 and the functional ink composition 73' without cavities therebetween, and by subsequently going through the hardening processes and the transfer process, the transfer (transfer printing) of the functional ink composition 73' filled into the plate surface onto the base material 71 is accurately performed with a high transfer printing rate. For the functional ink pattern that the obtained printed matter 70 has, as shown in FIGS. 4-7 for the electromagnetic shield material and the printed matter 70 shown in FIG. 13(D), the boundary face 12 between the primer layer 72 and the functional ink 73 does not have a simple boundary structure, thereby improving the adhesiveness of the both layers.

As described above, according to the method of manufacturing the printed matter 70 of this invention, because the plate surface 63 having the intaglio part 64 in a predetermined pattern into which the unhardened functional ink composition 73' is filled, and the surface S1 of the base material 71 subject to the transfer of the functional ink composition 73, are pressure-bonded via the primer layer 72 that maintains fluidity until it hardens, the primary layer 72 having fluidity is filled into the indentation 76 that easily occurs on the upper part of the functional ink composition 73' in the intaglio part 64. As a result, because the primer layer 72 adheres to the functional ink composition 73' without cavities in the indentation 76, the functional ink composition 73' in the intaglio part 64 can be transferred accurately without a part of the functional ink composition 73 failing to be transferred on the base material 71 side. Therefore, the printed matter 70 can be manufactured without problems, such as wire breakage, improper shape, and low adhesiveness based on transfer of the functional ink composition 73'.

Furthermore, according to the method of manufacturing the printed matter according to this invention, the cross-sectional shape of the functional ink layer 73 after the transfer reproduces relatively well the shape of the intaglio part on the intaglio plate. For example, with a plate having an intaglio plating depth of 20 μm, a functional ink layer pattern having a thickness close to approximately 20 μm can be formed, although there is a volume reduction of the functional ink layer 73 after the transfer due to drying. This phenomenon cannot be considered in the conventional intaglio (gravure) printing.

A method of coating a base material with an ultraviolet hardening resin and hardening the resin in the intaglio part to the intaglio plate by ultraviolet while laminating to the intaglio plate, to shape in the shape of the intaglio plate, has used conventionally. However, in the manufacturing method according to this invention, the functional ink composition 73 includes a solvent, and there is no binder for solidifying in a short time. Even if a separate drying is needed, the functional ink composition 73 can be transferred with an excellent transfer printing rate. In addition, in case of hardening by ultraviolet rays or the like, even if the additive included in the functional ink composition 73' is metal powder or the like having a high rate of content, and even if the metal powder blocks the ultraviolet rays thereby preventing the ultraviolet rays from reaching to the inside of the intaglio part of the intaglio plate, the functional ink composition 73' can be transferred at a high transfer printing rate. Although a clear reason for such improvement in the transferability has not been found, according to the result of studying experiments, it was confirmed that the boundary face between the functional ink layer 73 and the primer layer 72 after the transfer is not clearly separated in two layers, is uneven and has a complicated interface shape and parts of these layers are dissolved in another layer, respectively as discussed above, by dyeing and observing the primer layer and the functional ink layer 73 under a TEM analysis of the cross section.

In addition, by SIMS (Secondary Ion Mass Spectrometry), (1) a surface of the functional ink layer pattern to which the functional ink composition 73' is transferred, (2) a surface of the primer layer at a part in which the functional ink composition 73' is not transferred (opening part or pattern non-formation part B), (3) a surface of a coated film in which the functional ink composition 73' is entirely applied on the base material 71 and dried, and (4) a surface of an coated film in which the primer layer 72 is entirely applied on the base material 71 and solidified, were analyzed. As a result, fragments were detected in the above (1) and (2), which indicate that the component of the primer layer 72 was dispersed in the functional ink composition 73'. From this condition, it is assumed that mutual solution occurred at the boundary area and/or the boundary jumbled when contacting the primer layer 72 having fluidity to the functional ink composition 73'. Further, it is assumed that when the primer layer 72 is solidified at this state, phenomenon, such as increasing viscosity of the functional ink composition 73' or turning the functional ink composition 73' into gels, occur at a region from the boundary part in the direction of the functional ink composition 73', thereby allowing the functional ink composition 73' to be drawn out.

Moreover, it is possible that a part of the components structuring the primer layer 72 having fluidity is mixed with the functional ink composition 73', and that the viscosity of the functional ink composition 73' is generally increased when solidifying the primer layer 72. In any case, by contacting the primer layer 72 to the functional ink composition 73' and peeling off the base material after solidifying at least the primer layer 72, it was possible to transfer the functional ink composition 73' by substantially 100% despite the fact that the functional ink composition 73' was not completely solidified.

(Printed Matter)

Next, the printed matter according to this invention is explained. The printed matter 70 of this invention can be obtained by the above-described manufacturing method. The printed matter may be one manufactured by pressure-bonding the plate surface 63 having the intaglio part 64 in a predetermined pattern into which the unhardened functional ink composition 73' is filled, and one surface S1 of the base material 71 subject to the transfer of the functional ink composition 73', via the primer layer 72 that can maintain fluidity until it hardens, by hardening at least the primer layer 72 while maintaining the pressure-bonding, and by peeling off the base material 71 and the primer layer 72 from the plate surface 63 thereafter. However, a method other than the preferred embodiment shown in FIGS. 14 and 15 that uses a drum type plate may be used.

As shown in FIG. 13(D), the obtained printed matter 70 of this invention has a formation basically similar to the electromagnetic shield material according to this invention as shown in FIGS. 1-7. That is, the printed matter 70 has the base material 71, the primer layer 72 formed on the base material 71, and the functional ink layer 73 formed on the primer layer 72 in a predetermined pattern, and has a feature that the thickness $T_A$ of the primer layer at the pattern formation part A in which the functional ink layer 72 is formed in a predetermined pattern is larger than the thickness $T_B$ of the primer layer 72 at the pattern non-formation part B in which the functional ink layer 73 is not formed in a predetermined pattern.

With the printed matter 70 of this invention formed of the above structures, on the primer layer formed on the base material 71, the thickness TA of the primer layer 72 at the pattern formation part A in which the functional ink layer 73 is formed in a predetermined pattern is larger than the thickness $T_B$ of the primer layer 72 at the pattern non-formation part B in which the functional ink layer 73 is not formed in the predetermined pattern. Therefore, when manufacturing the printed matter 70 of this invention using the intaglio plate 80, 62 as shown in FIGS. 13-15, the primer layer 72 is provided so as to fill in the indentation 76 formed after scraping off the functional ink composition 73'. The primary layer 72 of such formation is formed as discussed above is formed by filling in the indentation 76 on the upper part of the functional ink composition 73' in the intaglio part 64 of the plate after scraping off by the doctor blade, wiping roll or the like during the manufacture of the printed matter 70. As a result, because the primary layer 72 adheres to the functional ink composition 73' without cavities therebetween, the printed matter 70 is manufactured without problems, such as wire breakage or lack of wire due to insufficient transfer of the functional ink composition 73', improper shape, low adhesiveness, and the like. In addition, according to the printed matter of this invention, the transfer printing ability (also known as transferability) of the functional ink composition 73' can be improved, thereby allowing the thickness $T_C$ of the functional ink composition 73 after the transfer can be made thick compared to the method that uses the normal intaglio plating, such as gravure printing. Therefore, by making the functional ink layer pattern thick, there is an effect that a desired function can be secured to the obtained printed matter 70.

In the printed matter 70 of this invention, similar to the cross sectional formations of the electromagnetic shield material of this invention, the boundary part 12 of the primer layer 72 and the functional ink layer 73 at the pattern formation part A may have any one or two or more cross sectional formations of (a) a cross sectional formation in which the component structuring the primer layer 72 and the component structuring the functional ink layer 72 are mixed (see FIG. 5), (b) a cross sectional formation in which the primer layer 72 and the functional ink layer 73 are uneven and has a complicated interface shape (see FIG. 4), and (c) a cross sectional formation in which the component included in the primer layer 72 exists in the functional ink composition 3' structuring the functional ink layer 73 (see FIG. 6). According to the inventions of (a)-(c), because the boundary face 12 between the primer layer 72 and the functional ink layer 73 is not a simple boundary face structure, the adhesiveness of both layers 72, 73 has improved, and at the time of manufacturing this printed matter 70, the transfer (transfer printing) of the functional ink composition 73' filled into the plate surface to the base material 71 was performed accurately at a high transfer printing rate.

Moreover, similar to the cross sectional formation of the above-discussed electromagnetic shield material of this invention shown in FIG. 7, in the printed matter 70 of this invention, the pattern formation part A may have a protruding cross-sectional formation structured by the first hill 17 formed by the primer layer 72 and the second hill 18 formed by the functional ink layer 73 formed from and above the hillside of the first hill 17. According to this invention, because the pattern formation part A has the protruding cross-sectional formation structured by the first hill 17 and the second hill 18, the functional ink composition 73' structuring the second hill 18 is difficult to fall from the primer layer 72 structuring the first hill 17, and at the time of manufacturing this printed matter 70, the transfer (transfer printing) of the functional ink composition 73' filled into the plate surface to the base material 71 was performed accurately at a high transfer printing rate (see FIG. 13).

The respective structure of the base material 71, the primer layer 72 and the functional ink layer 73 (including the functional ink composition 73') that are the structuring elements of such printed matter, and the structure of the metal layer provided additionally as needed, include the structure described for the above electromagnetic shield material, and those appropriate for the use for the printed matter 70 may further be included. Therefore, the printed matter 70 of this invention can adopt the structure of the above electromagnetic shield material according to this invention as is. The below explanation focuses additional structures. When indicating the structure of the electromagnetic shield material 10 of this invention and when indicating the structure of the printed matter 70 explained here are explained as distinguished by the reference numbers.

For the base material 71, the any base material that is similar to the base 1 structuring the above-discussed electromagnetic shield material may be used. When using for the purpose that does not require light transmissivity, the base need not be transparent, and various base materials including paper base materials and the like may be used. For example, paper such as wood-free paper, tissue paper, linter paper, parchment paper, glassine paper, Japanese paper, titanium paper, and synthetic resin fiber, woven fiber such as fabric cloth and non woven fabric cloth formed by silk, cotton, hemp, various synthetic resin fabric, glass fiber or the like, plate or Tsu-Ki-plate (plywood having a wood-grain thin plate) formed by lumber such as cedar, Japanese cypress, pine, and lauan, foil or plate made of metal such as aluminum, tin, copper and iron, ceramics such as earthenware and china, or a laminated material on which two or more of these base materials are laminated, may be used. A resin base material that includes pigment or dye may be used. For such base material 71, it is preferable that various adhesive processes are performed in order to allow easy adhesive to the primer layer 72, depending on the characteristics of the base material used. The thickness of the base material may also be selected arbitrarily depending on the purpose, material and the like. In general, the thickness is approximately 8 μm-10000 μm.

In addition, as discussed above, when the degree of adhesive force F1-F3 particularly affects the transferability, it is preferable that various adhesive-promoting layer is provided on the surface of the base material 71 so that the adhesive force F3 between the base material 71 and the primer layer 72 becomes larger than the adhesive force F1 between the intaglio part of the plate and the functional ink composition 73' or that an adhesive improvement process, such as adhesive-promoting process including a corona discharge process, a plasma process, and a flame process, or a surface roughing process, is processed.

For the primer layer 72, any layer that uses the primer layer resin composition similar to the primer layer 2 structuring the above-discussed electromagnetic shield material may be used. In addition, such primer layer 72 may be colored by including pigment or dye from a viewpoint of providing designs and aesthetic characteristics, display and identification functions by color, and advertisement effects. In addition, because the primer layer 72 is provided on the entire surface of the base material 71 including a part in which the functional ink layer 73 is not provided in a predetermined pattern, by adding to the primer layer 72 an ultraviolet absorbent, an antibacterial agent, a fungicide, an antistatic agent, an antifoulant, a water resistant or water repellent agent, for example, functions such as ultraviolet absorbing functions, antibacterial functions, fungicide functions, antistatic functions, antifouling functions, water resistant or water repellent functions, may be provided.

As the additive to be contained in the primer layer 72 to causes such functions, for example, benzotriazole compound, benzophenone compound, and molecule zinc oxide may be used as the ultraviolet absorber. Further, for example, antibacterial zeolite particle, in which ion-replaceable ions of zeolite is replaced with ions of silver, copper, zinc, tin, lead, mercury, ammonium and the like, sulfa agent such as p-aminobenzenesulfonamide, and dithiocarbamate such as dimethyl dithiocarbamate, may be used as the antibacterial agent. As the anti-mold agent, for example, trimethoxysilyl propyloctadecylsilanmoniumchloride, 10,10'-oxybisphenoxyarsine, 2-(4-thiazolyl)-benzimidazole, and bis(2-pyridylthio-1-oxide)zinc may be used. As antistatic agent, for example, anion surface-active agent, cation surface-active agent, dipolar surface-active agent, and ITO (indium tin oxide) particles may be used. As the antifoulant, for example, fluorine resin and silicon resin may be used. As the water-proof or water-repellent agent, for example fluorine resin, silicon resin and the like may be used. In addition, even when the primer layer 72 is provided with such functions, similar to the primer layer 2 structuring the above electronic shield material, the primer layer 72 needs to be of an ionizing radiation hardening resin, a thermoplastic resin or heat hardening resin that has a certain level of fluidity and can change from the fluid state to a solid state by the hardening process.

The functional ink layer 73 may basically have the same structure as the above conductive layer 3. That is, the functional ink composition 73' is not limited, as long as the functional ink composition 73' has fluidity when filling in the intaglio part of the plate, forms a predetermined pattern and develops the desired function after being hardened, and various materials and shapes may be used as the functional ink composition 73'. Moreover, even when the functional ink composition 73' is an ink having high viscosity at a level used for screen printing, the functional ink composition 73' can be transferred at a transfer printing rate of or very close to 100% without causing conventional problems when the functional ink composition 73' is transferred by the manufacturing method according to this invention. Such viscosity may be in a range of 100 mPa·s or more and 1000000 mPa·s or less.

The specification function that the functional ink layer 73 has is one or more functions selected from conductive body characteristics, resistive body (setting a electric resistance value of a conductive body at a desired high value) characteristics, super conductor characteristics, magnetic body characteristics, dielectric body characteristics (or insulator characteristics), catalyst characteristics, light refraction characteristics, optical characteristics, fluorescence substance characteristics (or phosphorimetic body characteristics), coloring characteristics, design characteristics, anti-abrasion characteristics, polishing functions, radiation blocking characteristics, and elastic characterizes. The printed matter 70 according to this invention preferably has at least such functions. These functions may be the characteristics of the resin composition itself, may be based on the characteristics of an additive contained in the resin composition, or may be developed by the synergic action of the resin composition and the additive. The additive may be a single additive that has multiple functions or a composition of multiple additives may provide one or more functions.

More specifically, the functional ink composition 73' to develop the conductive characteristics may be a composition that includes a material similar to an exemplary composition of the conductive composition for the above-described electromagnetic shield material. The functional ink composition 73' to improve the resistive body characteristics may be a composition that includes a material to develop the conductive characteristics at a ratio so as to become a desired electric resistance value. The functional ink composition 73' to develop the super conductor characteristics may be a composition that includes particles of composite oxide super conductive body, such as yttrium-barium-copper-oxygen composite oxide, lanthanum-barium-copper-oxygen composite oxide, and bismuth-strontium-calcium-copper-oxygen composite oxide.

Depending on a use, the functional ink composition 73' to develop the magnetic body characteristics may be selected from any of soft magnetic body or hard magnetic body, high permeability magnetic body or low permeability magnetic body, ferromagnetic body or weak magnetic body, and paramagnetic body or diamagnetic body. As specific materials, a composition including particles of iron, cobalt, nickel, MK steel, KS steel, nitriding iron, $\gamma\text{-Fe}_2O_3$, Co-adhered $\gamma\text{-Fe}_2O_3$, $Fe_3O_4$, $CrO_2$, Fe—Si—Al alloy (sendust), Ni—Fe alloy (permalloy), Co—Fe alloy, amorphous alloy having Fe group or Co group, spinel type ferrite such as NiO—MnO—ZnO—$Fe_2O_3$, MnO—ZnO—$Fe_2O_3$, and NiO—ZnO—$Fe_2O_3$, in which $Fe_2O_3$ and MnO, ZnO, NiO, MgO, CuO or $Li_2O$ are combined, spinel type (cubical crystal) $\gamma\text{-Fe}_2O_3$, $\gamma\text{-Fe}_4O_4$ garnet type ferrite, Ba ferrite, Sr ferrite, rare-earth magnet (e.g., $RCO_5$ series, $R_2CO_{17}$ series, R—Fe—B series, Sm—Fe—N series and the like as represented by a general formula for their basis composition; here two or more types of rare-earth element including R or Y), alnico magnet and the like, may be used.

The functional ink composition 73' to develop the dielectric characteristics (or insulator characteristics) may be resin, such as polyester resin, vinyl chloride resin, phenol resin, polystyrene, polyethylene, and polyvinyl carbazole, or a composition containing particles of barium titanate, Rochelle salt and the like. The functional ink composition 73' to generate catalyst characteristics may be a composition containing particles of materials that can be a desired chemical reactive catalyst such as platinum, palladium, tin and titanium oxide (generally including transition metal). The functional ink composition 73' to generate light refraction characteristics may be resin such as polyester resin, polycarbonate resin, acrylic resin and polystyrene, or, when particularly increasing the refractive index, metal oxide, such as zirconium oxide, titanium oxide, tungsten oxide and yttrium oxide, and when particularly lowering the refractive index, a compound containing particles of cryolite, fluorite, magnesium fluoride, lithium fluoride and the like. For the functional ink composition 73' to develop optical characteristics, an appropriate material having desired optical characteristics, for example, when expressing light diffuseness, a composition including particles of a material having a difference in refractive index with the binder resin, such as particles of silica, barium sulfate, calcium carbonate, acrylic resin, urea resin, polycarbonate resin and the like, may be used. For the functional ink composition 73' to develop phosphor characteristics (or phosphorescence characteristics), a compound containing particles of a material in which silver, zinc, bismuth, aluminum, europium, samarium, manganese or the like is added as an activator agent (center of light emission) to a base material, such as zinc sulfide, cadmium sulfide, calcium sulfide and calcium tungstate, which is appropriate for discharging visible light beam excited by energy other than the visible light beam, such as ultraviolet rays, electron rays and X rays, may be used. For the functional ink composition 73' to develop coloring characteristics or design characteristics, a compound containing coloring agents made of various known pigments or dyes, such as chrome yellow, titanium yellow, isoindoline yellow, red oxide, cadmium red, quinacridone red, ultramarine blue, cobalt blue, phthalocyanine blue, sumi, black iron oxide, aniline black and the like (in appropriate particles if necessary) may be used. For the functional ink composition 73' to develop the abrasion-resistant characteristics, a composition containing an antifriction composition formed of particles of a high hardness material such as alumina, silica, diamond, corundum and cerium oxide, a lubricant such as polyethylene wax, paraffin wax and montan wax, or a composition including both the antifriction and the lubricant, may be used. For the functional ink composition 73' to develop the abradant characteristics, a material similar to that discussed for the antifriction composition, may be used. For the functional ink composition 73' to develop flexibility characteristics, a compound containing rubber, such as natural rubber, butadiene rubber, chloroprene rubber and silicon rubber, may be used.

When using the magnetic body composition as the functional ink composition 73', the obtained functional ink layer 73 can shield electromagnetic waves. Therefore, it may also be functioned as the above electromagnetic shield material according to this invention. As such magnetic body composition, for example the above-discussed various ferrite type magnetic bodies may be used.

For the purpose of the printed material 70, the functional ink layer 73 or the primer layer 72 may be colored. For example, from the viewpoint of adding design or aesthetic features, or display or identification functions by color, it is preferable that pigment or dye is included in the functional ink layer 73 or the primer layer 72 to color them.

When the additive that may be included in the functional ink layer 73 or the primer layer 2 is particles, the shape and diameter of such particles is not limited particularly. It is preferable that the additive with a shape or diameter of particles appropriate for the purpose of the printed matter is selected and contained. When using multiple types of particles, it is possible to mix particles having different shapes or diameters. At this time, the size of particle additives having a size larger than the thickness of the functional ink layer 73 or the primer layer 2 cannot be used. In addition, in consideration of forming a desired pattern by the above-discussed intaglio printing, it is necessary that the maximum size particle needs to be smaller than the width and depth of the intaglio part on the plate surface.

The cross-sectional formation of the functional ink layer 73 may be structured basically the same formation as the formation of the above-discussed conductive pattern shown in FIGS. 4-7. In addition, the plan view formation of the functional ink layer 73 may be formed by an arbitrary pattern necessary to achieve the desired function, such as a mesh shape, a stripe shape or a picture, if it can go through the processes of this invention, such as scraping off the functional ink composition 73' on the plate.

Figure 16:
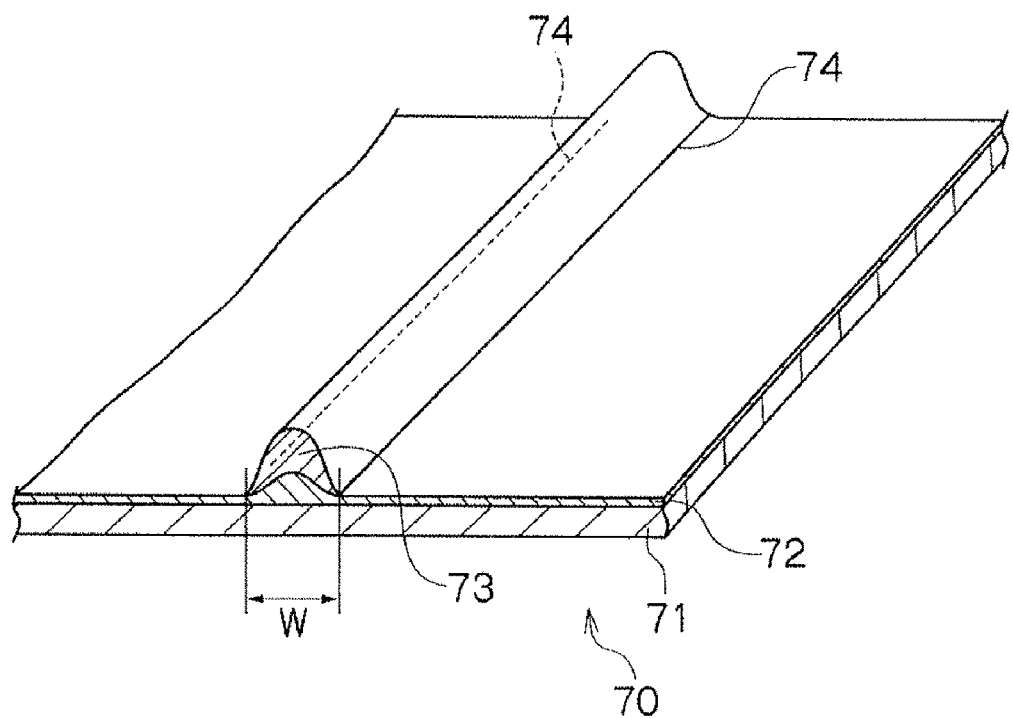
FIG. 16 is an enlarged view of an example in which a boarder of a pattern formed part A and a pattern non-formed part B, which structure the printed matter of this invention, is viewed in plan.

FIG. 16 is an enlarged view showing an example of a boundary between the pattern formation part A and the pattern non-formation part B structuring the printed matter of this invention in a plan view. In the printed matter 70 of this invention, when the boundary between the pattern formation part A and the pattern non-formation part B in plain view is a straight line (in case of FIG. 16), a curve, a desired linear shape such as broken curve, or a closed curve shape (not shown), such as a circle, a polygon, and a dot pattern, the linear border line 74, 74 is preferably observed by naked eye to view that the desired linear shape is reproduced well. Examples of situations in which the printed matter 70 of this invention preferably has such characteristics include when the electromagnetic shield material in which the functional ink layer 73 is formed to have the characteristics of the electromagnetic shield, and when the pattern formation part A that the printed matter 70 has may be directly viewed by an observer, such as, an advertisement and a display (a sign for non-smoking, emergency exit, construction and the like, lines used in station names, room names, product names, maps and the like, circuit wire pattern, and designs).

To allow the observer to observe the printed matter 70 to have an excellent linear border as designed, it is preferable that three times ($3\sigma$) of a standard deviation of a width (hereinafter referred to as line width) W of the border line 74, 74 of both sides of the functional ink layer 74 shown in FIG. 16 is equal to or greater than 5% and equal to and less than 15% of an average of the line width. In addition, measurement of the line width W is performed by drawing a virtual line orthogonal with a direction in which the functional ink layer 73 extends, dividing the virtual line equally into 30 segments, and measuring the line width W at a position on or adjacent to the point. A laser microscope is used for the measurement of the line width W. Moreover, the three times ($3\sigma$) of a standard deviation of the line W is used in general as a standard representing variations, and evaluations are made in this application also using the $3\sigma$. Further, equal to or less than 15% of an average of the line width indicates that an average value of the measured line width is equal to or less than 15%, and when the line width is 20 μm for example, its value of 15% is 3 μm. Therefore, $3\sigma$ of the standard deviation should be equal to or less than this value. Furthermore, equal to or greater than 5% of an average of the line width indicates that an average value of the measured line width is equal to or greater than 5%, and when the line width is 20 μm for example, its value of 5% is 1 μm. Therefore, $3\sigma$ of the standard deviation should be equal to or greater than this value. When the pattern shape is closer to a polygon or a circle than a line, the line width W may be read, as needed, on a required parameter, such as the above-discussed diameter.

When the three times ($3\sigma$) of the standard deviation representing the variations of the line width W of the functional ink layer 73 is equal to or less than 15% of an average of the line width, there is a feature that a percentage of the parts in which the line width is thin or thick is small is small, and that nonuniformity of the width size is difficult to be noticed by the naked eye observer. In addition, the three times ($3\sigma$) of the standard deviation is equal to or greater than 5% of the average of the line width, and when the line width has thin parts and thick parts because the line width is not excessively equalized, there are variations at a level that is not notified. Moreover, when the line becomes thin such that $3\sigma$ of the line width W exceeds 5% of the average of the line width, at the parts with thin line widths, absorption of outer light decreases, and the contrast partially decreases, when used for the purpose of viewing from outside by eyes. Further, when used for the purpose of focusing on the electric conductivity, partial increase in resistance is caused. In addition, when $3\sigma$ of the line width W exceeds 15% of the average of the line width, unevenness in the line width becomes visible. On the other hand, when $3\sigma$ of the line width W is less than 5% of the average of the line width, the unevenness becomes visible when concentration of the parts with thick line width and of the parts with thin line width occurs.

In the printed matter 70 of this invention, a functional layer having the same as or different from the functional ink layer 73 may be additionally formed on the surface of the functional ink layer 73. Such a functional layer may be a metal layer discussed in relation to the above-discussed electromagnetic shield material, a protective function layer that covers the surface to protect the functional ink layer 73 from the external force, contamination or the like, or a functional layer that develops any functions that the above functional ink layer 73 has.

Further, as a formation to provide the above metal layer, similar to the above-discussed electromagnetic shield material of this invention, there is a method by forming a conductive layer 3 from the conductive composition 3' and by forming the metal layer on the conductive layer 3 by electrolytic plating. As another method, there is a method by forming, as the functional ink layer 73, an electroless plating catalyst layer using an electroless plating catalyst composition and thereafter by forming the metal layer on the electroless plating catalyst layer by the electroless plating. As the electroless plating catalyst composition, there is a (known) composition that includes a palladium catalyst, for example, which is an electroless plating catalyst. As the electroless plating liquid, there is electroless copper plating liquid, electroless nickel plating liquid, or the like.

Further, for the printed matter 70 of this invention, various post-processes may be performed as needed. Such post processes include a metal (simple or alloy) plating process (electroless plating/electroplating) or vapor deposition/spattering process of adding conductivity, adding heat conductivity, adding metal gloss, or surface protection; a radiation irradiation process of hardening the binder resin when the functional ink layer is formed of an ionizing radiation hardening binder resin; a drying process of vaporizing and removing the solvent when the functional ink layer includes a solvent (or a disperser); a heating process of opening when an internal stress or warping remains in the base material or the functional ink layer or of hardening the binder resin when the functional ink layer includes a heat hardening binder resin; a calcination process of removing a resin binder that does not contribute to conductivity, magnetism or super conductivity to form a composition with the conductor, magnetic body or super conductor, of fusing and adhering molecules of the conductor, magnetic body or super conductor to produce a bulk body and to improve the conductivity or magnetism, when the functional ink layer is formed of a mixture of the conductor, magnetic body or super conductor, or of changing the precursor of an organic metal compound to metal, metal oxide, metal compound ceramics or the like by chemical reaction or heat decomposition when the conductor, the magnetic body or the super conductor are formed of their precursor such as the organic metal compound; a cooling process of achieving super conductivity by the super conductor; and a over-coating process of protecting the surface of the functional ink layer from an external force, contamination, abrasion or the like; as well as a chemical process, a pressure reduction process, pressuring process, a rolling process, a stretching process, an adhering process, a printing process, a cutting process, and a punching process.

Furthermore, although the base material is required during the manufacturing process of this invention, when the base material is not needed in the product after the manufacturing, the base material 71 may be removed by burning or solving it to remain only the patterned part. In addition, when the method of manufacturing the printed matter of this invention is difficult to coat directly to the base, the functional ink layer 73 may be first printed on a base material for transfer that is of a demold type and has well applicability to the manufacturing method of this invention, to manufacture the printed matter, and thereafter, the functional ink layer 73 may be transferred, with the primer layer 72, on another base material 71 for the final product. Situations, such as when it is difficult to coat the printing method of this invention directly by a intaglio printing due to thick base material or high stiffness, when the hardening of the primer layer 72 is difficult because the base material 71 of the final product is opaque for the ionizing radiation for hardening the primer layer, when the base material 71 cannot endure the heat during the calcination of the functional ink layer 73, and when the base material 71 cannot hold up the solution or swelling by the solvent or monomeric component in the primer layer 72, correspond to this example.

The printed matter 70 of this invention may be used for the below purpose based on the characteristics of the functional ink layer 73 and the base material 71. It is needless to say that the printed matter 70 is formed in a shape based on the respective purpose.

For example, when a transparent base material is used and the functional ink layer 73 is mainly conductive, the printed matter 70 may be used for transparent electromagnetic shield members such as a front surface of an image display device, building or vehicle windows, and a microwave window, electromagnetic absorbing members, various transparent electrodes (touch panels, liquid crystal display devices, electroluminescent display devices, solar power batteries, electronic papers), various sensors, antistatic protection members, antenna members, IC tag members or the like, in which the pattern non-formation part B is transparent. On the other hand, when an opaque base material is used, the printed matter 70 may be used for electromagnetic shield members, electromagnetic absorbing members, print circuits (electric wires, coils, resistant bodies, condensers), various flexible electrodes, various sensors, antistatic members, antenna members, IC tag members or the like, in which the pattern non-formation part B is or can be opaque.

In addition, when a transparent base material is used and the function of the functional ink layer 73 is mainly a catalyst function, the printed matter 70 may be used for an inspection film member or the like, in which the pattern non-formation part B is transparent. On the other hand, when the opaque base material is used, the printed matter 70 may be used for an inspecting paper member, electrodes for bio-batteries, or the like, in which the pattern non-formation part B is or can be opaque.

Moreover, a light transmissive electromagnetic shield material for the front surface of the image display device or the like can be manufactured by providing the functional ink layer 73 as a mesh pattern layer that includes an electroless plating catalyst, such as palladium choroid and by growing a metal film such as copper, thereon by the electroless plating method.

Further, as the functional ink layer 73, a material structured by anatese-type titanium dioxide molecule having photocatalyst function may be used for interior materials or furniture surface for decomposition removal of various organic materials (so called VOC) existing in the air in the inside of a building, such as formaldehyde, cigarette smoke, plasticizer, organic solvent and the like, disinfect and/or mold prevention.

In addition, when the function of the functional ink layer 73 is mainly color adjustment (colors) or refraction index, for example, and the transparent base material is used, the printed matter 70 may be used for a transparent design pattern member such as stained-glass style windows, optical filter members, micro louver members having parallel line group shaped black protruding parts used for restricting view angle and reflection prevention of ambient light by providing on the front surface of the image display device, micro lens array members or the like, in which the pattern non-formation part B is transparent. On the other hand, when using the opaque base material, the printed matter 70 is used for a design pattern or the like, in which the pattern non-formation part B is or can be opaque.

Moreover, when using the transparent base material, various members in which the pattern non-formation part B is transparent can be obtained. For example, the printed matter 70 may be used for Braille members that are printed by the functional ink layer 73 having appropriate hardness, texture, thickness, color and the like; optical members, such as a lenticular lens, a fly eye lens, a Fresnel lens, a linear prism array sheet (e.g., disclosed in Japanese Patent No. 3123006 and U.S. Pat. No. 4,906,070), a thin plate fine louver (e.g., disclosed in Japanese Publication No. S37-283, Japanese Laid-Open Patent Application No. 2007-272161) or the like, which is printed by the functional ink layer 73 having light refraction characteristics or optical characteristics; building interior or exterior members, such as a window glass and a glass door or partition, which uses protruding patterns, such as stained-glass style patterns, cut-glass style patterns, Japanese-paper-style patterns, which are printed by the functional ink layer 73 having coloring characteristics, design characteristics, or fluorescent or phosphorescent characteristics; and advertising media, such as guides like emergency exist, display used for non-smoking or the like, posters, signs, product displays, or the like, which uses the protruding patterns; as well as wrapping material for food or the like, push buttons, touch panels, texts and numbers embossed on membrane switches, or barcodes on various product surfaces, which use the protruding patterns.

On the other hand, when using the opaque base material, various members in which the pattern non-formation part B is or can be opaque are obtained. For example, the printed matter 70 may be used for Braille members that are printed by the functional ink layer 73 having appropriate hardness, texture, thickness, color and the like; polishing members formed by arranging in two dimension a large number of unit protrusion parts of polygonal cones or arranging in parallel a large number of unit protrusion part of polygonal pillars, by printing with the functional ink layer 73 having a polisher function; building interior members, exterior members or furniture surface members taking advantage of the protrusion patterns, such as embossed wooden texture members (wooden texture, such as cryptomeria board, in which year rings are embossed), texture members such as cloth texture, stone texture members, tile or brick stacking texture members, hairline texture members, cushion members, which are printed by the functional ink layer 73 having coloring characteristics, design characteristics, or fluorescent or phosphorescent characteristics; advertising media that takes advantages of the protrusion patterns, such as guides like emergency exist, display used for non-smoking or the like, posters, signs, product displays, or the like, which uses the protruding patterns; as well as wrapping material for food or the like, push buttons, touch panels, texts and numbers embossed on membrane switches, barcodes on various product surfaces, which use the protruding patterns, and electric/electronic members, such as printed circuit boards, integrated circuit boards, micro strip antenna or the like printed with predetermined arrangements and connections in patterns, such as predetermined wiring, resistive elements, condensers and coils, by the functional ink layers 73 having conductor characteristics, resistive body characteristics, super conductor characteristics, magnetic body characteristics, dielectric body characteristics or the like.

According to this invention as described above, a printed matter 70 having a high precision functional ink pattern formed by a functional ink composition 73' can be continuously and efficiently provided. In addition, according to the method of manufacturing the printed matter of this invention, the functional ink composition 73' that includes, for example, pigment, can be printed in protrusion patterns with precision by intaglio printing (e.g., gravure printing) on a base material 71 a primer layer 72 that can smoothly transit from a fluid state to a solid state. In addition, according to this method, parts of the primer layer 72 and the functional ink layer 73 may be solved in each other, thereby allowing the functional ink composition 73' filed into intaglio parts of an intaglio plate to transfer at base material 100%, thus well reproducibility of the plate shape. Accordingly, controlling the cross-sectional shape of the print patterns, which is difficult conventionally, can be achieved.

EXAMPLES

This invention is explained in greater details with examples and comparative examples below.

Example 1

An electromagnetic shield material was manufactured by a device shown in FIGS. 9 and 10. First, as a transparent base material 1, a clear transparent bi-axis oriented polyethylene terephthalate (PET) film in a long bar roll having a width of 1000 mm and a thickness of 100 μm, one side of which has been coated with a light hardening resin composition for the primer layer by performing adhesive improvement process, was used. By feeding the PET film set to a supply part, the light hardening resin composition for the primer layer was applied and formed on the adhesive-promoting processed surface such that its thickness becomes 5 μm. For the coating method, a conventional gravure reverse coating method is used. As the light hardening resin composition, a composition, in which 35 weight parts of epoxyacrylate prepolymer, 12 weight parts of urethaneacrylate prepolymer, 44 weight parts of monofunctional acrylate monomer formed by phenoxyethylacrylate, 9 weight parts of trifunctional acrylate monomer formed by ethylene oxide-altered isocyanuric acid triacrylat, and, as the photoinitiator, 3 weight parts of IRGACURE 184 (material name: 1-hydroxycyclohexyl phenyl ketone, manufactured by Ciba Specialty Chemicals) were added, was used. The viscosity at this time was 1300 mPa·s (25° C., B-type viscometer). When touching the primer layer 2 after coating, it showed fluidity but did not fall off from the PET film.

Next, the PET film on which the primer layer 2 was formed is provided to an intaglio plate roll 62 for a transfer process. Prior to the transfer process, a conductive composition 15 was applied by a pickup roll 61 on a plate surface 63 of an intaglio plate roll 62 on which intaglio parts were formed in a lattice shaped mesh pattern, which opening parts have a line width of 20 μm, a line pitch of 30 μm, and a plate depth of 20 μm. The conductive composition 15 was filled only into the intaglio parts 64 by scraping off the conductive composition 15 in the area other than the intaglio parts 64 by a doctor blade 65. The PET film on which the primer layer 2 was formed was provided between the intaglio plate roll 62 in a state where the conductive composition 15 is filled into the intaglio parts 64, and a nip roll 66, and by a pressing force (bias force) of the nip roll 66 against the intaglio plate roll 62, the primer layer 2 was flown into the indentation 6 of the conductive composition 15 in the intaglio parts 64. Therefore, the conductive composition 15 and the primer layer 2 were adhered without cavities therebetween, and a part of the primer layer 2 was inflated into the conductive composition 15. In addition, for the conductive composition used, silver paste of the following composition was used.

<Producing Conductive Composition (Silver Paste)>

93 weigh parts of scale shape silver powder having an average particle diameter of 2 μm as the conductive powder, 7 weight parts of a thermoplastic polyester-urethane resin as a binder resin, 25 weight parts of butylcarbitol acetate as a solvent are combined, and after agitating and mixing them enough, the composition was kneaded by three rolls to produce the conductive composition.

The subsequently performed transfer process is as follows. First, the PET film on which the primer layer 2 was formed was sandwiched between the intaglio plate roll 62 and the nip roll 66 in a state where the primer layer 2 faces the plate surface 63 side of the intaglio plate roll 62. The PET film primer layer 2 is pressed against the plate surface 63 between the intaglio plate roll 62 and the nip roll 66. Because the primer layer 2 has fluidity, the primer layer 2 that was pressed against the plate surface 63 flows into the inside of the intaglio parts 64 into which the conductive composition 15 was filled, to fill in the indentation 6 of the conductive composition 15 formed in the intaglio parts 64 (see FIG. 11). Therefore, the primer layer 2 was adhesive to the conductive composition 15 without cavities therebetween. Thereafter, the intaglio plate roll 62 further rotates and the primer layer 2 was irradiated with ultraviolet by a UV lamp formed by a high-pressure mercury lamp, to harden the primer layer 2 formed by a light hardening resin composition. By the hardening of the primer layer 2, the conductive composition in the intaglio parts 64 of the intaglio plate roll 62 adheres with the primer layer 2, and after that, the film was peeled off from the intaglio plate roll 62 by the exit side nip roll 67. Therefore, the conductive composition layer 3' (see FIG. 8) was transferred and formed on the primer layer 2. The so-obtained transferred film was hardened by passing under a drying zone at 110° C. and hardens by evaporating the solvent of the silver paste, to form the conductive layer 3 in mesh pattern on the primer layer 2. The thickness of the patterned part with the conductive layer 3 at that time (difference in thickness between the mesh pattern part in which the conductive layer 3 is formed and the other parts) was approximately 19 μm. Therefore, the silver paste transferred at the thickness substantially equivalent to the depth of the plate, and thus the silver paste in the intaglio parts 64 of the plate transferred at a high transfer printing rate. Observing by eyes the inside of the intaglio parts 64 after the transfer, remainder of the paste was not found in the plate, and wire breakage or improper shape of the mesh pattern was not seen.

Figure 17:
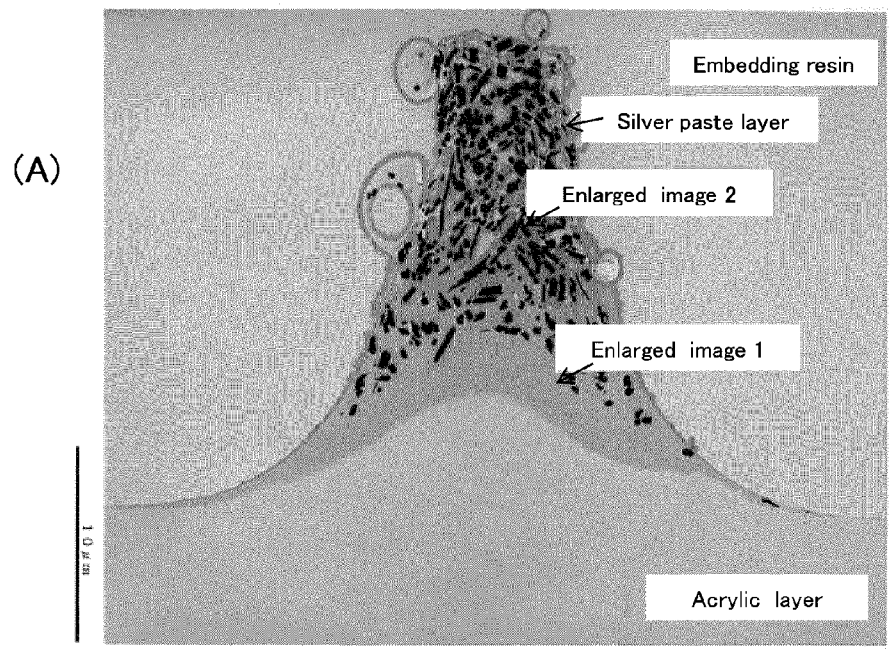
FIG. 17A is a cross-sectional structural diagram of a conductive pattern obtained from Example 1.
FIG. 17B is an enlarged view showing a part of the cross-sectional structural diagram of Example 1 of FIG. 17A.
Figure 17:
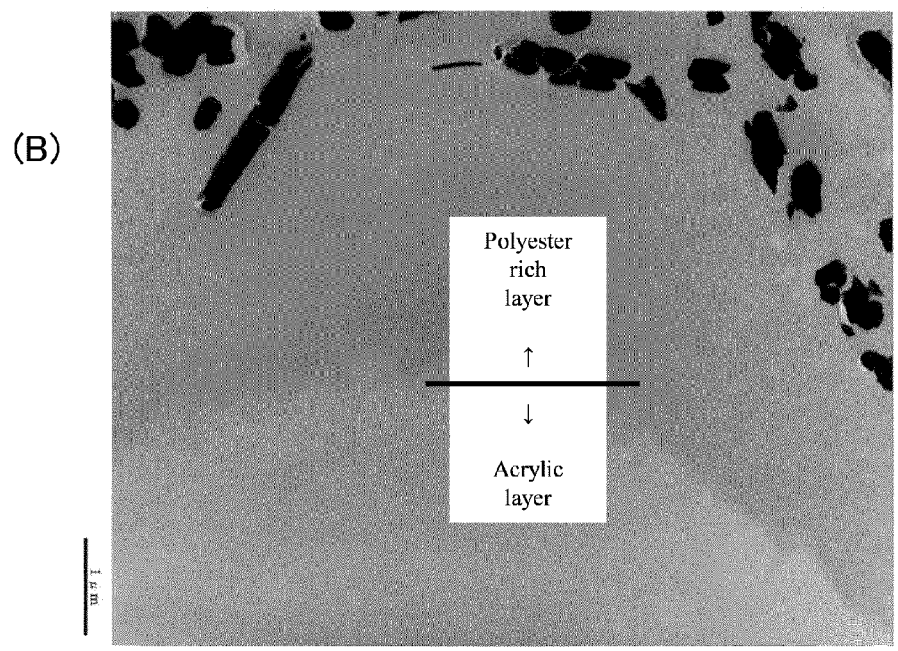

For the sample at this time, a cross-sectional TEM (transmissive electron microscope) observation was performed on a part of the conductive layer pattern 19. FIG. 17 is a cross-sectional TEM photograph of the conductive layer pattern 19. As shown in FIG. 17, the boundary face 12 between the primer layer 2 and the conductive layer 3 that were stained by an osmium staining solution has a gradation in which the staining color density changes from dark to light, and a boundary structure that the boundary face 12 has a considerably complicated interface shape was observed. Therefore, it was confirmed that the primer layer 2 and the conductive layer on the periphery of the boundary face was partially blended (solved) with each other. Moreover, as a result of performing an SIMS analysis on the surface on the conductive layer 3 side, a primer component that is not included in the conductive composition but in the primer layer 2 was observed, and thus it was confirmed that a part of the primer component partially is mixed in the conductive composition prior to the hardening. In consideration of these situations, it is assumed that, when the solution of the boundary part (boundary face 12) and the disturbance of the boundary face 12 occur when the fluid primer layer 2 contacts the conductive composition, and when the primer layer 2 hardens in this state, a phenomenon, such as increase in viscosity of the conductive composition or turning the conductive composition in a gel state, in a region between the boundary part to the inside area of the conductive compound, and the conductive compound was easily removed from the plate. Alternatively, it is assumed that a part of the primer component of the fluid primer layer and the conductive composition layer in the plate are mixed, and that the viscosity of the conductive composition layer generally increases when the primer layer hardens. In either case, when the primer layer 2 having the fluidity contacts the conductive composition layer, and when the primer layer 2 is peeled off after hardening, transfer of the conductive composition layer was possible at substantially 100% although the conductive composition layer was not completely hardening.

Next, cupper plating was performed on the obtained transferred film. As the cupper plating method, electrolytic copper plating was performed by soaking the obtained transferred film in a copper sulfate plating liquid and passing electric current of 2 A/dm² to the surface thereof with the mesh conductive pattern as cathode and the cupper plate as anode. The cupper-plated film was formed with a thickness of 2 μm selectively on the conductive layer 3. The surface resistance value of the obtained member was 0.1 Ω/sq. The electromagnetic shield material of Example 1 according to the invention was manufactured in the method as described above.

Example 2

Other than that the conductive carbon black fine powder as discussed below was included in the conductive composition filled into the intaglio part 64 in advance in Example 1, the magnetic shield material of Example 2 was manufactured similarly to Example 1. The pattern shape was similar to Example 1. From the observation of the obtained pattern by eyes from the back surface of the pattern, it appeared that glossiness was slightly reduced.

<Producing Conductive Composition (Silver Paste+Carbon Black)>

90 weigh parts of scale shape silver powder having an average particle diameter of 2 μm as the conductive powder, 3 weight parts of acetylene black (average particle diameter 35 nm) as the carbon black, 7 weight parts of a thermoplastic polyester-urethane as a binder resin, 35 weight parts of butyl-carbitol acetate as a solvent are combined, and after agitating and mixing them enough, the composition was kneaded by three rolls to produce the conductive composition.

Comparative Example 1

Other than that the primer layer 2 is not applied on a surface subject to the adhesive improvement process on the PET film in Example 1, the conductive composition was transferred similarly to Example 1. However, at that time, the transfer of the conductive composition on the PET film was not sufficient, and many wire breakages and missing patterns occurred. The thickness of the pattern after drying is approximately 1 μm, and the transfer printing rate was remarkably low. It was also not possible to perform the subsequent electric cupper plating. The reason is assumed that the conductive composition 15 is scraped out from the intaglio part 64 when removing the conductive composition by the doctor blade 65 in the area other than the intaglio part 64, and the indentation 6 is formed on the conductive composition 15 in the intaglio part 64. Therefore, because of the indentation 6, the conductive composition 15 was not transferred on the PET film with sufficient adhesion, and thus, the conductive layer broke, and the electric current (potential difference) required for the plating was not obtained.

(Evaluation Result)

The evaluation results of the electromagnetic shield materials produced by Examples 1 and 2 and Comparative Example 1 are shown in Tables 1 and 2. In Table 2, the transferability was determined from the condition of the transfer of the conductive composition onto the film, and examples in which the predetermined mesh pattern was transferred uniformly with good adhesiveness were confirmed by a microscope by observing by eyes of a 300× image, were evaluated as "Good," and the examples in which the predetermined mesh pattern was not uniformly transferred were evaluated as "Bad." Moreover, for the shielding, as a result of measuring the electromagnetic shield characteristics of the obtained electromagnetic shield material by a shield material evaluation device (TR17301A manufactured by Advantest Corp.), the examples that have shield characteristics equal to or less than approximately −30 decibels in a range of 200-600 MHz were evaluated as "Good," and the examples that have shield characteristics greater than approximately −30 decibels were evaluated as "Bad." Further, for visibility, by evaluating by eyes whitening (white turbidity) of the surface of the electromagnetic shield material due to reflection of light, the examples in which the remarkable and clear whitening were confirmed were evaluated as "Bad," the examples in which the whitening was slightly confirmed but no discomfort was recognized when placed on an image display surface were evaluated as "Δ," and the examples in which no whitening was confirmed were evaluated as "Good."

TABLE 1

| | Conductive material composition | Primer layer |
|---|---|---|
| Example 1 | Silver paste | Light hardening resin |
| Example 2 | Silver paste + carbon black | Light hardening resin |
| Comparative Example 1 | | No primer layer |

TABLE 2

| | Tran-scription | Shield effect | Trans-parency | Visibility | Cost | Total |
|---|---|---|---|---|---|---|
| Example 1 | Good | Good | Good | Δ | Low | ○ |
| Example 2 | Good | Good | Good | Good | Low | ◎ |
| Comparative Example 1 | Bad | Bad | Good | Good | Low | X |

Example 3

First, as the base material, a long, rolled polyethylene terephthalate (PET) film having a width of 1000 mm and a thickness of 100 μmm of which one side has been performed an adhesive improvement process was used. By feeding a clear transparent PET film set at a supply part, a light hardening resin composition for a primer layer was applied and formed on the adhesive improvement processed surface such that the thickness becomes 5 μm. A general gravure reverse method was used as the coating method. As the light hardening resin material, a compound, in which 35 weight parts of epoxyacrylate prepolymer, 12 weight parts of urethaneacrylate prepolymer, 44 weight parts of monofunctional monomer formed by phenoxyethylacrylate, 9 weight parts of trifunctional monomer formed by trimethylol propanenitriacrylate, and, as the photoinitiator, 3 weight parts of IRGACURE 184 (material name: 1-hydroxycyclohexyl phenyl ketone, manufactured by Ciba Specialty Chemicals) were added, was used. The viscosity at this time was approximately 1300 cps (at 25° C., B-type viscometer). Although the primer layer after coating indicated fluidity when touched, it never flew out from the PET film.

Next, the PET film on which the primer layer was formed is provided to an intaglio plate roll that performs the transfer process. Prior to the transfer process, a catalyst paste was applied by a pickup roll on a plate surface of the intaglio plate roll on which intaglio parts having a lattice shaped mesh pattern with a line width of 200 μm, a line pitch of 300 μm and a plate depth of 5 μm was formed. Then, the catalyst paste was scraped off by a doctor blade from the areas other than the intaglio parts, to fill the catalyst only into the intaglio parts. By providing the PET film, on which the primer layer is formed, between the intaglio plate roll in a state in which the catalyst paste is filled into the intaglio parts, and a nip roll, and by coating a pressing force (bias force) of the nip roll against the intaglio plate roll, the primer layer was flown into indentations of the catalyst in the intaglio parts, to adhere the catalyst paste and the primer layer without cavities therebetween. For the catalyst past used, a catalyst paste having the blow composition was used.

<Producing Catalyst Paste>
(Producing Palladium Choroid)

The palladium choroid was obtained by solving 1 weight part of palladium chloride into 89 weight parts of purified water and reducing the palladium chloride by adding 0.01 weight parts of sodium borohydride after solving 10 uniformly agitating weight parts of trisodium citrate. Thereafter, concentration and desalting were conducted by ultrafiltration, to obtain the palladium choroid containing 0.5 weight parts of palladium. 10 weight parts of this palladium choroid was diluted by purified water, and 10 weight parts of alumina aerosol $Al_2O_3$—C (manufactured by Nippon Aerosil Col, Ltd.) was added and suspended in the diluted palladium choroids solution. By filtering, drying and raveling this, palladium choroids supported alumina gel was obtained. 7 weight parts of this palladium choroids supported alumina gel and 30 weight parts of terpineol solution of 10% ethyl cellulose were tempered by three rolls to make the catalyst paste.

<Formation of Print Patten>

The subsequently performed transfer process is as follows. First, the PET film on which the primer layer is formed was sandwiched between the intaglio plate roll and the nip roll in a state in which the primer layer faces the plate surface side of the intaglio plate. The primer layer on the PET film between the intaglio plate roll and the nip roll was pressed against the plate surface. Because the primer layer had fluidity, the primer layer that was pressed against the plate surface flew into the intaglio parts into which the catalyst paste was filled and became in a state in which the primer layer adhered to the catalyst paste without cavities therebetween. Thereafter, the intaglio plate roll further rotated, and ultraviolet rays were irradiated by a UV lamp, thereby hardening the primer layer formed of a light hardening resin composition. By the hardening of the primer layer, the catalyst paste in the intaglio parts of the intaglio plate roll adhered to the primer layer, and thereafter the film is peeled off from the intaglio plate roll by the existing side nip roll to transfer and form the catalyst paste layer on the primer layer. The transferred film obtained as such was passed through a drying zone at 110° C. to evaporate the solvent in the catalyst layer, forming the catalyst layer in a mesh pattern on the primer layer. The thickness (difference in thicknesses between the mesh pattern part on which the catalyst layer is formed and other parts) of the catalyst layer at this time was approximately 5 μm, and the catalyst paste in the intaglio parts on the plate transferred at a high transfer printing rate. In addition, wire breakage or improper shape was not observed. The results of cross-sectional observation and the like were similar to those of Example 1.

<Nonelectrolytic Cu Plating>

The obtained catalyst-paste-printed base material was soaked in electroless cupper plating liquid (OPC-750 series by Okuno Chemical Industries Co., Ltd.), and the electroless cupper plating was performed for 20 minutes at 20° C. to form a cupper layer with a thickness of 2 μm. Washing and drying were performed on the plating treatment. As a result of the plating, the surface resistance of the sheet was 0.1 Ω/sq.

The invention claimed is:

1. A printed matter, comprising:
    a base material;
    a primer layer formed on the base material; and
    a functional ink layer formed on the primer layer in a predetermined pattern,
    wherein a thickness of the primer layer at a pattern formation part at which the functional ink layer is formed in the predetermined pattern is larger than a thickness of the primer layer at a pattern non-formation part at which the functional ink layer is not formed in the predetermined pattern.

2. The printed matter according to claim 1, wherein a mixing area in which a component structuring the primer layer and a component structuring the functional ink layer are mixed is formed at least near a boundary face of the primer layer and the functional ink layer at the pattern formation part.

3. The printed matter according to claim 1, wherein a boundary face of the primer layer and the functional ink layer is uneven and the primer layer adheres to the functional ink layer without cavities.

4. The printed matter according to claim 1, wherein the functional ink layer is formed of a functional ink composition in which a component included in the primer layer exists.

5. The printed matter according to claim 1, wherein the pattern formation part has a protruding formation structured by a first hill formed by the primer layer and a second hill formed by the functional ink layer above the foot of the first hill, a portion above the foot of the first hill being covered with the second hill.

6. The printed matter according to claim 1, wherein the primer layer is an ionizing radiation hardening resin, a thermoplastic resin or a heat hardening resin that changes from a fluid state to a solid state.

7. The printed matter according to claim 1, wherein the functional ink layer has one or more functions selected from conductor characteristics, magnetism characteristics, dielectric characteristics, catalyst characteristics, light refractivity characteristics, optical characteristics, coloring characteristics, design characteristics, and elastic characteristics.

8. The printed matter claim according to claim 1, further comprising a second functional layer has the same function as or the function different from the functional ink layer, the second functional layer being formed on the functional ink layer.

9. A method of manufacturing a printed matter, comprising:
    filling an unhardened functional ink composition into intaglio parts on a plate surface in a predetermined pattern;
    providing a primer layer on a base material subject to transfer the functional ink composition, the primer layer maintaining fluidity until hardening;
    pressure-bonding the plate surface and the primer layer;
    hardening at least the primer layer while the pressure-bonding is maintained;
    peeling off the base material and the primer layer from the plate surface to transfer the functional ink composition to the base material via the primer layer in the predetermined pattern.

10. The method of manufacturing the printed matter according to claim 9, further comprising hardening the functional ink composition at the same time as hardening the primer layer.

11. The method of manufacturing the printed matter according to claim 9, wherein the primer layer is hardened by ionizing radiation or cooling.

12. An electromagnetic shield material comprising:
    a transparent base material;
    a primer layer formed on the transparent base material; and
    a conductive layer formed by conductive composition on the primer layer in a predetermined pattern,
    wherein a thickness of the primer layer at a pattern formation part at which the conductive layer is formed in the predetermined pattern is larger than a thickness of the primer layer at a pattern non-formation part at which the conductive layer is not formed in the predetermined pattern.

13. The electromagnetic shield material according to claim 12, wherein a boundary face of the primer layer and the conductive layer is uneven and the primer layer adheres to the conductive layer without cavities.

14. The electromagnetic shield material according to claim 12, wherein a boundary face between the primer layer and the conductive layer is a boundary face between a resin structuring the primer layer and a resin structuring the conductive layer or a filler.

15. The electromagnetic shield material according to claim 12, wherein a mixing area in which a component structuring the primer layer and a component structuring the conductive layer are mixed is formed at least near a boundary face of the primer layer and the conductive layer at the pattern formation part.

16. The electromagnetic shield material according to claim 12, wherein a primer component included in the primer layer exists in the conductive composition structuring the conductive layer.

17. The electromagnetic shield material according to claim 12, wherein the pattern formation part has a protruding formation structured by a first hill formed by the primer layer and a second hill formed by the conducive composition above the foot of the first hill, a portion of the pattern formation part above the foot of the first hill being covered with of the second hill.

18. The electromagnetic shield material according to claim 17, wherein the first hill has a non-continuous part of an inclination of a hill-shaped contour surface above the foot thereof.

19. The electromagnetic shield material according to claim 12, further comprising a metal layer formed on the conductive layer.

20. The electromagnetic shield material according to claim 12, wherein the primer layer is formed by ionizing radiation hardening resin or thermoplastic resin.

21. The electromagnetic shield material according to claim 12, wherein a resin included in the conductive layer is a thermoplastic resin, an ionizing radiation hardening resin, or a heat hardening resin.

22. A method of manufacturing an electromagnetic shield material in which a conductive layer is formed on one surface of a transparent base material in a predetermined pattern, comprising:
    forming a primer layer on a transparent base material, the primer layer maintaining fluidity until hardened;
    filling a conductive composition into which intaglio parts are formed in a predetermined pattern on a plate-shaped or disc-shaped plate surface, by coating the plate-shaped or disc-shaped plate surface with the conductive composition and by scrapping the conductive composition adhered in an area other than the inside of the intaglio parts;
    pressure-bonding a primer layer side of the transparent base material and an intaglio part side of the plate surface, to make the primer layer adhere to the conductive composition in the intaglio parts without cavities therebetween;
    hardening the primer layer;
    transferring the conductive composition in the intaglio parts to the primer layer by peeling off the transparent base material and the primer layer from the plate; and
    forming the conductive layer by hardening the conductive composition formed on the primer layer in the predetermined pattern after the transfer process.

23. The method of manufacturing the electromagnetic shield material according to claim 22, further comprising:
    forming a metal layer by electroplating the conductive layer formed on the primer layer in the predetermined pattern, wherein
    the conductive layer has ability to be electroplated after hardening the conductive composition.

24. The method of manufacturing the electromagnetic shield material according to claim 22, wherein the primer layer is formed by ionizing radiation hardening resin or thermoplastic resin, and the maintaining of fluidity of the primer layer is achieved by non-radiation of ionizing radiation or heating.

25. The method of manufacturing the electromagnetic shield material according to claim 22, wherein the conductive composition includes a filler and a resin, and the resin is a thermoplastic resin, an ionizing radiation hardening resin or a heat hardening resin.

26. The method of manufacturing the electromagnetic shield material according to claim 22, wherein a primer component included in the primer layer is mixed into the conductive composition structuring the conductive layer.

27. The method of manufacturing the electromagnetic shield material according to claim 22, wherein a thickness of a part of the primer layer at which the conductive composition has transferred is larger than a thickness of a part at which the conductive composition has not transferred, a boundary face of the primer layer and the conductive layer is uneven, and the primer layer adheres to the conductive layer without cavities.

28. The method of manufacturing the electromagnetic shield according to claim 22, wherein the pattern of the conductive layer is a protruding pattern formed by a first hill formed by the primer layer and a second hill formed by the conductive composition above the foot of the first hill, a portion of the pattern above the foot of the first hill being covered with of the second hill.

29. A method of manufacturing an electromagnetic shield material in which a conductive layer is formed on one surface of a transparent base material in a predetermined pattern, comprising:

forming a primer layer on a transparent base material, the primer layer maintaining fluidity until hardened;

filling a conductive composition into which intaglio parts are formed in a predetermined pattern on a plate-shaped or disc-shaped plate surface, by coating the plate-shaped or disc-shaped plate surface with the conductive composition and by scrapping the conductive composition adhered in an area other than the inside of the intaglio parts;

pressure-bonding a primer layer side of the transparent base material and an intaglio part side of the plate surface, to make the primer layer adhere to the conductive composition in the intaglio parts without cavities therebetween;

hardening the primer layer and the conductive composition at the same time; and transferring the conductive composition in the intaglio parts to the primer layer by peeling off the transparent base material and the primer layer from the plate surface.

30. The method of manufacturing the electromagnetic shield material according to claim 29, further comprising:

forming a metal layer by electroplating the conductive layer formed on the primer layer in the predetermined pattern, wherein the conductive layer has ability to be electroplated after hardening the conductive composition.

31. The method of manufacturing the electromagnetic shield material according to claim 29, wherein the primer layer is formed by ionizing radiation hardening resin or thermoplastic resin, and the maintaining of fluidity of the primer layer is achieved by non-radiation of ionizing radiation or heating.

32. The method of manufacturing the electromagnetic shield material according to claim 29, wherein the conductive composition includes a filler and a resin, and the resin is a thermoplastic resin, an ionizing radiation hardening resin or a heat hardening resin.

33. The method of manufacturing the electromagnetic shield material according to claim 29, wherein a primer component included in the primer layer is mixed into the conductive composition structuring the conductive layer.

34. The method of manufacturing the electromagnetic shield material according to claim 29, wherein a thickness of a part of the primer layer at which the conductive composition has transferred is larger than a thickness of a part at which the conductive composition has not transferred, a boundary face of the primer layer and the conductive layer is uneven, and the primer layer adheres to the conductive layer without cavities.

35. The method of manufacturing the electromagnetic shield according to claim 29, wherein the pattern of the conductive layer is a protruding pattern formed by a first hill formed by the primer layer and a second hill formed by the conductive composition formed above the foot of the first hill, a portion of the pattern above the foot of the first hill being covered with of the second hill.

\* \* \* \* \*